United States Patent [19]
Shibata et al.

[11] Patent Number: 5,621,336
[45] Date of Patent: Apr. 15, 1997

[54] NEURON CIRCUIT

[76] Inventors: Tadashi Shibata, 19-1393, Aza-Koshizi, Nagamachi, Taihaku-ku, Sendai-shi, Miyagi-ken 980, Japan; Tadahiro Ohmi, 1-17-301, Komegabukuro 2-chome, Aoba-ku, Sendai-shi, Miyagi-ken 980, Japan

[21] Appl. No.: 488,405

[22] Filed: Jun. 7, 1995

Related U.S. Application Data

[63] Continuation-in-part of Ser. No. 60,362, May 11, 1993, which is a continuation of Ser. No. 777,352, Jan. 6, 1992, Pat. No. 5,258,657, and Ser. No. 87,742, Oct. 13, 1993, abandoned.

[30] Foreign Application Priority Data

Jun. 2, 1989 [JP] Japan ........................ 1-141463
Jan. 12, 1991 [JP] Japan ........................ 3-13780

[51] Int. Cl.$^6$ ........................ H03K 19/23
[52] U.S. Cl. ........................ 326/36; 395/21
[58] Field of Search ........................ 326/35, 36; 395/21; 357/23.15

[56] References Cited

U.S. PATENT DOCUMENTS

| | | |
|---|---|---|
| 2,900,531 | 8/1959 | Wallmark . |
| 3,010,033 | 11/1961 | Noyce . |
| 3,204,160 | 8/1965 | Sah . |
| 4,950,917 | 8/1990 | Holler . |
| 4,951,239 | 8/1990 | Andes ........................ 364/807 |
| 4,961,002 | 10/1990 | Tam . |
| 4,978,873 | 12/1990 | Shoemaker . |
| 4,999,525 | 3/1991 | Park . |
| 5,021,693 | 6/1991 | Shima . |
| 5,028,810 | 7/1991 | Castro . |
| 5,055,897 | 10/1991 | Canepa . |
| 5,258,657 | 11/1993 | Shibata . |

FOREIGN PATENT DOCUMENTS 2-740533 3/1990 Japan .
90/15444 12/1990 Japan .

OTHER PUBLICATIONS

Article entitled: "A Logical Calculus of the Ideas Immanent in Nervous Activity" by Warren S. McCulloch and Walter Pitts, Published in *Bulletin of Mathematical Biophysics*, vol. 5, 1943.

Primary Examiner—Edward P. Westin
Assistant Examiner—Richard Roseen
Attorney, Agent, or Firm—Baker & Daniels

[57] ABSTRACT

A semiconductor device capable of realizing a synapse coupling of low power dissipation using a small number of elements and therefore a neuron computer chip of high integration degree and low power dissipation. The semiconductor includes a first gate electrode floating in potential formed on the region separating the source and drain regions through a first insulating film, a plurality of second gate electrodes capacitively coupled with the first gate through a second insulating film, and a first MOS type transistor, the source of which is connected to one of the second gates and the gate or the drain electrode is connected to a first interconnect for transferring signals of high or low potential level.

17 Claims, 44 Drawing Sheets

$$Z = \sum_{i=1}^{n} wi Vi$$

Al interconnect polysilicon of first layer polysilicon of second layer $N^+$ or $P^+$ diffusion layer contact-hole through-hole $$z = \sum_{i=1}^{n} w_i V_i$$

NEURON CIRCUIT

CROSS REFERENCE TO RELATED APPLICATIONS

This is a continuation in part application of U.S. patent application Ser. No. 08/060,362, filed May 11, 1993, which, in turn, is a continuation of U.S. patent application Ser. No. 07/777,352, filed Jan. 6, 1992, now U.S. Pat. No. 5,258,657 and is also a continuation of U.S. patent application Ser. No. 08/087,742 filed Oct. 13, 1993 now abandon.

TECHNICAL FIELD

The present invention relates to a semiconductor device, and more particularly a highly functional semiconductor integrated circuit to realize a neural network computer or a neuron computer.

BACKGROUND OF THE INVENTION

Semiconductor integrated circuit technology has rapidly progressed. For example, in the case of dynamic memory, memory chips with a capacity of 1 though 4 Mbit have been already put into mass production and ultra large integration memory chips such as 16 Mb or 64 Mb memory are now being developed. Such an ultra large integration technology is applied to a logic circuit as well as a memory circuit, and a variety of functional logic integrated circuits represented by 32 bit CPU or 64 bit CPU are also under development.

In these logic circuits, an arithmetic operation is carried out by using digital signals, i.e., binary signals composed of 1 and 0. For example, a Neumann method is adopted for a computer, where commands are executed one by one according to a predetermined program. Although simple numerical calculations can be carried out at very high speed by this method, it takes a lot of time to perform the pattern recognition or image processing. Furthermore, this method is not suitable for information processing such as association of ideas, memorizing and learning, which is mankind's strongest point. In spite of a lot of research and development activities for software technology, notable results have not been produced yet.

There has been another stream of research to get rid of these difficulties at once and then to construct a computer which imitates arithmetic operations of the brain, i.e. neuron circuit computer (neural computer) by studying brain functions of living things. This kind of research began in the 1940s and has become very active in last several years based on the fact that the progress in LSI technology may make it possible to realize the hardware of neuron computer.

However, the present semiconductor LSI technology still has too many problems to put it into practice. This is described more concretely. For example, in order to make the hardware with the function of one human neuron cell (neuron), a circuit must be constructed by combining a lot of semiconductor elements. In other words, it is very difficult to construct the practical number of neurons on a semiconductor chip.

Before a detailed explanation of the invention is given, the function which is required for one neuron and the difficulties associated with the construction of a neuron using current technologies are described.

FIG. 19(a) is a schematic representation illustrating the function of a neuron cell, i.e., neuron, which was proposed by McCumllock and Pitts as a mathematical model of neuron (Bull. Math. Biophys., Vol.5, p.115 (1943)). At present, the studies are being carried out actively to construct a neuron computer by realizing this model with semiconductor circuits. $V_1, V_2, V_3, \ldots, V_n$ are n input signals defined as, for example, magnitudes of voltages, and correspond to signals transferred from other neurons. $W_1, W_2, W_3, \ldots, W_n$ are coefficients representing the coupling strengths between neurons, and are biologically called synapse couplings. The function of this neuron is simple. When the value Z, linear sum of the product of each input $V_i$ and weight $W_i$ (i=1–n), becomes larger than a predetermined threshold value $V_{th*}$, the neuron outputs 1; on the other hand, 0 when Z is less than $V_{th*}$. The numerical expression is as follows:

$$Z = \sum_{i=1}^{N} W_i V_i \tag{1'}$$

$$V_{out} = \begin{cases} 1 \ (Z > V_{TH*}) & (2') \\ 0 \ (Z < V_{TH*}) & (3') \end{cases}$$

FIG. 19(b) shows the relationship between Z and $V_{out}$. The output is 1 when Z is large enough as compared with $V_{th*}$ and 0 when Z is small enough.

Next, an example of the circuits to realize the above-mentioned function using conventional semiconductor technology 1a shown in FIG. 20. In the figure, 102-1, 102-2 and 102-3 denote operational amplifiers. FIG. 20(a) shows a circuit to obtain Z by adding the product of input signal $V_i$ (i=1–n) and weight Wi. $I_i$ denotes electric current flowing through $R_i$. From $I_i=V_i/R_i$, $$I_a = \sum_{i=1}^{n} (V_i/R_i)$$

the output voltage $V_a$ of the operational amplifier 102-1 is given by $$V_a = -R \sum_{i=1}^{n} (V_i/R_i)$$

Since $I_b$ is given by $-V_a/R_1$, $I_a$ and $I_b$ have the same magnitude ($I_a=I_b$) and the opposite direction of flow, leading to the expression:

$$Z = R \sum_{i=1}^{n} (V_i/R_i) = \sum_{i=1}^{a} (R/R_i)V_i \tag{4'}$$

By the comparison between Eqs. (1') and (4'), the weight coefficient $W_1$ is found to be $R/R_i$ and therefore determined by the resistance. The circuit shown in FIG. 20(a) is a circuit to generate the voltage representing the linear sum of input signals obtained by summing up electric currents. FIG. 20(b) is an example of circuit to convert the value of Z into $V_{out}$, where Z is connected to a non-inversion input terminal of operational amplifier 102-3. Since an operational amplifier is an amplifier having a large voltage amplification (gain), $V_{out}=V^+$ when $Z>E_0$ and $V_{out}=V^-$ when $Z<E_0$, as shown in FIG. 20(c). Here, $V^+$ and $V^-$ are the maximum and the minimum values of outputs which are determined by power supply voltage supplied to the operational amplifier. The value of $V_{TH*}$ can be changed by varying the voltage $E_0$ applied to non-inversion terminal. One of the problems of the circuit shown in FIGS. 20(a) and (b) is that a lot of semiconductor elements are required to construct a neuron. Three operational amplifiers are used in the circuit of the figure and therefore 30 transistors are necessary since at least 10 transistors are usually required to construct one operational amplifier. And since the sum operation is made on the basis of electric current mode, a large amount of current always flows, resulting in large power dissipation. Namely, one neuron not only occupies a large area on a chip but also dissipates much power. Therefore, it is difficult to attain large scale integration. Even if large scale integration can be attained by shrinking the dimensions of transistor, it is almost impossible to construct a practical integrated circuit because of high density of the power dissipation.

The unit of brain is simplified and then further described in FIG. 29. In the figure, 2921a, 2921b and 2921c are neurons. 2922a, 2922b and 2922c are nerve fibers. 2923a, 2923b and 2923c are called as synapse couplings. For example, a signal transmitted through nerve fiber 2922a is multiplied by weight $W_a$, at synapse coupling 2923a and the weighted signal is inputted to neuron 2921a. Neuron 2921a sums up inputted signals and is activated to output signal (namely, the neuron gets fired) when the sum is larger than a threshold value. On the other hand, the neuron outputs no signal when the sum is less than the threshold value.

Such phenomena as arithmetic operation, transmission of signal, and weight multiplication are carried out electrochemically in a real brain, and signals are transferred and processed as electric signals. The learning process of humans is correlated to the change in weights of synapse couplings. The weight is gradually modified to the optimum value to have correct output for various combinations of inputted signals. In other words, the knowledge is stored in the brain as weights of synapse couplings.

A number of neurons are mutually connected, forming a layer and it is known that six layers are stacked in the human brain. In realizing a neuron computer, it is the most important matter to construct LSI system with above-mentioned structure and function.

FIGS. 30(a) and (b) are schematic representations illustrating the function of a nerve cell, i.e., neuron, which were proposed by McCumllock and Pitts as a mathematical model of neuron (Bull. Math. Biophys., Vol.5, p.115 (1943)). At present, the studies are being carried out actively to construct a neuron computer by realizing this model with semiconductor circuits. $V_1, V_2, V_3, \ldots, V_n$ are n input signals defined as, for example, magnitudes of voltages, and correspond to signals, transferred from other neurons. $W_1, W_2, W_3, \ldots, W_n$ are coefficients representing the coupling strengths between neurons and are biologically called synapse couplings. The function of this neuron is that when the value Z, the linear sum of products of input $V_i$ and respective weight $W_i$, (i=1 through n), becomes larger than a predetermined threshold value $V_{TH*}$, the neuron outputs 1; on the other hand, 0 when Z is less than $V_{TH*}$. The numerical expression is given as follows:

$$Z = \sum_{i=1}^{n} W_i V_i$$

$$V_{out} = \begin{cases} 1 \ (Z > V_{TH*}) \\ 0 \ (Z < V_{TH*}) \end{cases}$$

FIG. 30(b) shows the relationship Between Z and $V_{out}$. The output is 1 when Z is large enough as compared with $V_{TH*}$, and 0 when Z is small enough.

In order to construct the neuron using conventional transistors, a large number of transistors is required. Furthermore, since the sum operation is carried out after signals are converted to electric current, a large amount of current flows, resulting in large power dissipation. This means the integration of neurons is substantially impossible.

SUMMARY OF THE INVENTION

A semiconductor device of the present invention comprises a MOS type semiconductor element having a gate electrode being electrically floated and a plurality of input gate electrodes capacitively coupled with said gate electrode, wherein the channel is formed under said gate electrode being electrically floated only when the absolute value of a value obtained by linearly summing up the weighted voltages applied to said input gate electrodes becomes larger than a predetermined threshold value.

A semiconductor device of the present invention further comprises a first semiconductor region on a substrate, first source and first drain regions of opposite conductivity type to that of said first semiconductor region formed in said first semiconductor region, a first gate electrode floating in potential formed over the region separating said first source region and said first drain region through a first insulating film, a plurality of second gate electrodes capacitively coupled with said first electrode through a second insulating film, and a first MOS type transistor, wherein the source electrode of said first MOS type transistor is connected to one of said second gate electrodes and at least the gate or the drain electrode is connected to a first interconnect which transfers a two-level voltage signal of high or low level.

By the present semiconductor device, which makes it possible to realize the function of a neuron with a single element, ultra large scale integration of neuron elements becomes possible.

By the semiconductor device of the present invention, which dissipates very little power and makes it possible to construct a synapse coupling with a small number of elements, the high integration and low power dissipation of neural network system becomes possible. As a result, a neuron computer chip is realized for the first time at practical use level.

BRIEF DESCRIPTION OF THE DRAWINGS

FIG. 1 shows schematic diagrams explaining embodiment 1.

FIG. 2 shows schematic diagrams explaining embodiment 2.

FIG. 5 shows schematic diagrams explaining embodiment 5.

FIG. 8 shows diagrams explaining embodiment 7.

FIG. 13 shows schematic diagrams explaining embodiment 9.

FIG. 19 shows diagrams explaining prior art.

Figure 1A:
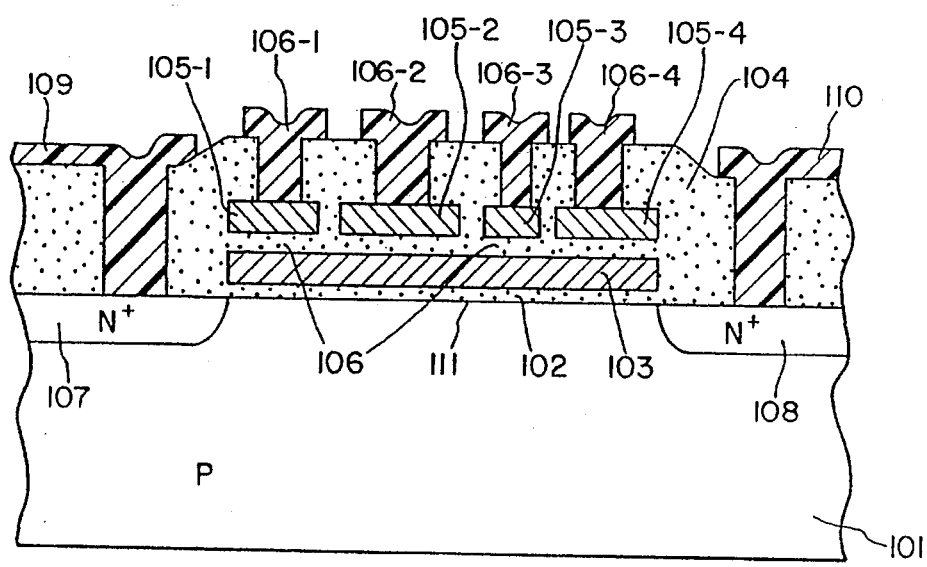
FIG. 1(a) is a cross-sectional view of a device.

A list of parts and numerals shown in the drawings is as follows: 102-1, 102-2, 102-3, arithmetic amplifier (operational amplifier); 101, P-type Si substrate; 102, gate oxide film; 103, gate electrode; 104, insulating film; 105-1–105-4, gate electrode; 106, insulating film; 106-1–106-4, Al interconnect; 107, source; 108, drain; 109, Al interconnect; 111, surface of silicon substrate; 201, floating gate; 202, gate oxide film; 203, floating gate; 204, insulating film; 205-1–205-4, input gate; 208, insulating film; 206-1–206-4, A1 interconnect connected to input gate; 207, source; 208, drain; 209, 210, Al interconnect; 301, neuron element; 303, input terminal for signal voltage; 304, output terminal; 305, input terminal for control signal X; 401-1, 401-3, 401-5, input gate; 402, insulating film; 403, floating gate; 404, thermal oxidation film; 405. P-type Si substrate; 406, field oxide film; 407, Al interconnect; 501, field oxide film; 502, source; 503, drain; 504, floating gate; 505, input gate; 603, floating gate; 604, input gate; 605, control gate; 606, oxide film; 607, gate oxide film; 608, oxide film; 701, mode MOS transistor; 702, N-channel enhancement mode transistor; 801, N-channel MOS; 802, P-channel MOS; 803, P-type substrate; 804, N-type substrate; 805, floating gate; 806, 807, gate insulating film; 808-1–808-4, input gate; 809, source; 810, drain; 811, source; 812, drain; 813, 814, 815, Al interconnect; 816, insulating film under Al interconnect; 817, 817', 817'', 817''', contact hole; 818, insulating film; 901, C- MOS; 902, CMOS inverter; 1001, NMOS; 1201, 1202, input gate; 1203, floating gate; 1401, C- MOS; 1402, source; 1403, CMOS inverter; 1404, source; 1405, p-MOSFET; 1408, n-MOSFET; 1501, MOS; 1602, 1603, inverter.

DESCRIPTION OF THE PREFERRED EMBODIMENT OF THE INVENTION (Embodiment 1)

FIG. 1 is a cross-sectional view of a semiconductor device according to embodiment 1. A gate electrode 103 made of n⁺ polysilicon is formed over a p-type Si substrate 101 through a gate oxide film 102. Surrounded by insulating film 104 such as $SiO_2$, this gate electrode is left in an electrically floating state.

Input gate electrodes 105-1–105-4 made of, e.g., n⁺ polysilicon are isolated from floating gate 103 by a insulating film 106 such as $SiO_2$. The potential of these input electrodes is determined by the voltage supplied through Al interconnects 106-1–106-4.

107 and 108 are a source and a drain, respectively, which are, for example, formed by ion-implanting an As ion. 109 and 110 are interconnects connected to the source and the drain, respectively. The semiconductor device of this invention has the following function: when the linear sum of the products of the voltages $V_1$, $V_2$, $V_3$, $V_4$ applied to the gate electrodes 105-1 to 105-4 and corresponding weights exceeds a predetermined threshold value, an inversion layer (i.e., channel) is formed on the silicon substrate surface 111, and the source and the drain are electrically connected together. A detailed explanation about the linear sum operation of voltages of the device is described below.

Figure 1B:
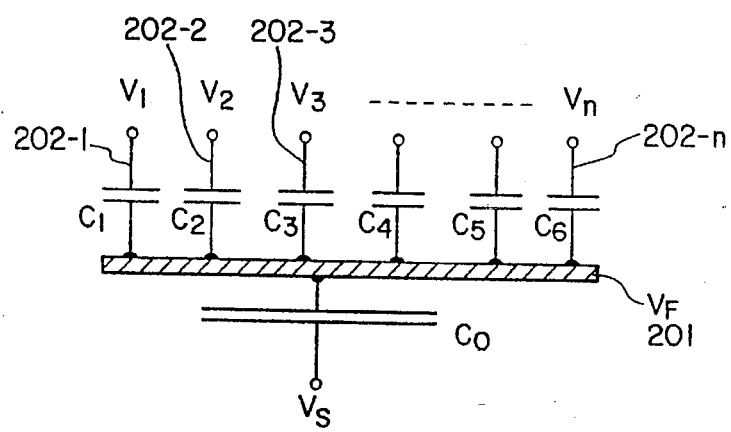
FIG. 1(b) is an equivalent circuit of the device.

First, the discussion is made on the device of FIG. 1(a) using, a generalized model shown in FIG. 1(b). 201 denotes a floating gate, corresponding to 103 in FIG. 1(a). This model is generalized to have n control gates 202-1, 202-2, 202-3, . . . , 202-n based on the case of FIG. 1(a) having four control gates 105-1, 105-2, 105-3 and 105-4. $C_1$, $C_2$, $C_3$, . . . $C_n$ denote the capacitive coupling coefficients (capacitance) between the floating gate and respective gates. $C_0$ is the capacitance between the floating gate and the substrate 101.

Now, symbols are defined as follows: $V_F$ is the potential of the floating gate, $V_1$, $V_2$, $V_3$, . . . $V_n$ are the voltages supplied to respective input gates and $V_s$ is the potential of the substrate. Let $Q_1$, $Q_2$, $Q_3$, . . . and $Q_n$ denote charges stored in the capacitances $C_1$, $C_2$, $C_3$, . . . and $C_n$ which are obtained as $Q_0 = C_0 (V_0 - V_F)$, $Q_1 = C_1 (V_1 - V_F)$, $Q_2 = C_2 (V_2 - V_F)$, . . . and $Q_n = C_n (V_n - V_F)$. Namely, total charge $Q_F$ in the floating gate is given by $$Q_F = \sum_{i=0}^{n} (-Q_i)$$

$$= \sum_{i=0}^{n} C_i (V_i - V_F)$$

$$= \sum_{i=0}^{n} C_i V_i + V_F \sum_{i=0}^{n} C_i$$

Therefore, $V_F$ is obtained as the following expression.

$$V_F = \left( \sum_{i=0}^{n} C_i V_i + Q_F \right) / C_{TOT} \quad (1)$$

where $$C_{TOT} = \sum_{i=0}^{n} C_i$$

The device shown in FIG. 1(a) can be regarded as a MOSFET having a threshold voltage of $V_{TH}$ in which the floating gate 103 works as a gate electrode thereof. In other words, a channel is formed on the substrate surface 111 when the potential of the floating gate 103 becomes $V_{TH}$ volt. For the case $V_F > V_{TH}$, Eq. (1) is written as $$Z \equiv \sum_{i=0}^{n} W_i V_i > (V_{TH} - C_0/C_{TOT}) V_s - Q_F/C_{TOT} \quad (2)$$

where $$W_i = C_i/C_{TOT}$$

Eq. (2) means that when the value of the linear sum of all input voltages to the gates 202-1, 202-2, 202-3, . . . and 202-n weighted by $W_1$, $W_2$, $W_3$, . . . and $W_n$ becomes larger than $V_{TH^*}$ given by Eq. (3), the device turns on and the source and the drain are connected.

$$V_{TH^*} = V_{TH} - (C_0/C_{TOT}) V_s - Q_F/C_{TOT} \quad (3)$$

Here, usually, the substrate is grounded, that is, $V_s = 0$, and the total charge in the floating gate is 0. Then, $$V_{TH} = V_{TH^*} \quad (4)$$

As mentioned above, the semiconductor device of this invention has the function to calculate the weighted linear sum of all input signals and to control the on and off of the MOS transistor based on the comparison between the results of the weighted sum and the threshold $V_{TH^*}$. In other words, this device is quite a new transistor with which a high arithmetic operation function is realized in a single element level. Thus, this device is very suitable for constructing a neuron computer which will be described later. For this reason, this transistor is called neuron transistor or ν (neu) MOS in short.

Figure 1C:
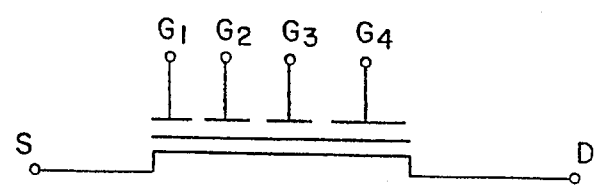
FIG. 1(c) is a schematic diagram of circuit.

FIG. 1(c) shows a symbol for νMOS, where S is a source, D is a drain and $G_1$, $G_2$, $G_3$ and $G_4$ are gates.

Figure 1D:
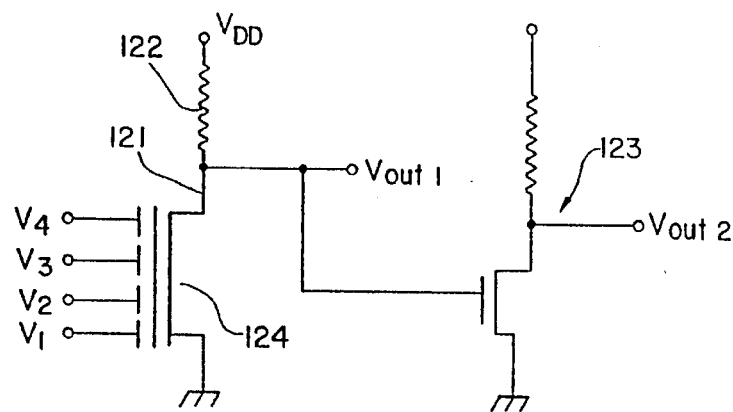
FIG. 1(d) is another example of circuit.
Figure 1E:
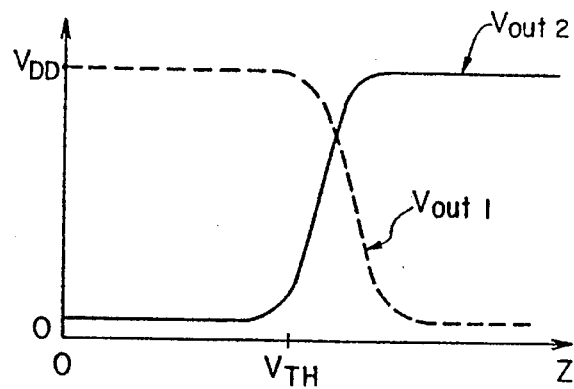
FIG. 1(e) is a graph slowing characteristics.
Figure 19A:
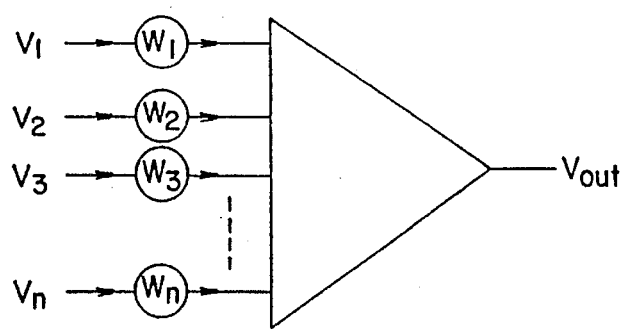
FIG. 19(a) is a schematic diagram and FIG. 19(b) is a graph showing characteristics.
Figure 19B:
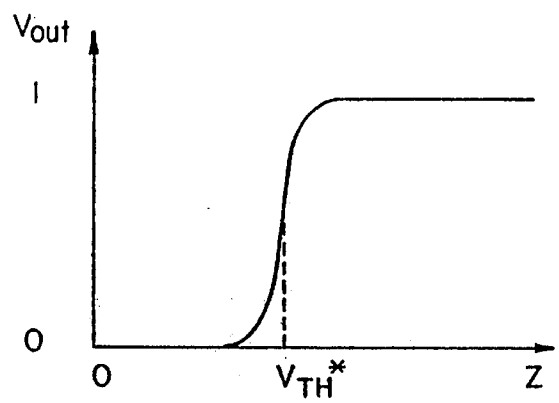
Figure 20A:
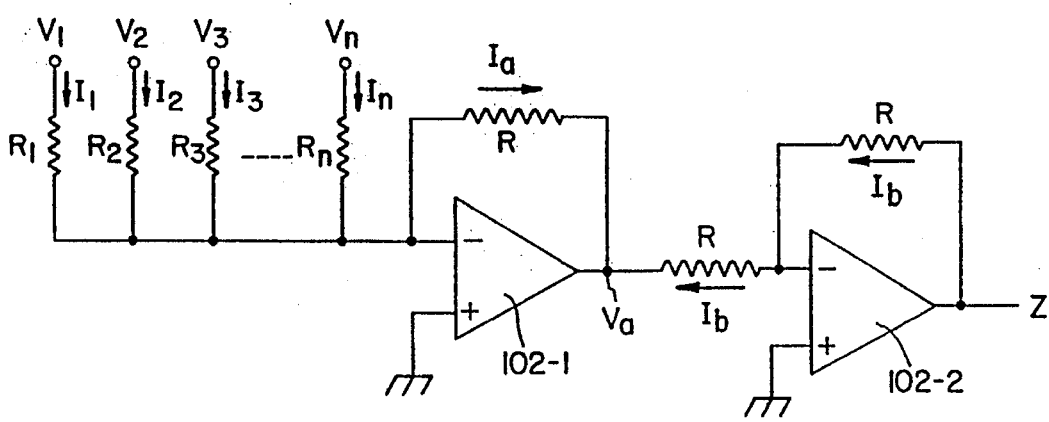
FIG. 20 is a diagram of a circuit explaining prior art.
Figure 20B:
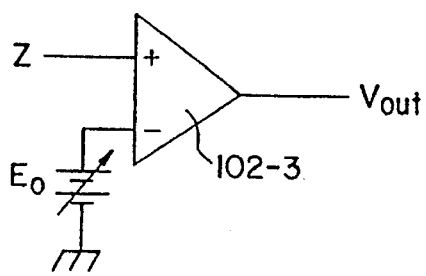
Figure 20C:
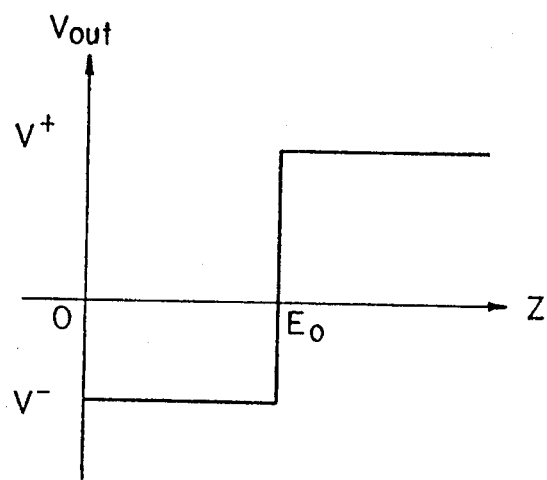

The structure of a neuron element is described in FIG. 1(d) using symbols. This is another example of the embodiment. A drain 121 of νMOS is connected to a power supply line ($V_{DD}$) through a load 122. When $Z = W_1 V_1 + W_2 V_2 + W_3 V_3 + W_4 V_4$ in this circuit, the relation between $V_{out1}$ and Z is shown by the broken line of FIG. 1(e). In the case where $V_{out}$ is connected to an ordinary inverter 123, the output $V_{out2}$ is shown by the solid line of FIG. 1(e). That is to say, the function of one neuron shown in FIG. 19(a) is realized by using this simple circuit. The effect of this invention is definitely understood from the comparison of FIG. 1(d) with FIGS. 20(a) and 20(b) representing the prior art: only two MOS transistors are required to construct one neuron in this invention while at least 30 transistors are required in the prior art. In other words, it first becomes possible to lessen the area on a chip by more than one order and therefore realize ultra large scale integration. Furthermore, in the prior art, the circuit is constructed with bipolar transistors which conduct large current and the sum operation is made by utilizing current additivity, resulting in large power dissipation. On the other hand, constructed with only two MOS transistors in this invention, the circuit dissipates very little power. An MOS is, by nature, a voltage-controlled device which can control the on and off with a slight amount of charge. Therefore, the power dissipation is very little. In addition, because of MOS having the function of direct sum of input voltages, the circuit does not require the conversion operation from voltage into current for sum operation, unlike the case in FIG. 20(a) where sum operation is made after the voltages are converted into currents, suggesting that this neuron is capable of low power dissipation operation. For these reasons; high integration density and low power dissipation, it becomes possible for the first time to construct the circuit which can be used for a neuron computer at practical use level.

Figure 1F:
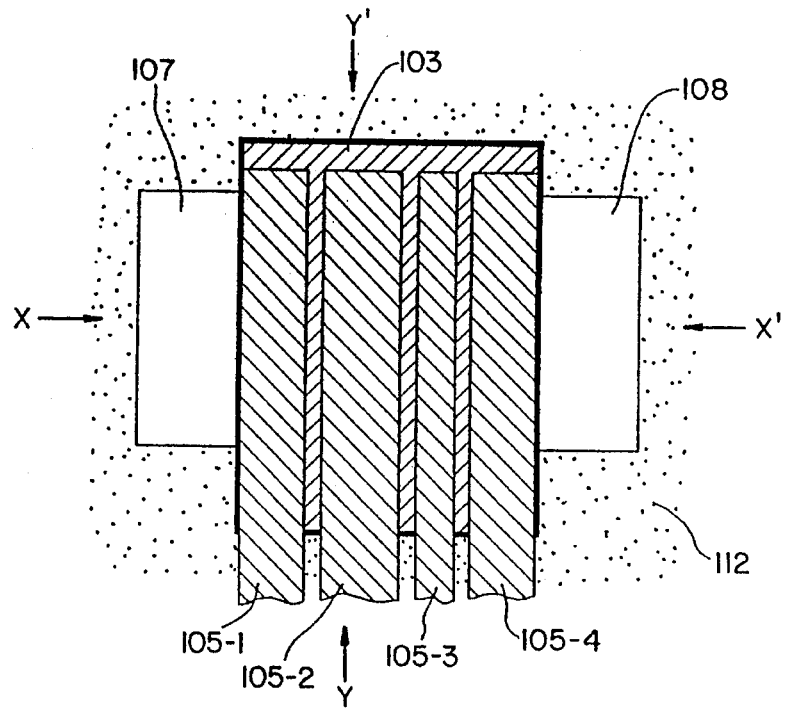
FIG. 1(f) is a plan view of a device and FIG. 1(g) is a cross-sectional view along Y–Y' line of FIG. 1(f).

FIG. 1(f) is a plan view of νMOS shown in FIG. 1(a). In this figure, the same numerals are used as those in FIG. 1(a): 107 and 108 are a source and a drain, 105-1 to 105-4 are four input gates and 103 is a floating gate. The cross-section along X–X' line corresponds to FIG. 1(a). Here, however, an insulating film 104, aluminum interconnects 109, 110, 106-1–106-4 are omitted to easily understand the drawing. These parts are formed at appropriate sites.

Figure 1G:
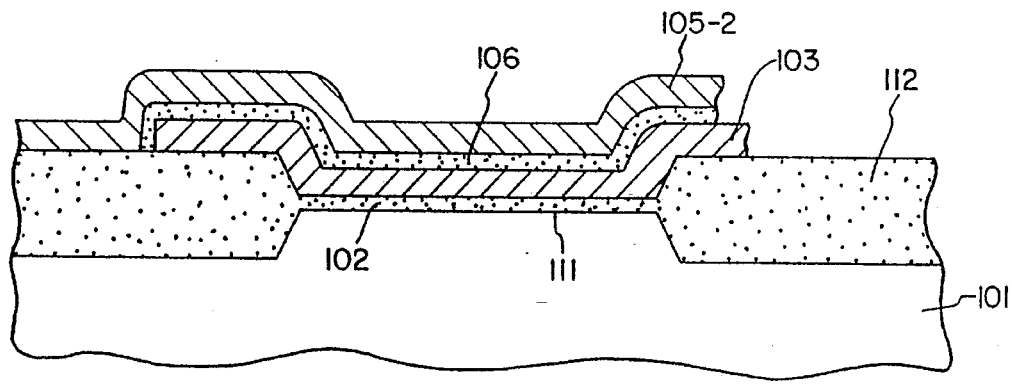

FIG. 1(g) is a cross-sectional view along Y–Y' line of FIG. 1(f). Common numerals are also used in the figure. Here, 112 is a field oxide film to isolate elements.

Next, a concrete example of how to prepare elements is described. In the embodiment shown in FIGS. 1(a), 1(f) and 1(g), a P-type substrate with (100) plane and a specific resistance of 0.5 Ω.cm was used, and each parameter, is designed as follows: the thickness of the gate oxide film ($SiO_2$) is 500 Å, that of the insulating film ($SiO_2$) between the floating gate and the input gates is 500 Å, the overlapping area between the floating gate and the channel forming region is 3 μm×3.5 μm, and those between the floating gate and input gates 105-1, 105-2, 105-3 and 105-4 are 4 μm×0.75 μm, 4 μm×1.0 μm, 4 μm×0.5 μm and 4 μm×0.75 μm, respectively. Since the field oxide film is thick, for example, about 1 μm, capacitances of the regions where the field oxide film is put between the floating gate 103 and the substrate 101, or between the control gate 105 and the substrate 101 are so small as to be neglected. Calculation based on such data gives $$C_0:C_1:C_2:C_3:C_4=10.5:3:4:2:3$$

and $$Z=0.13V_1+0.18V_2+0.089V_3+0.13V_4 \quad (5)$$

If $V_3=0$ and no charge injection into the floating gate is assumed to occur, $V_{TH^*}$ becomes about 1.0 V from Eq. (4). In the case of $V_1=0$ V, $V_2=5$ V, $V_3=5$ V and $V_4=5$ V, $Z=2.0$ V and $V_{out}$ in FIG. 1(d) becomes 5 V. And in the case of $V_1=0$ V, $V_2=0$ V, $V_3=5$ V and $V_4=0$ V, $Z=0.45$ V and $V_{out2}$ becomes about 0 V (low level). Although only the cases of input signals being either 0 or 5 V are discussed, it is also possible for the cases of input values being intermediates between 0 and 5 V or negative values. Furthermore, $V_{out2}$ is used as output of this neuron, but the inversion output $V_{out1}$ can also be used directly as output. (Embodiment 2)

Figure 2A:
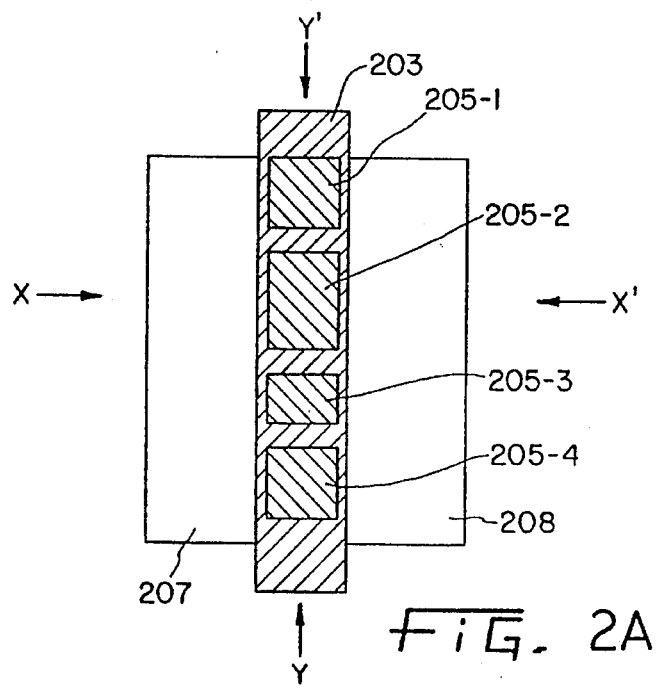
FIG. 2(a) is a plan view of a device.
Figure 2B:
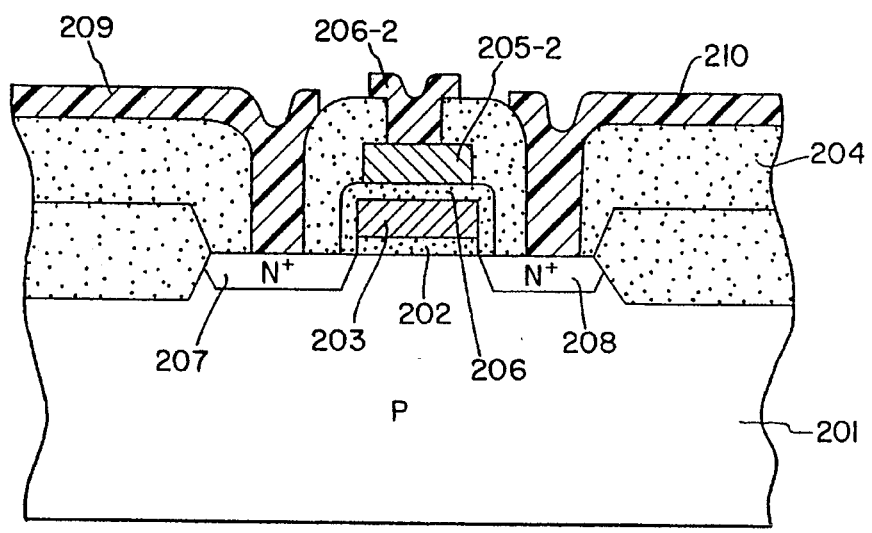
FIG. 2(b) is a cross-sectional view along X–X' of FIG. 2(a) line and FIG. 2(c) is a cross-sectional view along Y–Y' line of FIG. 2(a).
Figure 2C:
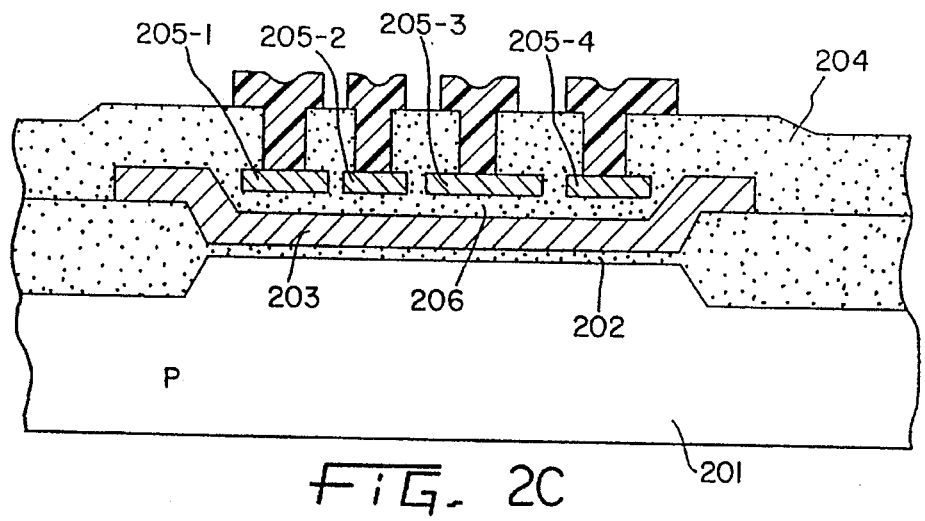

As is apparent from FIG. 1(f), in the embodiment 1 shown in FIGS. 1(a), 1(f) and 1(g), a channel length of νMOS inevitably becomes long since input gates are aligned along the channel, i.e., X–X' direction. This is unsuitable for high speed operation. So, the second embodiment which make it possible to shorten a channel of νMOS is described. FIG. 2(a) is a plan view. FIGS. 2(b) and 2(c) are cross-sections along X–X' and Y–Y' lines of FIG. 2(a), respectively. Al interconnects and interlayer insulating films are omitted in FIG. 2(a) for simplicity. 201 is, for example, a P-type substrate, 207 and 208 are a source and drain, respectively, 202 is a gate oxide film, 203 is a floating gate, 205-1 to 205-4 are input gates, 206-1 to 206-4 are Al interconnects connected to input gates, 209 and 210 are Al interconnects connected to the source and the drain, respectively, 206 is an insulating film between the floating film and input gates, and 204 is an insulating film under Al interconnects. When νMOS is designed in such a manner that the overlapping area between the floating gate and the channel forming region is 1 μm×4 μm, those between the floating gate and input gates 205-1, 205-2, 205-3 and 205-4 are 1 μm×0.75 μm, 1 μm×1 μm, 1 μm×0.5 μm and 1 μm×0.075 μm, respectively, and the other parameters are the same as those in FIG. 1(a), Z is given by $$Z=0.107V_1+0.143V_2+0.071V_3+0.107V_4 \quad (6)$$

Here, $V_1$, $V_2$, $V_3$ and $V_4$ denote applied voltages to input gates 205-1, 205-2, 205-3 and 205-4, respectively. If the circuit shown in FIG. 1(d) is constructed using such a transistor, Z-1.78 and $V_{out2}=5$ V in the case of $V_1=5$ V, $V_2=5$ V, $V_3=0$ V and $V_4=5$ V; on the other hand Z=0.99 and $V_{out2}=0$ V in the case of $V_1=0$ V, $V_2=0$ V, $V_3=5$ V and $V_4=5$ V. These results apparently mean that this circuit can perform neuron operation.

In the embodiments 1 and 2, the weight by which the input voltage is multiplied is determined by the ratio of capacitance $C_i$ (i=1–4) of overlapping region between the floating gate and the input gate to total capacitance.

$$C_{TOT}=\sum_{i=1}^{4}C_i$$

Thus, it is possible to change the weight freely by varying the overlapping area between the floating gate and the input gate. The capacitance can also be changed by employing other materials of insulator formed between the floating gate and the input gates, i.e., by varying dielectric constant of insulator. For example, the capacitance ratio becomes about 1:2:2.3 for $SiO_2:Si_3N_4:Al_2O_3$ even if the overlapping area is equal. As a matter of course, a large ratio can be obtained by changing both the overlapping area and material. In order to obtain larger capacitive coupling coefficient with especially small area, that is, in order to obtain especially large weight coefficients $W_i$ (i=1–4), materials with large dielectric constant such as $Ta_2O_6$ are used. The weight is about five times as large in this case as that in the case where $SiO_2$ with the same overlapping area is used. Furthermore, changing the insulating film thickness can also cause the change in capacitance, i.e., weight coefficient.

(Embodiment 3)

Figure 3:
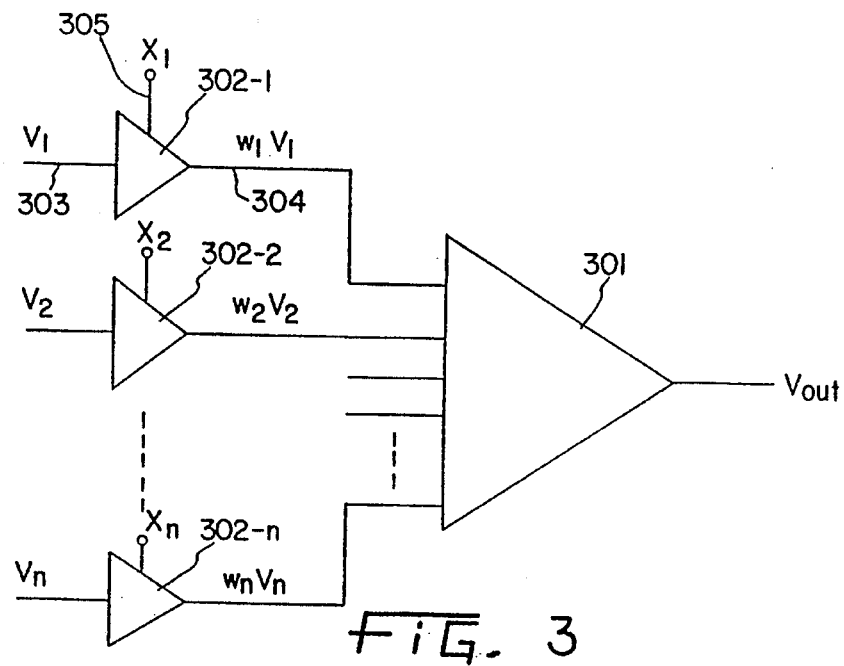
FIG. 3 is a block diagram explaining embodiment 3.

In the embodiments 1 and 2 mentioned above, the weight coefficients ($W_1$–$W_4$) by which input signals are multiplied are determined by the νMOS structure and therefore cannot be changed after the element is constructed. The third embodiment of the present invention shown in FIG. 3 is a neuron which makes it possible to freely change the weight coefficients even after the element is constructed. 301 is a neuron element, composed of e.g., a circuit shown in FIG. 1(d). Other neuron elements are also used which will be described in other embodiments using FIGS. 4, 5, 6, and 8. 302-1, 302-2, 302-n are circuits to output the values of input signal voltage $V_1$, $V_2$, ... $V_n$ weighted by $W_1$, $W_2$, $W_n$. The circuit 302-1, for example, has at least three terminals 303, 304 and 305. 303 is an input terminal for signal voltage. 304 is a terminal to output the product $W_1V_1$ of input voltage $V_1$ and the weight $W_1$. The third terminal 305 is a input terminal for control signal $X_1$, the magnitude of which changes the weight $W_1$.

In other words, with this circuit configuration, the weight by which the input signal to the neuron element 301 is multiplied can freely be varied. This is very important in realizing a neuron computer because such weight coefficients momentarily change to carry out arithmetic operations in the biological information processing. Living things carry out sophisticated information processing such as recognition, association of idea and learning by varying such weights one after another based on the arithmetic operation. Namely, the structure of FIG. 3 is a most fundamental structure of a neuron computer. The weightproduct circuits 302-1, 302-2, ... 302-n will be discussed in detail later.

Since weighting input signals is carried out by the weight-product circuit in the structure of FIG. 3, the device 301 is not required to change the weights by changing the overlapping area between the floating gate and the input gate, unlike the example shown in FIGS. 1 and 2. This means that the device can be designed in such a manner that all the overlapping area are equal, leading to versatility of device. It is of course possible to determine the weight coefficients by using the variation of the area, material or thickness of insulating film together with using weight-product circuit.

Figure 4:
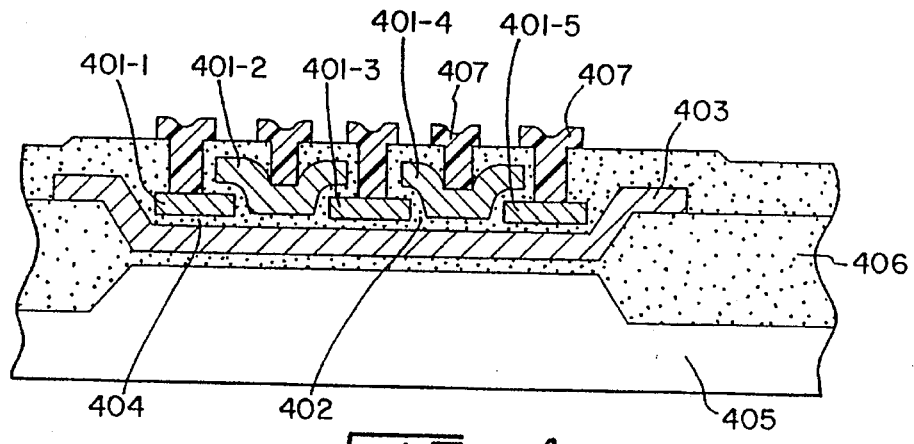
FIG. 4 is a cross-sectional view of a device explaining the embodiment 4.
Figure 5A:
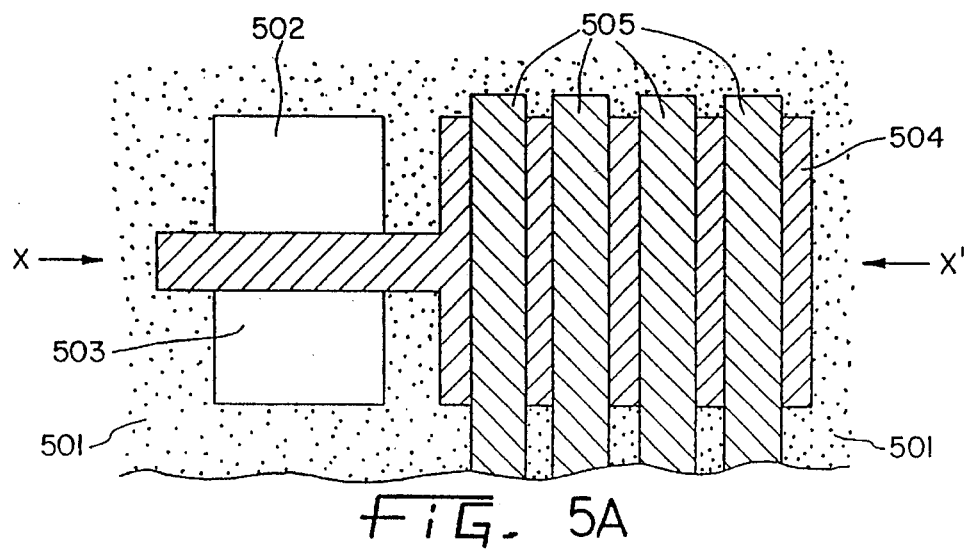
FIG. 5(a) is a plan view of a device and FIG. 5(b) is a cross-sectional view along X–X' line of FIG. 5(a).
Figure 5B:
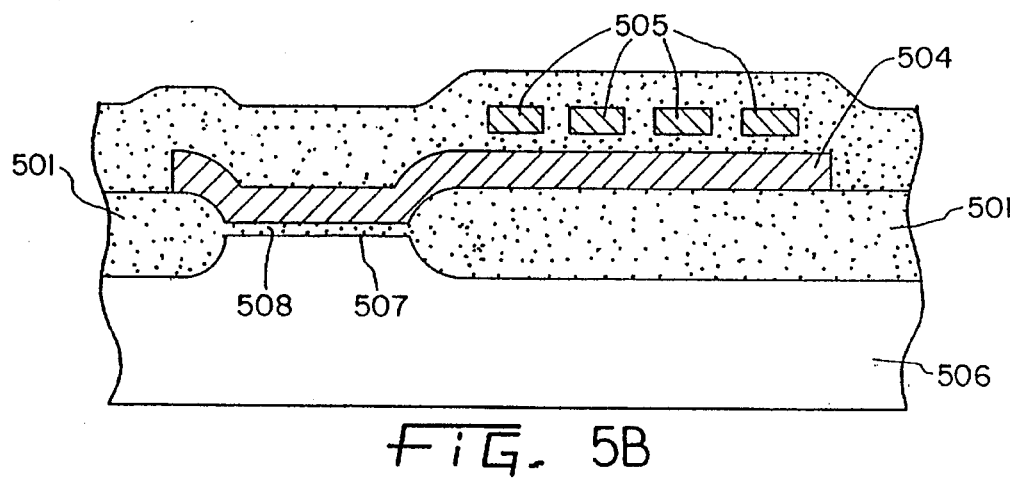
Figure 6:
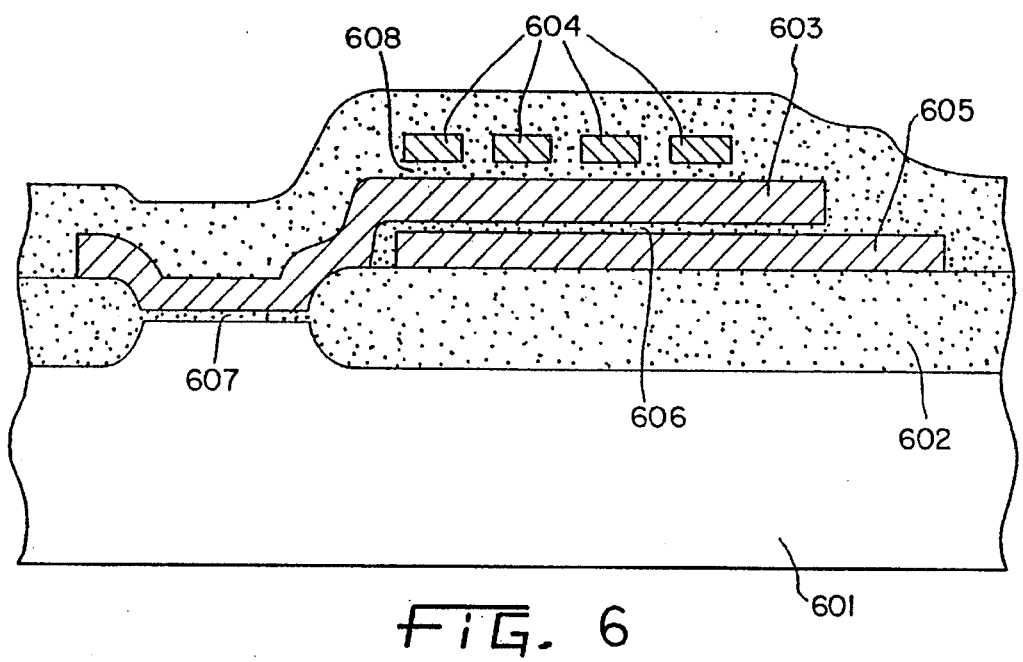
FIG. 6 is a cross-sectional view of a device explaining embodiment 6.

FIGS. 4 to 6 are diagrams to explain the embodiments 4 to 6 illustrating the structure of various νMOS in which every overlapping area is equal.

(Embodiment 4 and 5)

In embodiments shown in FIG. 4, the gaps between adjacent input gates of 401-1 to 401-5 are designed to be small as compared with those of the embodiment 2 (FIG. 2) so that elements with smaller dimension can be realized. That is, in FIG. 2(c), the gap between input gates is determined by the resolution limit of lithographic process, but in the embodiment of FIG. 4 the input gate are formed partially one upon another and the gaps between adjacent input gates are equal to the thickness of the insulating film 402. This structure is constructed as follows. First, a floating gate 403 is formed. Next, an insulating film 404 such as a thermal oxidation film 401 and then input gates 401-1, 401-3 and 401-5 are formed on the surface of the floating gate 403. Then an insulating film is formed on these input gate surfaces. Finally, input gates 401-2, 401-4 are formed thereon. In the figure, 405, 406 and 407 denote a P-type S1 substrate, a field oxide film and an Al interconnect, respectively.

FIG. 5 shows schematic diagrams explaining the embodiment 5. FIGS. 5(a) and 5(b) are a plan view and a cross-sectional view along X–X' line, respectively. 501 is a field oxide film region. 502 and 503 are a source and a drain regions. Al interconnects are omitted in the figure for simplicity. The feature of this embodiment is that the coupling between the floating gate 504 and input gates 505 is made on the surface of the field oxide film. In this structure, the overlapping area between the floating gate and each of input gates can be determined, regardless of the overlapping area between the floating gate and silicon substrate. Namely, since each portion of MOS transistor and coupling between the floating gate and input gate can be designed independently, the room for design choices of element becomes large. For example, if designed as $$C_1+C_2+C_3+C_4 \gg C_0$$

then $$C_{TOT}=C_1+C_2+C_3+C_4$$

and the following equation is obtained:

$$W_1+W_2+W_3+W_4=1. \quad (7)$$

The value of $W_1+W_2+W_3+W_4$ in the embodiments 1 and 2 are respectively 0.529 and 0.428; that is, less than 1. In other words, each value of weights can be made large by this embodiment.

When Eq. (4) was derived from Eq. (3), the potential $V_s$ of the substrate was assumed to be 0 V. This assumption is approximately correct, but strictly incorrect. The reason is described below. When the channel is formed on the semiconductor substrate surface 111 in FIG. 1(a), the potential of the channel becomes 0 V at the edge of the source region and gradually approaches to the drain potential as the position gets near the drain region. A large potential drop takes place in the vicinity of the drain region, so it is good approximation to assume the potential of whole channel to be about 0 V. Nevertheless, when a transistor comes to have a short channel, this assumption leads to error. And if the channel is formed on the silicon surface 111, the capacitive coupling coefficient $C_0$ between the floating gate and the S1 substrate becomes nearly equal to a capacitance of gate oxidation film $C_{ox}$ which is given by $C_{ox}=\epsilon_0\epsilon_r S/t_{ox}$. Here, $\epsilon_0$ denotes vacuum dielectric constant, $\epsilon_r$ relative dielectric constant, and S the area of channel. However, when no channel appears, the depletion layer is formed on the silicon surface and $C_D$ is expressed as a series combination of $C_{ox}$ and a capacitance of $C_D$ of the depletion layer, i.e., $C_0=(1/C_{ox}+1/C_D)^{-1}$. Here, $C_D=\epsilon_0\epsilon_r^1 S/W$. $\epsilon_r^1$ denotes the dielectric constant of S1 and W denotes the thickness of the depletion layer. $C_0$ changes as W changes with voltage difference between the floating gate and the substrate. Therefore, the value of $C_0V_s$ in Eq. (3) does not remain constant, but changes depending on the operation condition of the device. Namely, the threshold value $V_{TH^*}$ given by Eq. (3) changes with this value. In general, this change causes little problem because of being small as compared with $V_{TH^*}$. However, it is desirable for high accuracy operation that $V_{TH^*}$ does not change at all. On the other hand, the inequality $C_0 \ll C_{TOT}$ holds in the embodiment 5 and the 2nd term of Eq. (3) is decreased to the value small enough to remove the problem of $V_{TH^*}$ variation.

(Embodiment 6)

FIG. 6 is a cross-sectional view explaining the sixth embodiment. 601 is, e.g., a P-type S1 substrate, 602 is a field oxide film, and 603 is a floating gate. 604 denotes four input gates. The feature of this embodiment is that another control gate 605 is formed under the floating gate through an insulating film 606. Here, $C_0$ denotes a capacitive coupling coefficient between the floating gate and control gate 605 and $C_{TOT}$ is assumed to be large enough as compared to $C_0$; i.e., $C_0/C_{TOT}=0$ ($C_{TOT}=C_1+C_2+C_3+C_4$ and $C_1-C_4$ are capacitive coupling coefficients between the floating gate and each of four input gates). Then, Eq. (3) reduces to $$V_{TH^*}=V_{TH}-(C_c/C_{TOT})V_c. \quad (8)$$

Here, $V_o$ is potential of the control gate and $Q_F$ is assumed to be 0. Eq. (8) indicates that $V_{TH^*}$ can be controlled by $V_c$. In otherwords, if the circuit shown in FIG. 1(d) is constructed using vMOS shown in FIG. 6, the threshold $V_{TH}$, with which $V_{OUT2}$ changes from 0 V to $V_{DD}$ to input can be changed by the input voltage applied to the control gate, indicating that the threshold of neuron operation can be changed and a neuron computer can be designed more flexibly.

Such a variable threshold function is not restricted to the structure of FIG. 6. In each case of FIGS. 1, 2, 4 and 5, the same function is realized by utilizing one of input gates as a control gate.

For the case $Q_F \neq 0$ in Eq. (3), Eq. (8) is revised as $$V_{TH^*}=V_{TH}-(C_c/C_{TOT})V_c-Q_F/C_{TOT}. \quad (9)$$

Under the condition $V_c=0$, this device operates with $$V_{TH^*}=V_{TH}-Q_F/C_{TOT}. \quad (10)$$

First, if the device is assumed to be under the condition $Q_F=0$, $V_{TH^*}=V_{TH}$. Then, a voltage of +20 V is applied to every input gate 604 under the condition of $V_c=0$ ($V_1=V_2=V_3=V_4=20$ V). If the device is designed so that $(C_1+C_2+C_3+C_4)$: $C_c=4:1$, then $V_F=16$ V. The thickness of the gate oxide film 607 in the channel region is, e.g., 100 Å. The voltage of 16 V applied to the gate oxide film causes electron to flow through the oxide film to the floating gate; the electron injection to the floating gate occurs, resulting in $Q_F<0$. From Eq. (10), $V_{TH^*}$ is expressed as follows:

$$V_{TH^*}=V_{TH}+|Q_F|/C_{TOT}$$

indicating that $V_{TH^*}$ becomes larger by $|Q_F|/C_{TOT}$ than that before electron injection. The $V_{TH^*}$ variation can be controlled by controlling the voltage applied to each input gate; $V_{TH^*}$ can be changed from 20 V for the case of $V_1=V_2=V_3=V_4$. It is also possible that each input gate has different voltage. On the other hand, in the case where $V_1=V_2=V_3=V_4=-20$ V, the electron is discharged from the floating gate resulting in $Q_F>0$. In this case, $$V_{TH^*}=V_{TH}-Q_F/C_{TOT}$$

Namely, the threshold becomes small as compared with that before injection. The electron discharge is also carried out under the condition that $V_1=V_2=V_3=V_4=0$ V and $V_o=-20$ V.

As mentioned above, the electron injection or discharge through a insulating film which is carried out by controlling the potential of floating gate 603. As a result, the amount of charge in the floating gate can be controlled. Namely, the threshold of the neuron element can be changed according to Eq. (10). When $V_{TH*}$ is controlled by this method, its value is maintained unchanged until the next injection or discharge is carried out. That is, the value of $V_{TH*}$ is memorized even if a power supply of the circuit is cut off. In the explanation of FIG. 6, the electron injection or discharge through a gate oxide film is described, but this can also be made at other portions; for example, an oxide film 606 between the floating gate and the control gate 605 or an oxide film 608 between the floating gate and input gate 604. It is also possible to make injection or discharge through a portion of oxide film 606, 607, 608 which to formed to be thin. In FIG. 6, different voltages are applied to the control gate 605 and the input gate 604 to control the injection or discharge. The injection or discharge is also made by applying different voltages to each of input gates. Namely, it is needless to particularly prepare control gate such as 605. For example, in the examples in FIGS. 1, 2, 4 and 5, the same operation can apparently be made by controlling the voltage applied to each input gate. But in any case the injection and discharge must be prevented from occurring during ordinary switching operation. Thus, higher voltage must be required for the injection or discharge operation than for switching operation.

A neuron element using νMOS of this invention is realized in configurations such as that shown in FIG. 1(d), where the resistor 122 is used as a load element connected to νMOS 703, 704. Other elements can be used instead of a resistor. The examples are shown in FIGS. 7(a) and 7(b).

Figure 7A:
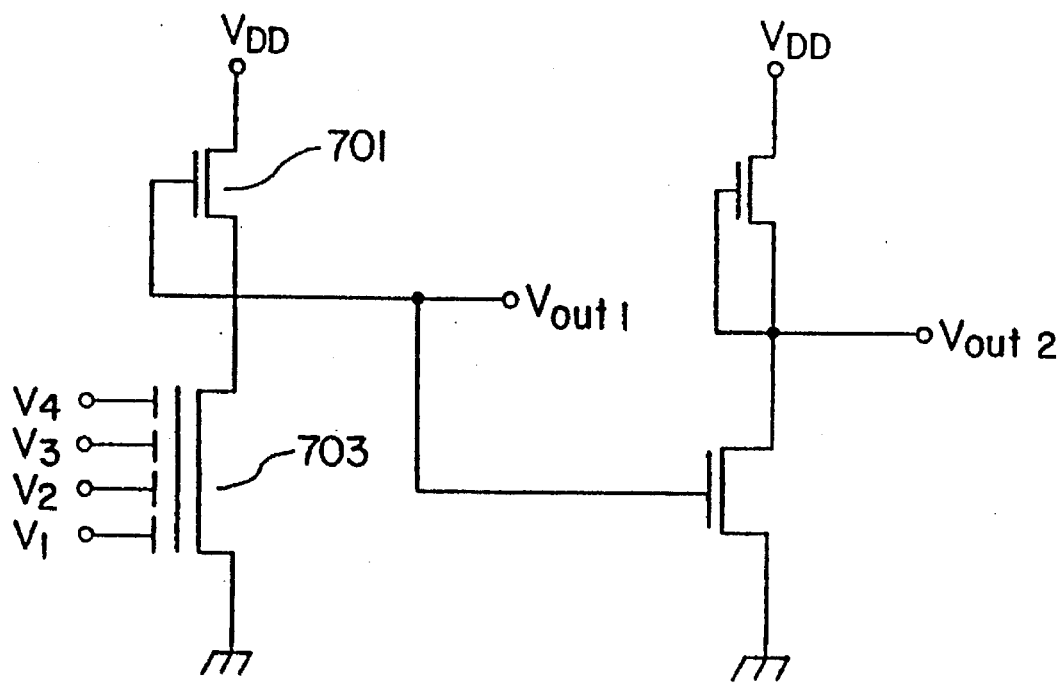
FIG. 7 is a diagram of a circuit illustrating another example.
Figure 7B:
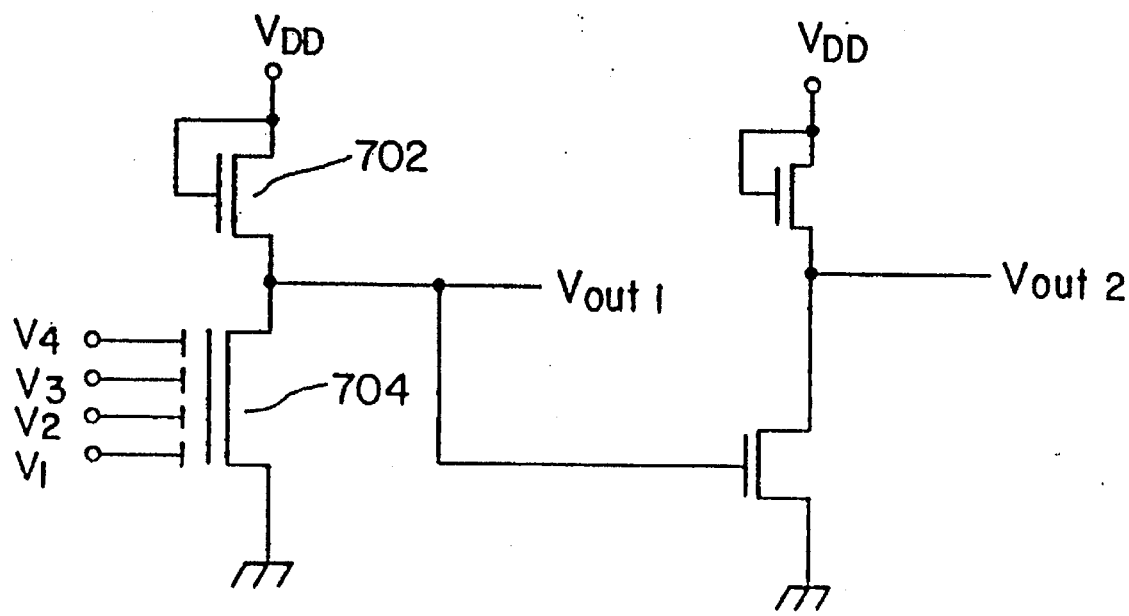

In FIGS. 7(a) and 7(b), N-channel depletion mode MOS transistor 701 and N-channel enhancement mode transistor 702 are used as a load element, respectively. An N-channel νMOS is formed on a P-type substrate in FIGS. 1, 2, 4, 5, 6 or 7. The same function can also be realized for the case where a p-channel νMOS is formed on a N-type substrate.
(Embodiment 7)

Figure 8A:
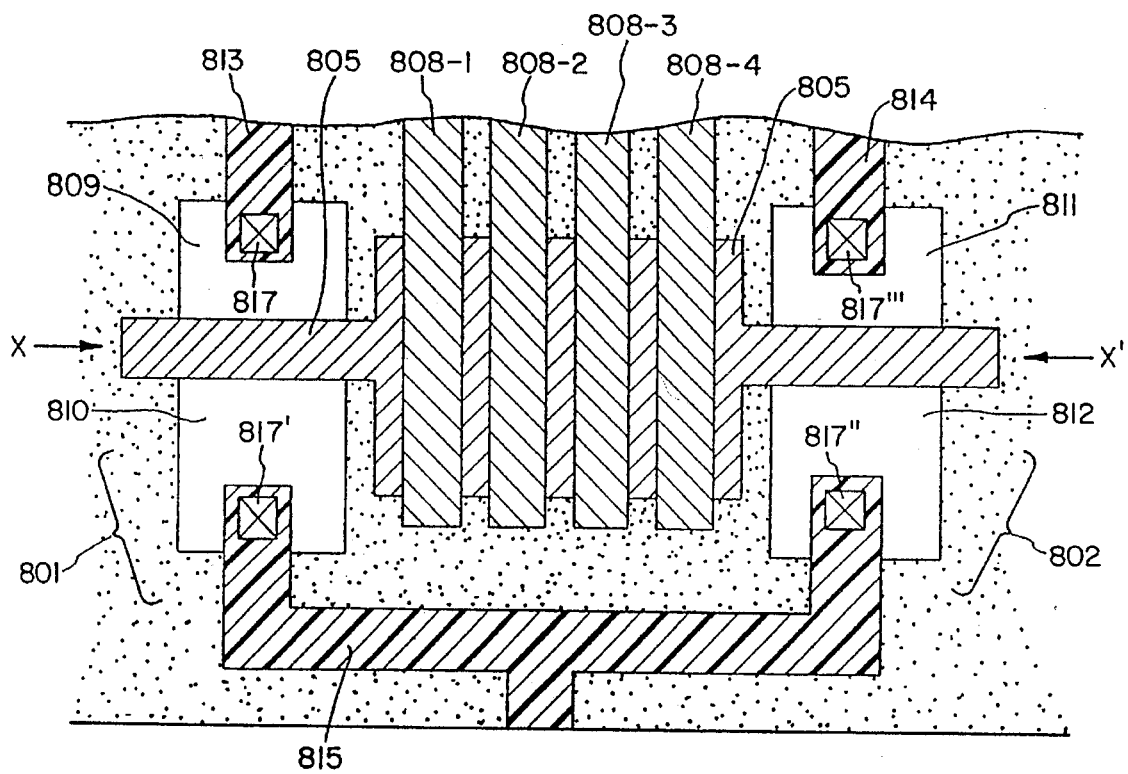
FIG. 8(a) is a plan view of device.
Figure 8B:
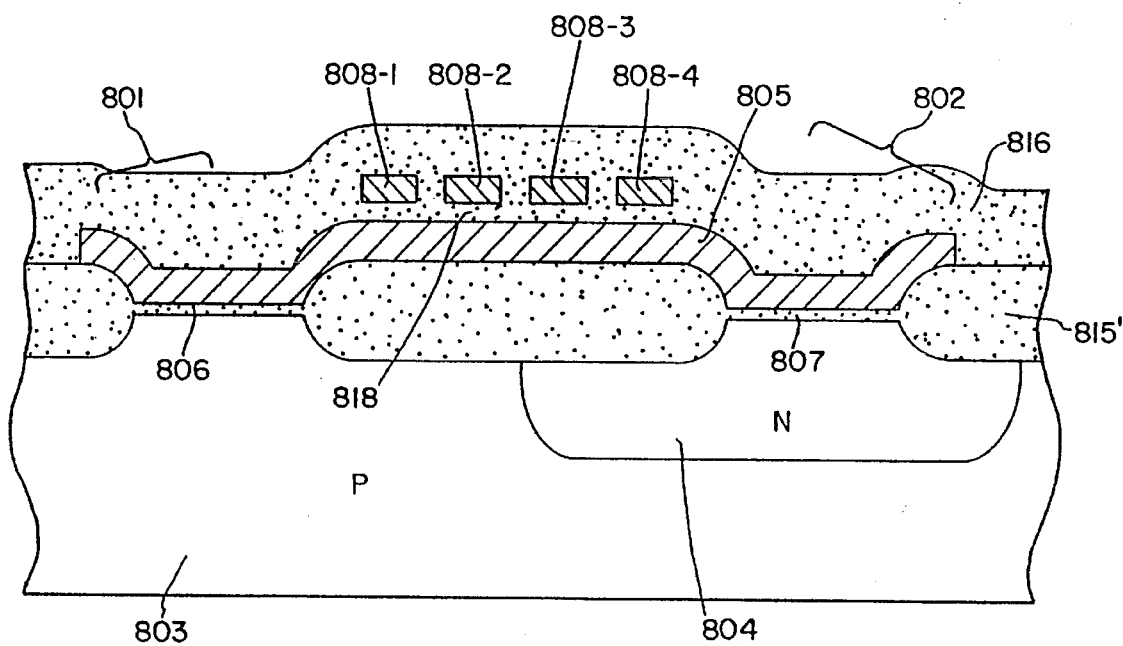
FIG. 8(b) is a cross-sectional view along X–X' line of FIG. 8(a) and FIG. 8(c) is a graph showing characteristics.

As a method for constructing a neuron element using νMOS of this invention, the configuration such as those in FIGS. 1(d), 7(a) and 7(b) have been described so far. These configurations have such a problem that direct current flows from $V_{DD}$ to the ground when νMOS 124, 703, 703 is under conductive condition. Particularly in the case where νMOS is connected to an NMOS inverter as shown in the figure, stand-by current always flows through either one of two paths when $V_{out2}$ is at HIGH and LOW levels. This is undesirable from a viewpoint of power dissipation. The output of $V_{out1}$ is at low level when $Z>V_{TH*}$. However, it is not exactly 0, but $V_{DDx}R_{ON}/(R_{ON}+R_L)$. Here, $R_{ON}$ is on-resistance of νMOS and $R_L$ is a resistance of load element. Since the value of $R_{ON}$ and $R_L$ are usually designed so that $R_{ON} \gg R_L$, the output voltage becomes nearly zero. But the output of exactly 0 V is preferable. The embodiment 7 is demonstrated as an example to meet these requirements. FIG. 8(a) is a plan view explaining the embodiment 7 and FIG. 8(b) is a cross-sectional view along X–X' line of FIG. 8(a).

801 is an N-channel νMOS formed on a P-type substrate 803, 802 is a p-channel νMOS formed on a N-type substrate 804. 805 is a floating gate formed over the P-type substrate 803 and the N-type substrate 804 through insulating films 806 and 807. 808-1, 808-2, 808-3 and 808-4 are input gates. 809 and 810 are n⁺ source and n⁺ drain, respectively. 811 and 812 are p⁺ source and p⁺ drain, respectively. 813, 814, and 815 are Al interconnects; 813 is connected to $V_{ss}$ (ground) potential and 814 to VDD (positive supply voltage, e.g., 5 V). 815' is a field oxide film and 816 is an insulating film under Al interconnects. 817, 817', 817''' and 817'''' are contact holes formed in the insulating film 816. In NMOS and PMOS, a gate length, a gate width and thickness of a gate film are, for example, 1 μm, 3 μm and 200 Å, respectively. All overlapping regions between the floating gate and each input gate have the same area of 4.5 μm². The insulating film between them is made of 100 Å thick $SiO_2$. In this case, let Z denote the potential of floating gate, which is given by $$Z = 0.214 \ (V_1 + V_2 + V_3 + V_4). \qquad (11)$$

Figure 8C:
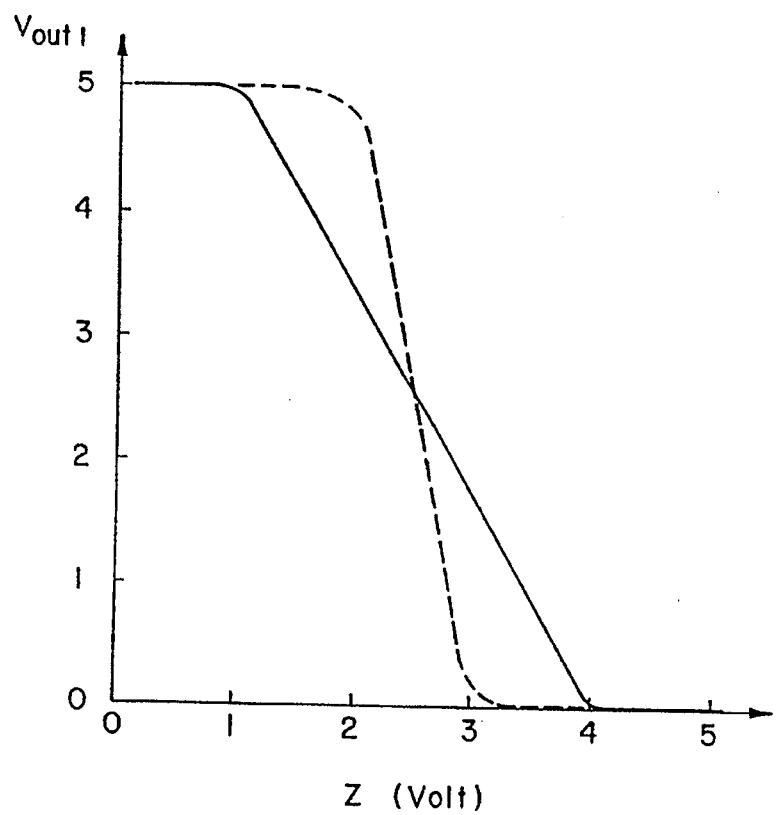

Here, $V_1$, $V_2$, $V_3$ or $V_4$ is input voltage applied to respective input gate. When a threshold voltage $V_{Tn*}$ of N-channel νMOS 801 and a threshold voltage $V_{Tp*}$ of P-channel νMOS 802 as seen from the floating gate are set to be 1 V and −1 V, respectively, the potential $V_{out1}$ of 815 to Z is shown by the solid line of FIG. 8(c). When $Z<1$ V, N-channel νMOS 801 turns off and P-channel MOS 802 turns on. Therefore, $V_{out1}$ becomes 5 V. When $Z > 4$ V, on the other hand, P-channel νMOS 802 turns off and N-channel MOS 801 turns on and then $V_{out1}$ becomes 0 V. This means that the low level is exactly outputted and no stand-by current flows at the low level, indicating that a neuron element dissipating little power can be formed. The broken line in FIG. 8(c) shows the relationship between Z and $V_{out1}$ when $V_{Tn}=2$ V and $V_{Tp}=-2$ V. In this case, the characteristics steeply changes from 5 V to 0 V. This characteristics can be controlled by the selection of $V_{Tn}$ and $V_{Tp}$. The 7th embodiment of this invention is a MOS having an excellent characteristics of low power dissipation. Both N-channel νMOS and P-channel νMOS share the same floating gate and complementarily control the on and off each other, so this νMOS is called complementary νMOS or C-νMOS in short.

So far only the case where νMOS is formed on the bul Si wafer has been described, but the device of this invention can also be formed on, for example, SOI substrate, i.e., silicon layer on an insulating film.
(Embodiment 8)

Figure 9:
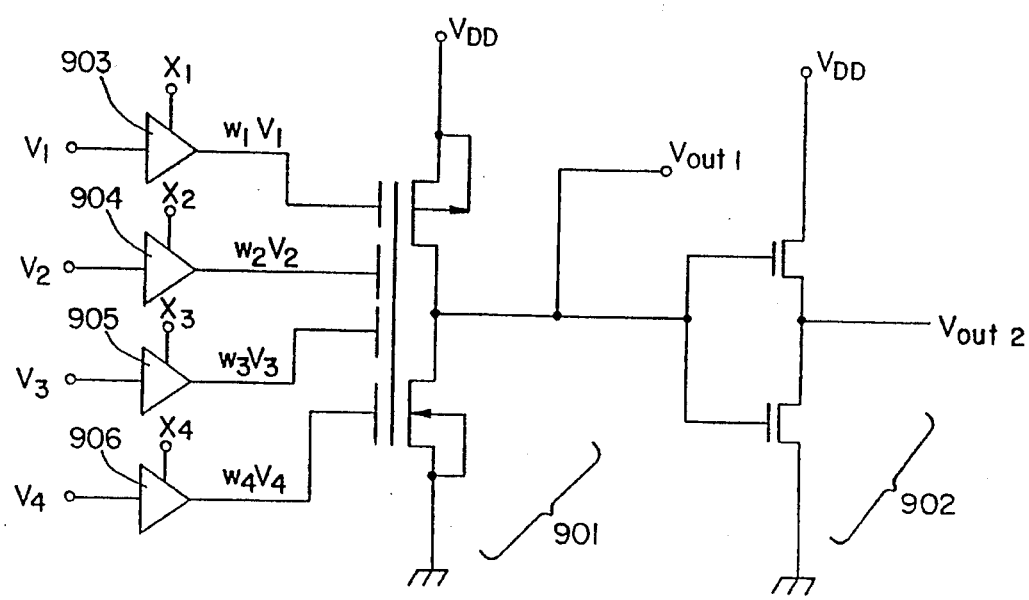
FIG. 9 is a diagram of circuit explaining embodiment 8.

FIG. 9 shows the 8th embodiment of the invention and an example of the configuration of neuron element using C-νMOS. 901 is a symbol of 4-input-gate C-νMOS and 902 is a CMOS inverter. 903, 904, 905 and 906 are the circuits which multiply input voltage $V_1$, $V_2$, $V_3$ and $V_4$ by respective weight coefficients $W_1$, $W_2$, $W_3$ and $W_4$ determined by the control voltages $X_1$, $X_2$, $X_3$ and $X_4$ and then output weighted voltages to the input gates of C-νMOS. The output Of $V_{out2}$ is LOW when $V_{out2}$ is HIGH and HIGH when $V_{out1}$ is LOW. In both cases of $V_{out2}$ being at HIGH and LOW levels, no stand-by current flows in C-νMOS 901 or CMOS inverter 902. Although 801-1 to 801-4 are all used as input gates in the examples of FIGS. 8 and 9, at least one of these can be used as a control gate like 605 as described in FIG. 6. $V_{Tn}$ and $V_{Tp}$ are controlled, for example, by applying a fixed voltage to 801-1. The control gate such as 605 can be prepared separately. It is needless to say that the injection of charge to the floating gate is also utilized.

Figure 10:
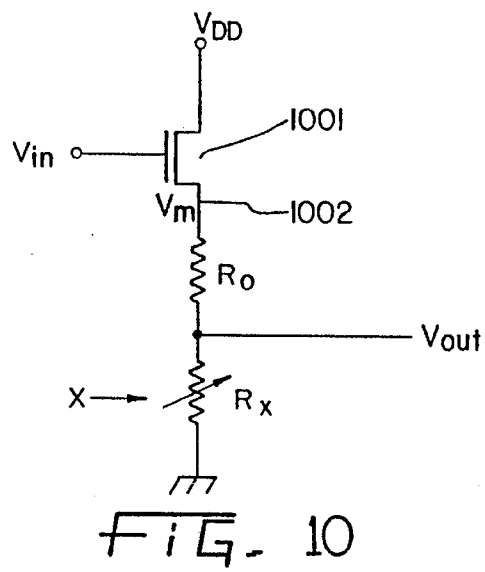
FIGS. 10 and 11 are diagrams of a circuit illustrating other examples.

Next, the weight-product circuit demonstrated in FIGS. 3 and 9 (302-1 to 302-n, 903, 904, 905 and 906) is described below. FIG. 10 is a circuit demonstrating an example of weight-product circuit. For example, 1001 is NMOS having a threshold $V_{TH}$ of about 0 V. $R_0$ denotes a resistor and $R_x$ a variable resistor controlled by input voltage X. Let $V_m$ denote the potential at 1001, which is given by $V_m = V_{in} - V_{TH}$. If $V_{TH}=0$, then $V_m=V_{in}$. Therefore, the output voltage $V_{out}$ is given by $$V_{out}=V_{in} \cdot R_x/(R_0+R_x). \quad (12)$$

Figure 11:
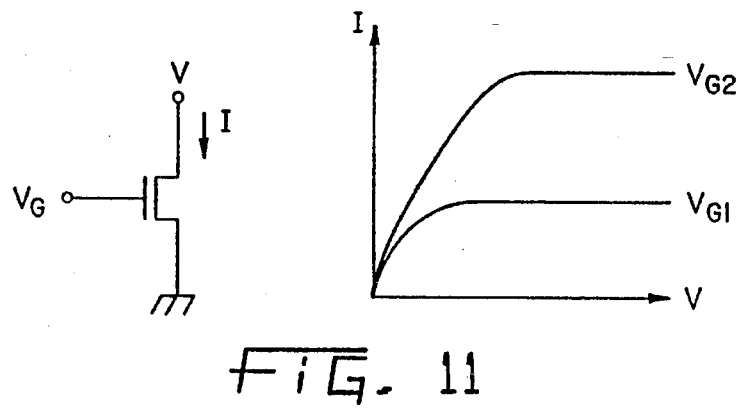

Namely, this circuit has such a function that input $V_{in}$ is multiplied by weight coefficient of $R_x/(R_0+R_x)$ and then outputted. Therefore, if the value $R_x$ of a variable resistor is controlled by input voltage X, the weight coefficient can arbitrarily be changed. Such a variable resistor can be realized using one MOSFET as shown in FIG. 11. When a constant voltage $V_G$ is applied to the gate, the current-voltage characteristics becomes as shown in the figure, indicating that MOSFET is used for a variable resistor. However, as is apparent from the figure, much attention must be paid to the design of the circuit because of strong nonlinearity.

(Embodiment 9)

Figure 12:
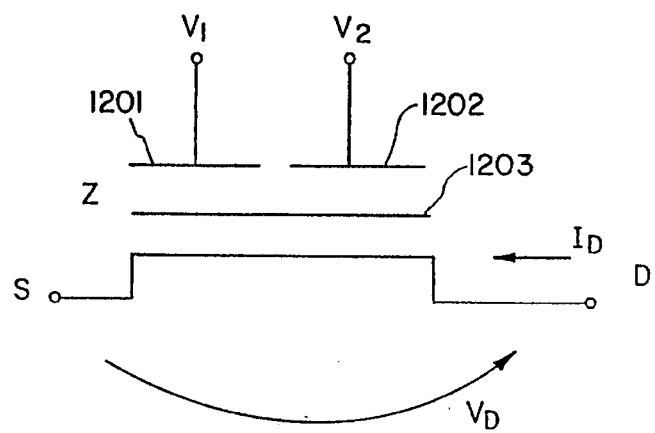
FIG. 12 is a schematic diagram of a circuit explaining embodiment 9.

It will be described below that a variable resistor with excellent linearity is realized by using νMOS of this invention. First, the characteristic of νMOS is generally analyzed. FIG. 12 shows a symbol of νMOS with two input gates 1201, 1202 where $V_d$ denote the drain potential when a source is grounded. $V_1$ and $V_2$ the input gate potential and Z the potential of the floating gate 1203. Here, L and W denote a channel length and a channel width of νMOS, respectively and $V_{th}$ denote the threshold voltage as seen from the floating gate. Then the drain current $I_d$ is expressed by the following equation:

$$I_D=(W/L)\mu_n C_0 \quad (12')$$

Here, $\mu_n$ is surface electron mobility and $C_0$ is a capacitance of a gate oxide film under the floating gate. Z is given by $$Z=W_1V_1+W_2V_2 \quad (13)$$

where $$W_1=C_1/(C_0+C_1+C_2)$$

$$W_2=C_2/(C_0+C_1+C_2)$$

Figure 13A:
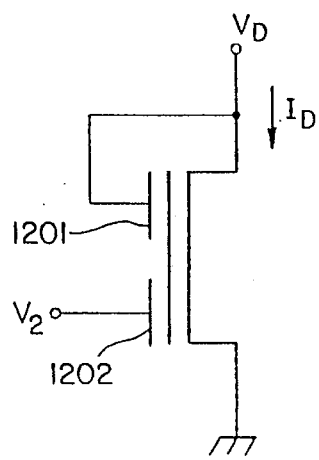
FIG. 13(a) is a diagram of a circuit and FIG. 13(b) is a graph showing characteristics.

The 9th embodiment of this invention as shown in FIG. 13. The first input gate 1201 of νMOS is connected to a drain and a constant voltage is applied to the second input gate 1202. If $V_1=V_D$ is substituted into Eq. (13) and then Eq. (12'), $I_D$ is obtained as $$I_D = (W/L)\mu nC_0$$
$$= (W/L)\mu nC_0$$

Here, if we take $W_1=\frac{1}{2}$, the term of $V_D^2$ disappears and the following equation is obtained:

$$I_D=(W/L)\mu nC_0 \quad (14)$$

Figure 13B:
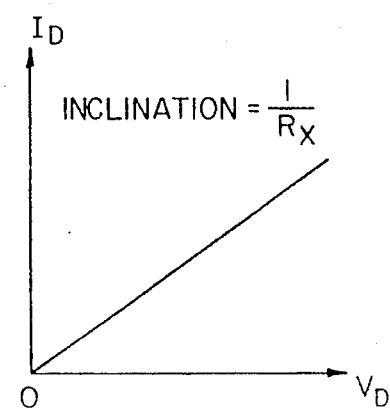

As is shown in FIG. 13(b), $I_D$ is proportional to $V_D$, indicating that νMOS acts as a linear resistance element. The resistance $R_x$ for direct current as seen from the outside to given by $$(1/Rx)=(W/L)\mu nC_0(W_2V_2-V_{TH}) \quad (15)$$

In other words, the value of resistance can be controlled by the value of $V_2$. For $R_x>0$ in Eq. (15)

$$W_2V_2-V_{TH}>0 \quad (16)$$

Therefore, $W_2$ and $V_{TH}$ must be determined so that Eq. (16) holds. If the depletion mode νMOS is employed, $V_{TH}<0$; that is, Eq. (16) always holds. For $W_1=\frac{1}{2}$, $$C_1/(C_0+C_1+C_2)$$

i.e.

$$C_0+C_2=C_1$$

For this reason, it is desirable to employ the structure which is shown in FIG. 5 as the embodiment 5 of the invention and can lessen the affect of $C_0$. By using the circuit of FIG. 13(a) for $R_x$ of FIG. 10, the resistance value can be controlled by the value of $V_2$ and thus ideal weight-product circuit can be realized. As has been mentioned, νMOS can effectively be applied to various circuits.

So far the charge in the floating gate has been assumed to be zero. For the case of charge $Q_F$ being not zero, the resistance in Eq. (15) is revised to $$(1/Rx)=(W/L)\mu nC_0(W_2V_2-V_{TH}+Q_F/C_{TOT}). \quad (15')$$

As described in the embodiment 6, the value of resistance can be memorized by making use of the phenomenon of electron injection to the floating gate or electron discharge from the floating gate. The voltage is applied to $V_2$ only when electron injection is made. $V_2$ is kept constant during ordinary operation.

(Embodiment 10)

All neuron circuits which has been described so far are constructed using single positive supply voltage. Therefore, all signals have only positive value and negative signal cannot be handled.

Figure 14A:
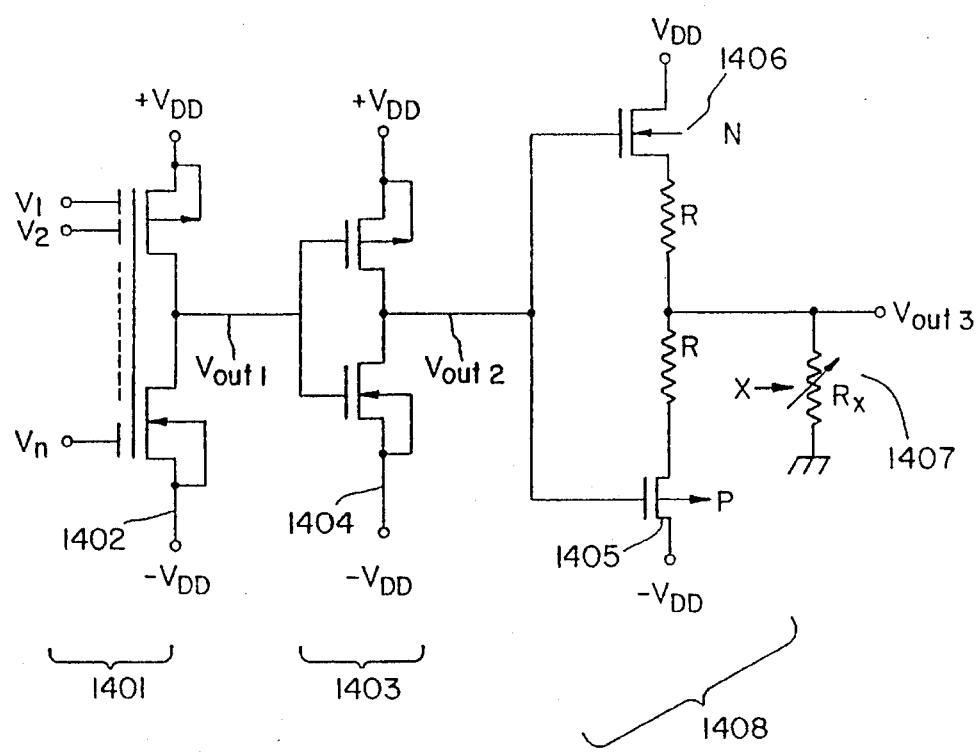
FIG. 14 is a schematic diagram of circuit explaining embodiment 10.
Figure 14B:
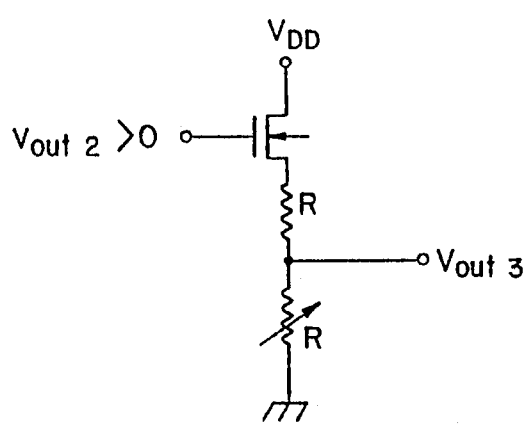
Figure 14C:
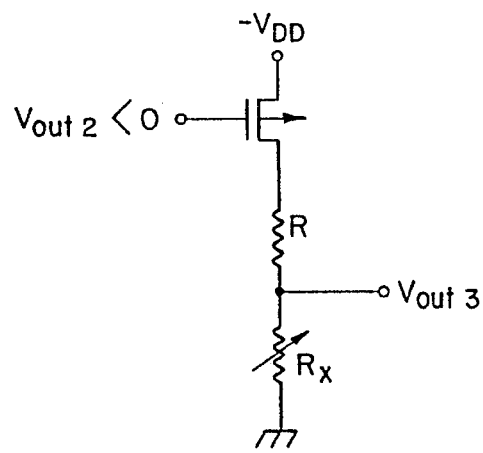

FIG. 14 to a circuit of the embodiment 10 which can deal with both positive and negative signals. 1401 is a C-νMOS such as that described in FIG. 8. The source 1402 of N-channel νMOS is connected to a negative supply voltage ($-V_{DD}$). 1403 is a CMOS inverter. The source 1404 of NMOS is also connected to ($-V_{DD}$). 1405 and 1406 are, respectively, P-channel MOS and N-channel MOS, the thresholds of which are set nearly 0 V. $V_1 \ldots V_n$ are inputs with positive or negative value. $V_{OUT}=+V_{DD}$ if $Z>V_{TH}$ and $-V_{DD}$ if $Z<V_{TH^*}$. Then, the operation of the circuit 1408 is discussed. When $V_{out2}$ is positive, PMOS 1405 turns off and 1408 as shown by FIG. 14(b). Then, $V_{out3}$ is given by $$V_{OUT3}=(R_x/(R+R_x))V_{OUT2}. \quad (17)$$

The $V_{OUT3}$ outputs positive values. In the case of $V_{OUT2}$ being negative, on the other hand, NMOS 1406 turns off and 1408 is shown by FIG. 14 (c). Namely, $$V_{OUT3}=(R_x/(R+R_x))V_{OUT2}. \quad (18)$$

Therefore, the negative value is outputted, suggesting that multiplication of weight coefficients which takes the sign into account can be made. Making use of a circuit such as 1408 for 903 to 906 in FIG. 9, a neuron circuit can be constructed which is capable of dealing with both positive and negative signals. As a variable resistor of this circuit, νMOS circuit shown in the embodiment 9 can be used.

Figure 15:
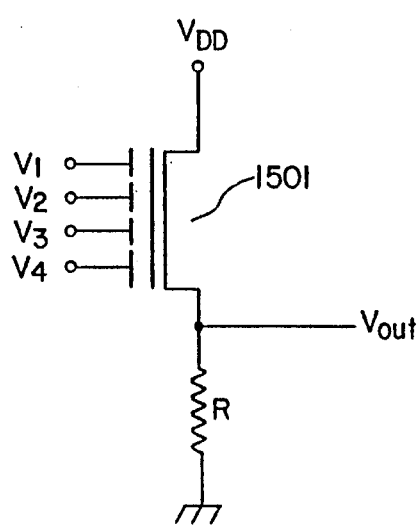
FIG. 15 is a schematic diagram of circuit explaining embodiment 11.

(Embodiment 11)

νMOS is applied to various elements for neural computer as mentioned above and also has wide application in other fields. FIG. 15 is a circuit of the embodiment 11. 1501 is a four-input-gate νMOS and the input voltages $V_1$, $V_2$, $V_3$, $V_4$ are applied to respective input gates. Let Z denote the floating gate potential, which is given by: $Z=W_1V_1+W_2V_2+W_3V_3+W_4V_4$. Then, $$V_{out}=Z-V_{TH}$$

Here, $V_{TH}$ is the threshold of vMOS 1501 as seen from the floating gate. In the case of $V_{TH}$ being nearly 0 V, $V_{out}$ is expressed as $$V_{out} = W_1V_1 + W_2V_2 + W_3V_3 + W_4V_4$$

This is a circuit to output a linear sum of weighted input voltage. Such function is very useful for. e.g., multi-valued logic circuit. The circuit with this function dissipates very little power as compared with the circuit which performs sum operation of voltage by making use of current additivity. Also the remarkable improvement of integration density is achieved because the circuit is realized with a single element.

(Embodiment 12)

Figure 16:
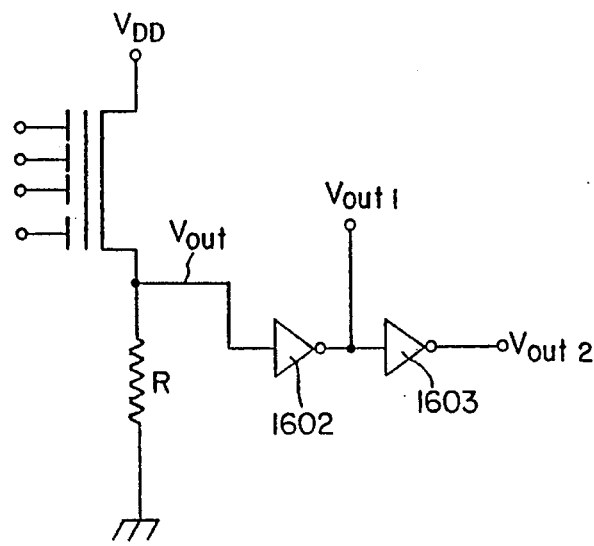
FIG. 16 is a schematic diagram of circuit explaining embodiment 12.

FIG. 16 shows the 12th embodiment which is an example of neuron circuits using the circuit shown in FIG. 15. $V_{out}$ is connected to 2-stage inverters 1602, 1603 and $V_{out2}$ is outputted. The threshold of the inverter 1602 is defined as $V_{TH}$. When $W_1V_1+W_2V_2+W_3V_3+W_4V_4 > V_{TH}$, the output of $V_{out}$ becomes HIGH. Namely, this circuit apparently performs a neuron function. As Inverters 1602, 1603, E-R type, E-E type or E-D type of NMOS or CMOS type inverter can be used.

(Embodiment 13)

Figure 17:
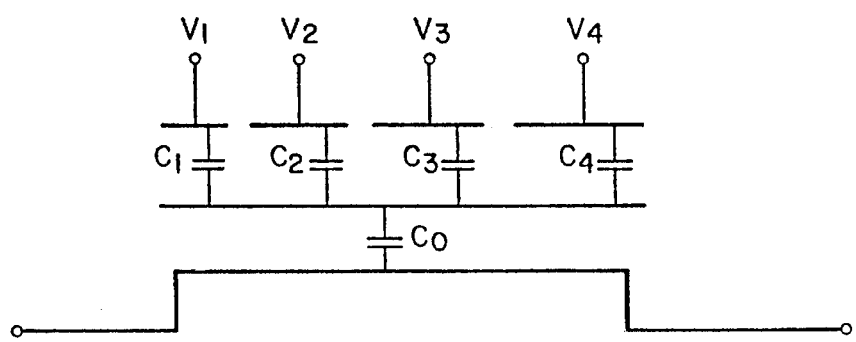
FIG. 17 is a schematic diagram of circuit explaining embodiment 13.

FIG. 17 is a structure of vMOS illustrating the 13th embodiment. Capacitive coupling coefficients between a floating gate and four input gates are indicated by $C_1, C_2, C_3$ and $C_4$ and are designed so that $C_2=2C_1$, $C_3=4C_1$ and $C_4=8C_1$. The floating gate potential Z is given by $$Z = (C_1/C_{TOT})V_1 + (C_2/C_{TOT})V_2 + (C_3/C_{TOT})V_3 + (C_4/C_{TOT})V_4 = (C_1/C_{TOT})(V_1+2V_2+4V_3+8V_4). \quad (19)$$

Here, if the values of $V_1, V_2, V_3$ and $V_4$ are either of 1 or 0, the number of $(V_1+2V_2+4V_3 8V_4)$ in Eq. (19) corresponds to decimalized number of binary number $(V_4,V_3,V_2,V_1)$. In other words, Z indicates the voltage proportional to the decimal number into which binary number is transformed. Therefore, when vMOS of FIG. 17 is used for vMOS in FIG. 15, $V_{out}$ outputs the voltages which are obtained by D-A conversion of binary numbers $(V_4,V_3,V_2,V_1)$.

As described above, D-A conversion can be carried out using a single vMOS. This is an important application of vMOS.

(Embodiment 14)

Figure 18:
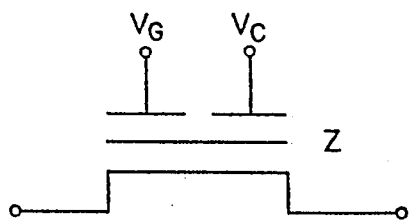
FIG. 18 is a schematic diagram of circuit explaining embodiment 14.

FIG. 18 is the 14th embodiment of this invention illustrating vMOS having two input gates $V_G$ and $V_C$. Here, Z denotes the floating gate potential, and $V_{TH}$ denotes the threshold as seen from the floating gate. Then, Z is given by $$Z = W_1V_G + W_2V_C.$$

The transistor turns on when $Z>V_{TH}$, i.e.

$$W_1V_G + W_2V_C > V_{TH}.$$

When $$V_G > (1/W_1)(V_{TH} - W_2V_C) \quad (20)$$

this vMOS turns on. By assuming vMOS to be a single MOSFET having a gate $V_G$, this vMOS can be regarded as a transistor having a new threshold value $V_{TH*}$. Here, $$V_{TH*} = (1/W_1)(V_{TH} - W_2V_C). \quad (21)$$

As is apparent from Eq. (21), the threshold can be changed by applied voltage $V_C$. Such a transistor whose threshold value can be changed by the external signal has not existed up to now. This transistor is a very important circuit element to construct a multi-valued logic integrated circuit. This vMOS can easily realize the circuit without various ideas and considerations which have been proposed up to now.

The above described invention is epoch-making such that the principal function of a neuron is attained using single transistor and that little power is dissipated because the sum operation is carried out on the basis of voltage mode. FIG. 31 (*a*) shows a cross-sectional diagram of vMOS, where 3121 is, e.g., a P-type silicon (a first semiconductor region) substrate, 3122 and 3123 are source (a first source region) and drain, (a first drain region) formed with $N^+$ diffusion layer, 3124 is a gate insulating film such as $SiO_2$ (a first insulating film) formed on a channel region, 3126 is a floating gate (a first gate electrode) electrically isolated, 3127 is, e.g., an insulating film such as $SiO_2$ (a second insulating film), and 3128 ($G_1, G_2, G_3, G_4$) are input gates (second gate electrodes) which correspond to the input part of neuron.

FIG. 31(*b*) is a simplified diagram to explain the performance of neuron. Let capacitive coupling coefficient between each input gate and the floating gate be $C_G$ and that between the floating gate and the silicon substrate be $C_0$, leading to floating gate potential Z as:

$$Z = -W(V_1+V_2+V_3+V_4) \quad (22)$$

$$W = C_G/(C_0+4C_G) \quad (23)$$

Here, $V_1, V_2, V_3$ and $V_4$ are voltages inputted to input gates $G_1, G_2, G_3$ and $G_4$, respectively and the potential of silicon substrate is 0 V; that is, the substrate is grounded.

The vMOS is regarded as an ordinary N-channel MOS transistor with the floating gate acting as a gate electrode. A threshold voltage seen from the floating gate (at which an inversion layer is formed on the substrate surface) is expressed by $V_{TH*}$. Accordingly, vMOS turns on When $Z>V_{TH*}$ and turns off when $Z<V_{TH*}$. Therefore, the combination of vMOS 3129 and single inverter as shown in FIG. 31(*c*) makes it possible to attain the function of a neuron. 3130 and 3131 denote resistors to construct an inverter. 3132 denotes an NMOS transistor. FIG. 31(*d*) represents $V_{OUT1}$ and $V_{OUT2}$ as a function of Z. $V_{OUT2}$ becomes the high voltage level of $V_{DD}$ for $Z>V_{TH*}$; the state where the neuron gets fired is realized.

As shown in Eq. 4, the basic performance of a neuron is that the sum of input signals to a neuron is calculated in the voltage mode, and the neuron gets fired when the sum exceeds $V_{TH*}$ is realized by single vMOS. Because of the sum calculation in the voltage mode, the current at input stage flows only to charge or discharge the capacitances and therefore the amount of current is very little. On the other hand, direct current flows through the inverter when the neuron gets fired since resistor 1110 is used as a load. By using a vMOS gate of CMOS configuration as shown above, the direct current can be prevented.

FIG. 32(*a*) is an example of CMOS configuration. FIG. 32(*a*) represents a cross-sectional diagram of the CMOS neuron gate, where 3221 denotes a P-type silicon substrate, 3222, N-type well, 3223(*a*) and 3223(*b*), $N^+$-type source and drain, respectively, 3224(*a*) and 3224(*b*), $P^+$-type source and drain, respectively, 3225, a floating gate (first gate electrode) 3226(*a*)-3226(*d*), input gate electrodes (second gate electrodes), 3227 and 3228, insulating films such as $SiO_2$ (first and second insulating films, respectively), and 3229, a field oxide film.

FIG. 32(*b*) represents an example of single neuron circuit configuration, where 3230 is the symbol of the CMOS gate which is shown in FIG. 32(*a*). The same numerals as in FIG.

32(a) are used for the corresponding parts. 3231 denotes a CMOS inverter, 3232 and 3233, NMOS and PMOS, respectively, and 3234, the output of the neuron. As mentioned, a neuron can be constructed with a small number of elements and power dissipation is very little, indicating that vMOS is inevitable in realizing a neuron computer.

Figure 33:
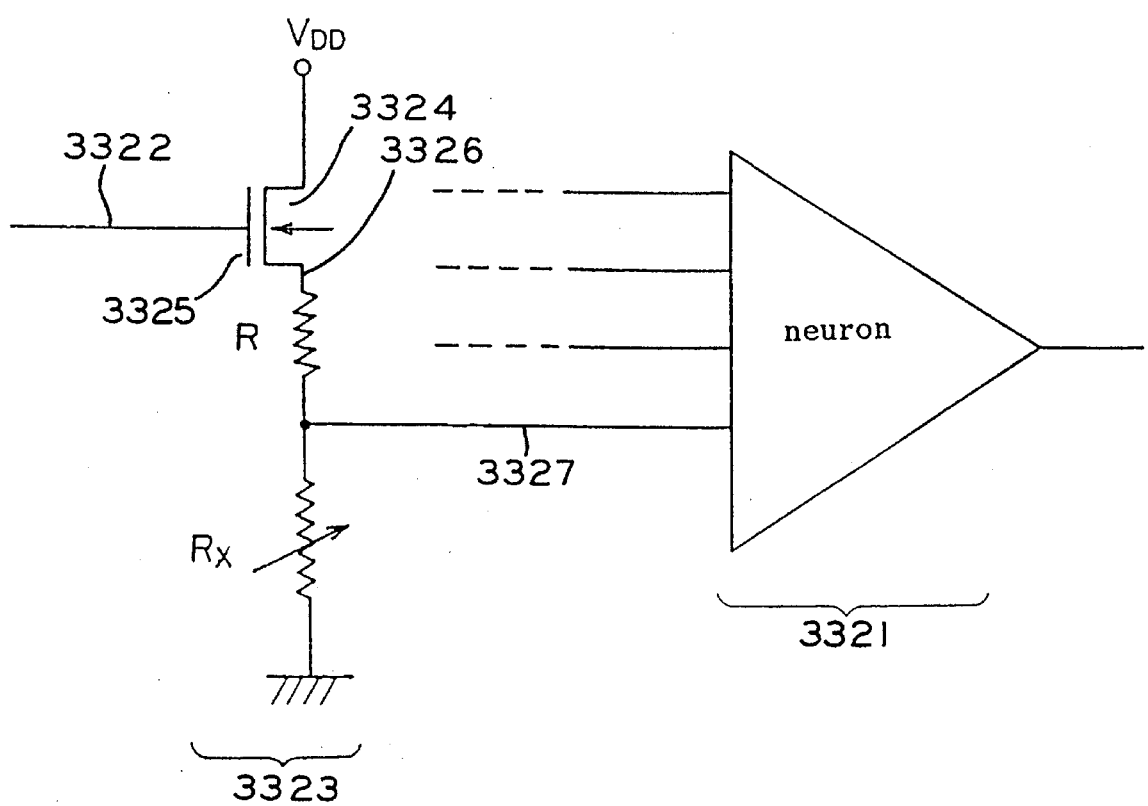
FIG. 33 is a circuit diagram showing the fundamental unit structure of a neuron circuit having synapse couplings constructed using an MOS transistor.

In addition to a neuron, another important element, a synapse, is required to realize a neuron computer. FIG. 33 represents a basic configuration of a neuron circuit which contains synapse couplings together with a vMOS transistor. 3321 is a neuron circuit as shown in e.g. FIG. 31(c). 3322 is an interconnect through which the output of another neuron is transferred. 3323 is a synapse circuit to put weight on signal, consisting of a source follower circuit where source 3326 of NMOS transistor 3324 is connected to resistors (R+$R_x$). Therefore, when the output voltage $V_s$ of fired neuron is applied to the gate electrode 3325 of NMOS transistor 3324, the potential of source becomes $V_s - V_{TH}$ where $V_{Th}$ is a threshold voltage of NMOS transistor 3324.

For the case of $V_{TH}=0$, the potential of source 3326 is $V_s$. The voltage is divided by two resistors R and $R_x$, to be the output of the synapse circuit which is transferred to neuron 3321 through interconnect 3327. The output voltage is expressed by $V_s \cdot R_x/(R+R_x)$, showing that the signal voltage $V_s$ is multiplied by weight $R_x/(R+R_x)$ and that the weight can be changed by $R_x$.

Figure 34A:
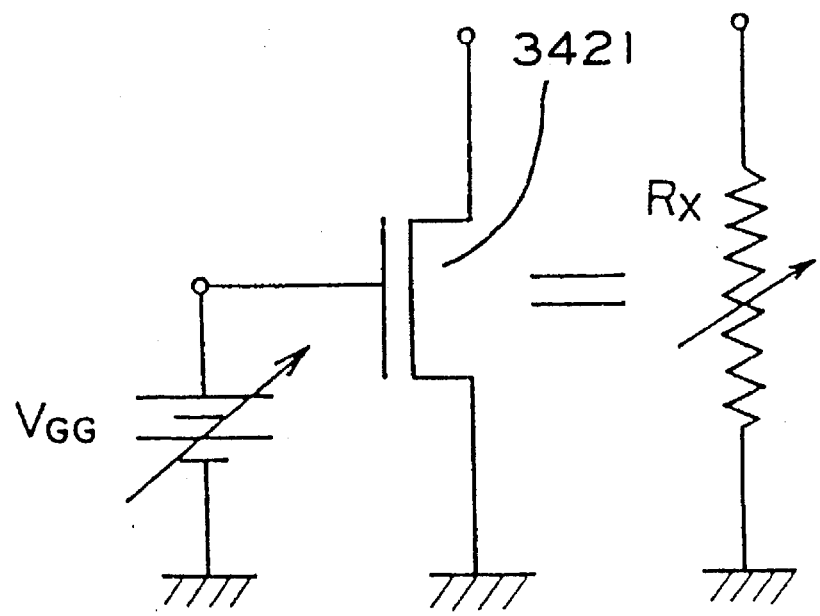
FIG. 34(a) is a circuit diagram explaining a method for realizing a variable resistor.

FIG. 34(a) represents a method to obtain a variable resistor. For example, with the application of constant voltage $V_{GG}$ to the gate of MOS transistor 3421, the transistor acts as a resistor. Therefore, the resistance varies with the value of $V_{GG}$.

Figure 34B:
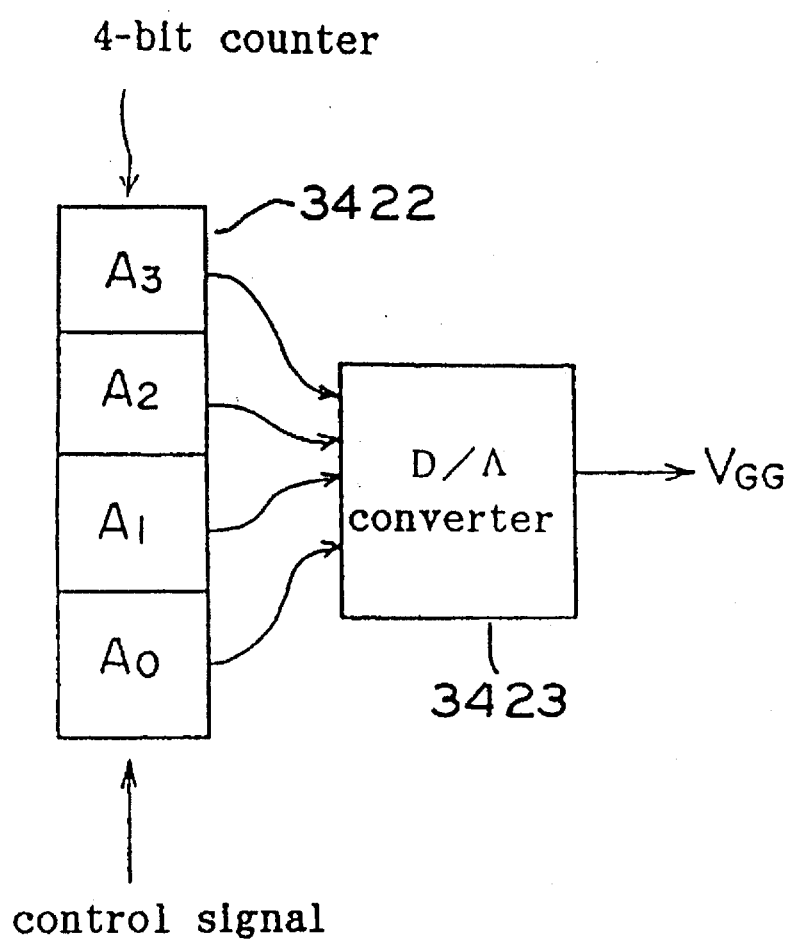
FIG. 34(b) is a diagram of a circuit controlling $V_{GG}$ of FIG. 34(a).

FIG. 34(b) represents an example of a circuit to control the value of $V_{GG}$ which consists of a binary counter 3422 and a D/A converter 3423. The coupling strength of synapse is expressed by 4-bit binary number which is to be converted to analog voltage by D/A converter 3423 and outputted as $V_{GG}$. In order to strengthen the synapse coupling, the value of $V_{GG}$ is decreased by descending the value of the counter and in order to weaken the synapse coupling, the value is increased by ascending the value of the counter.

Next, the problems of the synapse circuit shown in FIGS. 33 and 34 are discussed.

The first problem is that the generation of weight is made by using voltage division in FIG. 33. Since the current always flows through the resistors in this method to hold the weighted output voltage, the power of $(R+R_x) \cdot V_s^2/2$ is always dissipated. Even if the power dissipation at neuron 3322 is reduced by the use of vMOS, the whole power dissipation of the circuit will not be reduced enough. For the case of two-layer neural network, each of which has n neurons, the number of synapse couplings is $n^2$; the number of synapse couplings is much larger than that of neurons. Therefore, it is impossible because of too much power dissipation to design a neural network for practical use with the synapse coupling circuits which require stationary flow of current.

The second problem is that high integration of the circuit which determines the weight of the coupling is impossible to be realized because the circuit shown in FIG. 34(b) requires a large number of elements. For the neural network having the learning function, the strength of each synapse coupling is required to be suitably changed and memorized. A 4-bit binary counter in FIG. 34(b) is used for this purpose, but at least 30 transistors are necessary for the counter. A large number of elements are also necessary for constructing a D/A converter. Furthermore, these circuits dissipate more power per synapse coupling and thus are disadvantageous in terms of power dissipation.

The present invention is made to overcome the above problems. The aim of the invention is to provide a semiconductor device which can construct synapse coupling dissipating very little power using a small number of elements and to realize a lower power dissipation, highly integrated neuron computer chip.

(Embodiment 15)

Embodiment 15 is explained by referring to FIG. 21. FIG. 21(a) is a circuit diagram of embodiment 15, where 2121 denotes a neuron circuit as shown in e.g. FIG. 31(b) or 32(b). In terms of less power dissipation, the circuit of FIG. 32(b) is preferable. 2122a–2122d denote input terminals of the neuron circuit, corresponding to e.g. 3226a–3226d of the circuit of FIG. 32(b). 2123 denotes an interconnect (a first interconnect) which transfers the output signal of a neuron and holds the potential at $V_{DD}$ or 0 V (high or low potential level) depending on whether the neuron is fired or not. 2124 is a circuit which acts as a synapse, connecting the output 2123 of the neuron and the input 2122a of neuron 2121. 2125 denotes a NMOS transistor (a first MOS type transistor). 2126a and 2126b are source and drain of the NMOS transistor, respectively. 2127, 2128a and 2128b denotes a PMOS transistor (a second MOS type transistor), and its source and drain, respectively. The source electrodes 2126a, 2128a of NMOS and PMOS are connected to 2122a of input terminals of the neuron. The drains 2126b, 2128b of NMOS and PMOS are respectively connected to $V_{DD}$ and ground. The gate electrodes 2129, 2130 of NMOS and PMOS are connected to interconnect 2123. A capacitor C 2131 is not an element that is installed, but a capacitance accompanying input terminal 2122 such as parasitic capacitance.

Figure 21A:
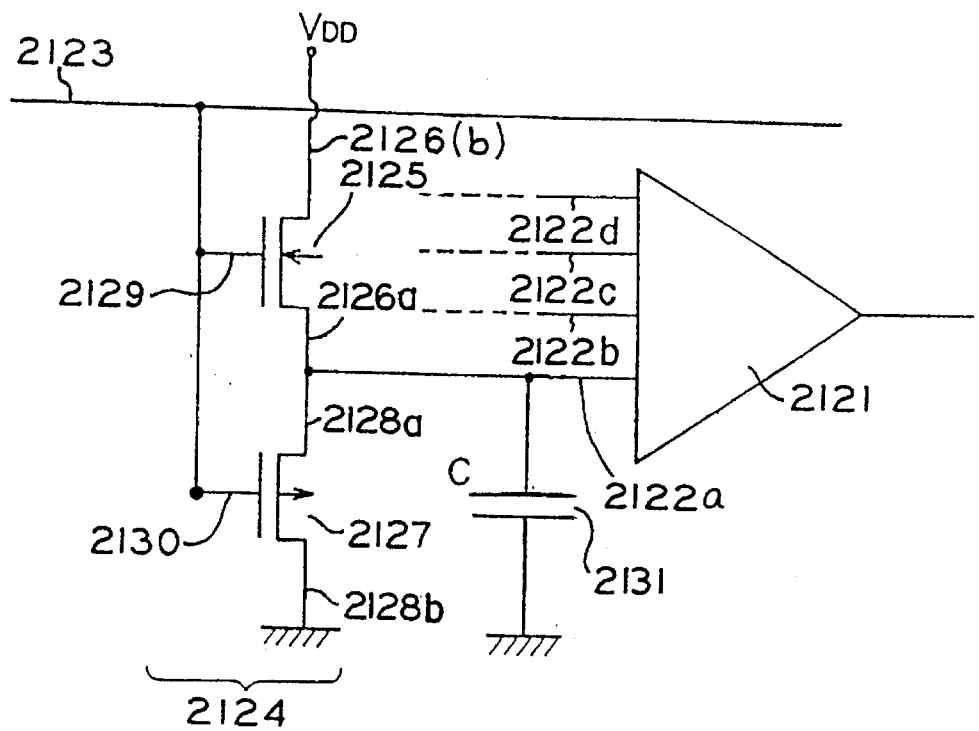
FIG. 21(a) is a circuit diagram representing embodiment 15.
Figure 21B:
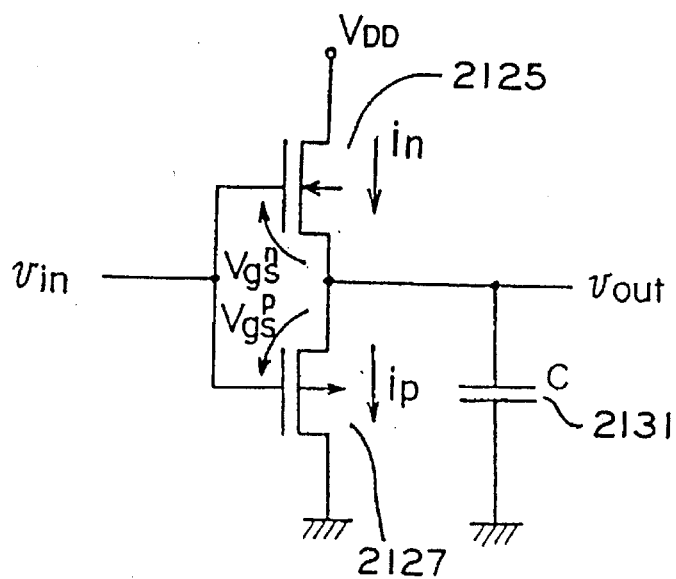
FIG. 21(b) is a circuit diagram of a synapse coupling circuit 104 shown in FIG. 21(a).
Figure 21C:
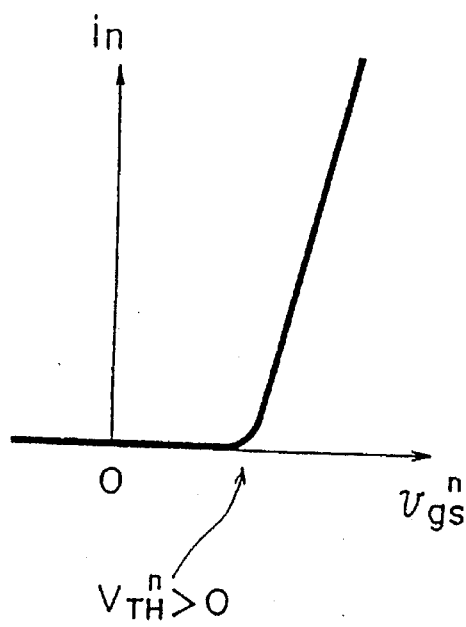
FIGS. 21(c) and 21(d) are graphs showing the relationships between $i_n$, and $V_{gs}^n$, and between $i_p$, and $V_{gs}^p$, respectively.

In order to explain the operation of this circuit, only synapse circuit 2124 is shown in FIG. 21(b). The voltages between the gate and source $V_{gs}^n$, $V_{gs}^p$ and currents in, $i_p$ flowing through NMOS and PMOS are defined as shown in FIG. 21(b), leading to the relationships $i_n - V_{gs}^n$ and $I_p - V_{gs}^p$ shown in FIGS. 21(c) and 21(d), respectively. NMOS is an enhancement type ($V_{TH}^n>0$), and the threshold $V_{TH}^p$ of PMOS is set at nearly 0 V.

Figure 21D:
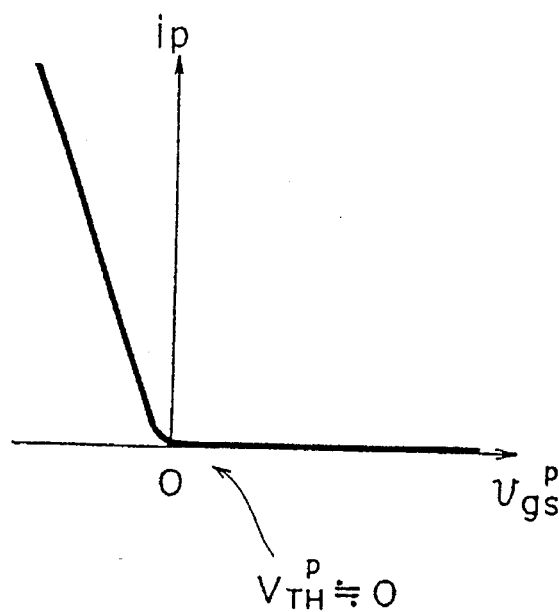
Figure 21E:
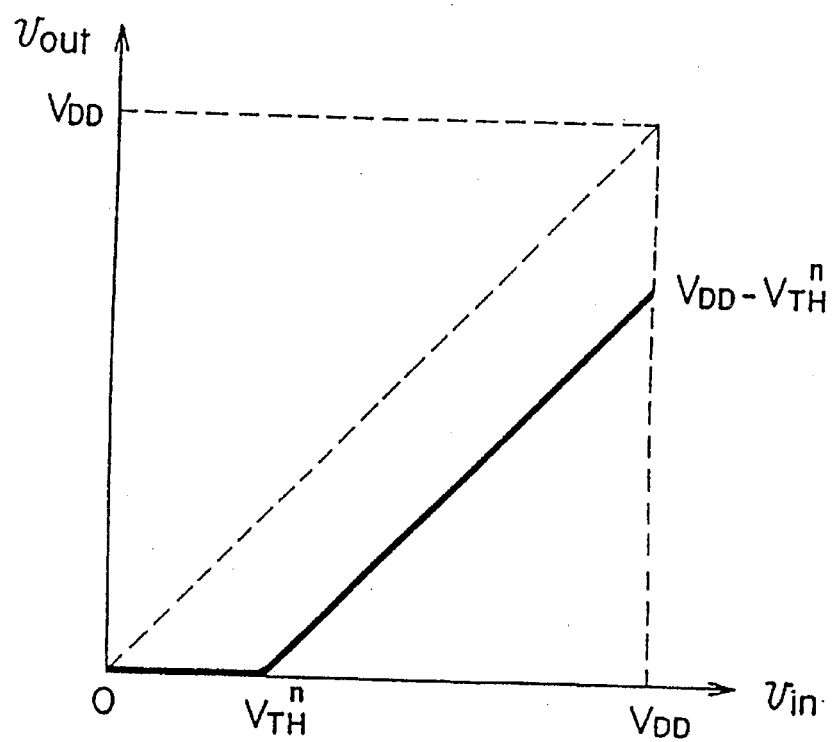
FIG. 21(e) a graph showing $V_{out}$ as a function of $V_{in}$ from 0 V to $V_{DD}$.

When $V_{in}$ in the circuit of FIG. 21(b) is changed from 0 V to $V_{DD}$, $V_{out}$ varies as shown in FIG. 21(e). In the case of $V_{in}=0$ V and $V_{out}>0$, $V_{gs}^p<0$. Then, PMOS transistor 2127 is on and the capacitor C continues to discharge till $V_{out}=0$. In this case, NMOS transistor 2125 is off since $V_{gs}^n=0$.

When $V_{in}$ is gradually increased and $V_{in}>V_{TH}^n$, NMOS transistor turns on and current $i_n$ flows, which charges up the capacitor C and increases $V_{out}$. $V_{out}$ is given by:

$$V_{out}=V_{in}-V_{TH}^n \quad (24)$$

In this case, transistor 2127 is off and no current flows ($i_p=0$) since the positive bias of $V_{gs}^p=V_{TH}^n$ is always applied to the gate of PMOS. Namely, the level of $V_{out}$ can be maintained without any direct current in this synapse circuit. When the neuron at the previous stage is not fired ($V_{in}=0$), the voltage of 0 V ($V_{out}=0$ V) is inputted to the neuron 2121 at the next stage. When the preceding neuron is fired, the voltage determined by Eq. (24) is inputted to the following neuron.

For $V_{in}=V_{DD}$, Eq. (24) is revised as:

$$V_{out}=V_{DD}(1-V_{TH}^n/V_{DD})$$

and the weight used at the synapse is given by;

$$W=(1-V_{TH}^n/V_{DD}) \quad (25)$$

Namely, the weight W can be determined by the threshold $V_{TH}^n$ of NMOS transistor 2125.

Thus, by setting each threshold value of NMOS at appropriate value, a neural network with fixed values of synapse couplings is realized. In order that each NMOS transistor has a different threshold value, the amount of impurity such as B, P of As ion implanted into the channel part should be individually controlled for each NMOS transistor during manufacturing process; for example, the prescribed amount of ion is bombarded on the channel with the aid of the focused ion beam technology (FIB). The neural network thus obtained has no learning function, but can deal with specific problems such as a circulating salesman problem at very high speed.

The neural network of this embodiment has the remarkable feature that only charging and discharging currents flow in the synapse couplings and therefore the power dissipation can be almost disregarded as compared with a synapse coupling of resistance division type of FIG. 33. This network is also characterized in that the synapse is suitable for high integration because of its being constructed with only two transistors and small occupied area on the chip.

In the circuit of FIG. 33, the potential of interconnect 3322 is changed from 0 V to $V_{DD}$ and the capacitor C is charged up through NMOS transistor 3324 and resistor R. On the other hand, the charge up of the capacitor is made through only the NMOS transistor 2125 in this embodiment, indicating that the operation speed can be increased as a result of decrease in effective resistance.

The drain 2126b of NMOS transistor 2125 which is connected to $V_{DD}$ in FIG. 21(a) can be connected to the signal line 2123 as well. In this case, the output of a neuron circuit at the previous stage should have large capacity to supply current, since the signal line 2123 is also required to supply current to charge up the capacitor C. That is, no power supply line to supply $V_{DD}$ to each synapse is necessary, which results in the decrease of the number of interconnects.

(Embodiment 16)

Embodiment 16 of the present invention is shown in FIG. 22. The strength of synapse coupling can be changed by this embodiment and therefore a neural network having learning function can be realized.

Figure 22A:
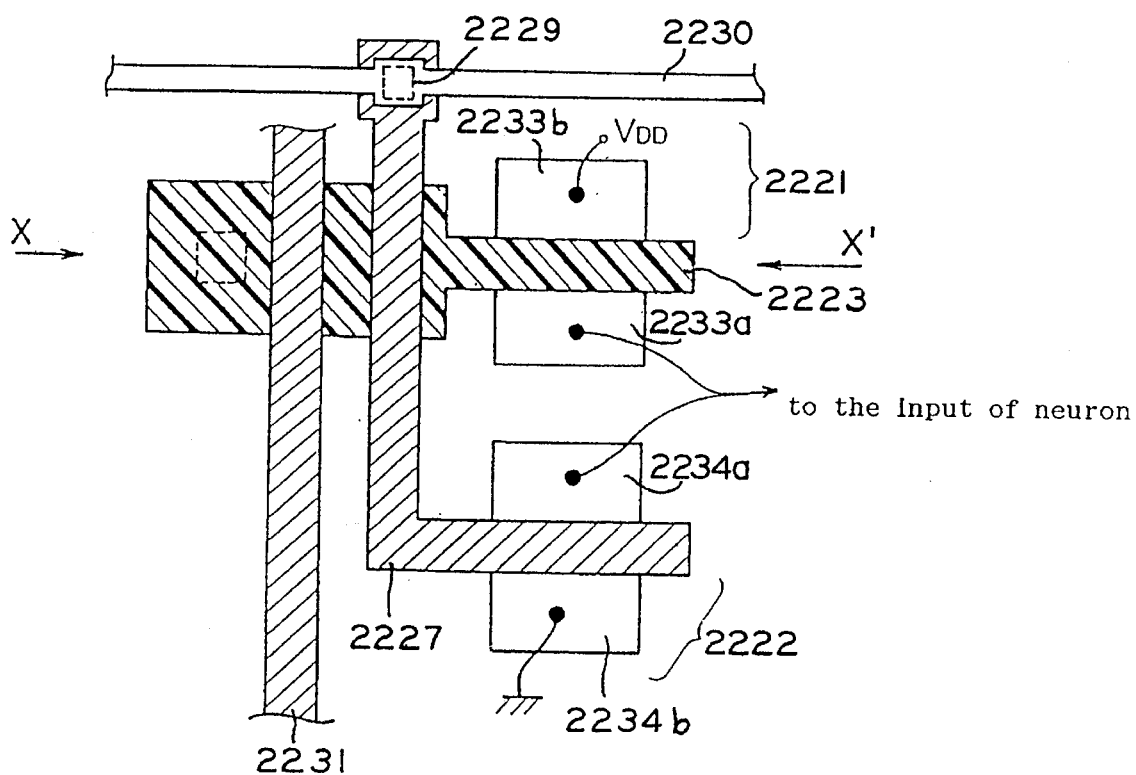
FIG. 22(a) shows a schematic diagram of embodiment 16.
Figure 22B:
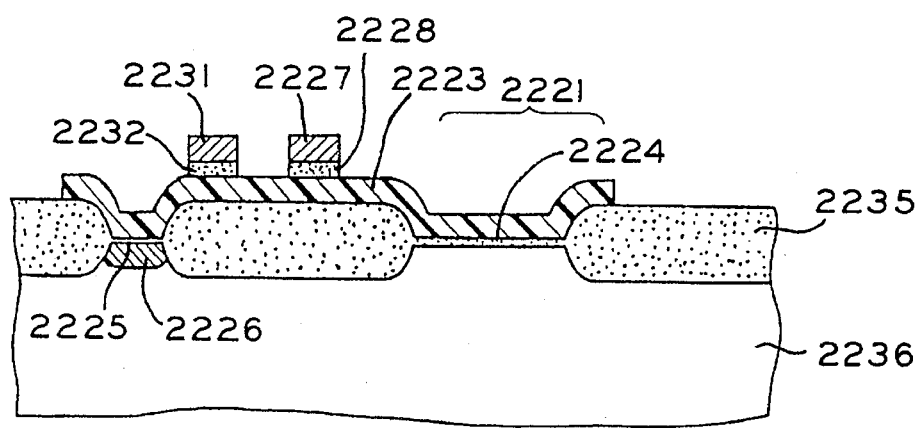
FIG. 22(b) is a cross-sectional view along X–X' line of FIG. 22(a).

FIG. 22(a) is a schematic plan view and FIG. 22(b) is a cross-sectional view along X–X' line of FIG. 22(a). 2221, 2222 denote NMOS (a first MOS type transistor) and PMOS (a second MOS type transistor) transistors, respectively. 2223 denotes a floating gate made of e.g. $N^+$-type polysilicon film and formed on the channel region of NMOS through a gate insulating film 2224 of e.g. 200 Å thick. The floating gate 2223 is opposed to $N^+$ region 2226 which acts as a charge injection electrode, holding $SiO_2$ film 2225 of e.g. 50–70 Å thick between. 2227 is the gate electrode of PMOS transistor and capacitively coupled with the floating gate of NMOS transistor through e.g. a 200 Å thick $SiO_2$ film 2228 and also acts as a gate electrode of NMOS transistor 2221. The electrode 2227 is made of e.g. $N^+$-type polysilicon and connected to interconnect 2230 made of e.g. Al through contact-hole 2229. The Al interconnect is connected to the output of neuron circuit shown in e.g. FIG. 31 or 32.

2231 is an electrode (a third gate electrode) made of e.g. $WSi_2$ and capacitively coupled with floating gate 2223 through $SiO_2$ film 2232 (a third insulating film) of 200 Å thick. 2233a, 2234a are sources of NMOS and PMOS, respectively, and connected to one of the input terminals of the neuron at the next stage. 2233b, 2234b are the drains of NMOS and PMOS, respectively, and connected to a power supply line $V_{DD}$ and a ground line ($V_{SS}$), respectively.

Figure 22C:
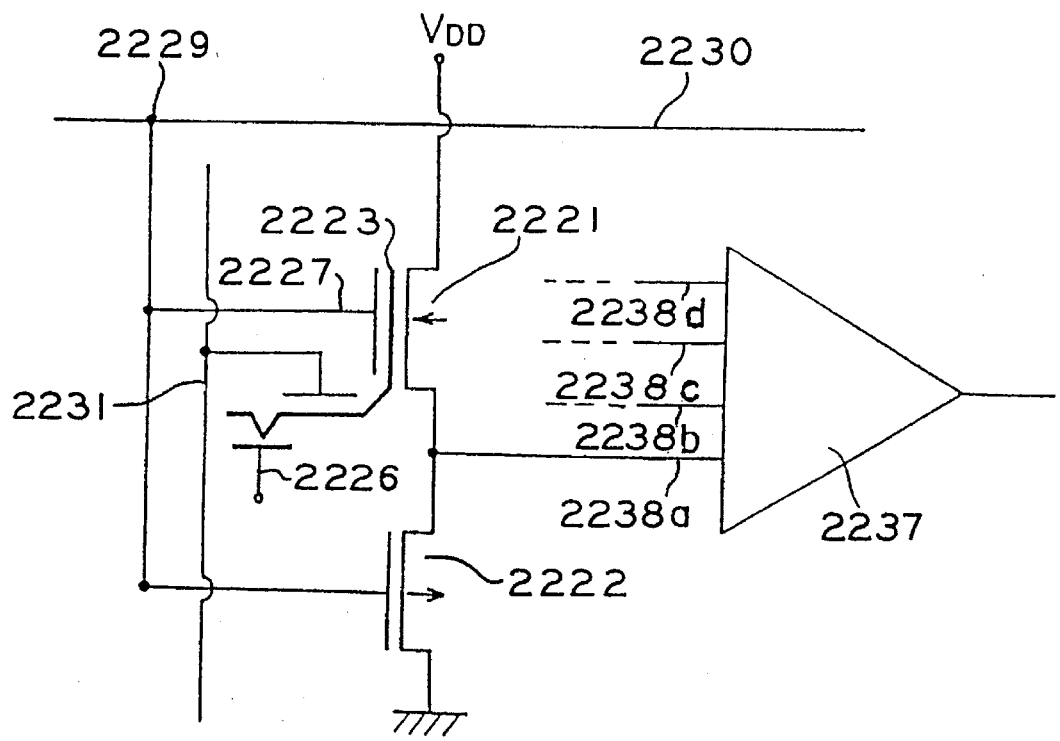
FIG. 22(c) is a schematic diagram of the semiconductor device having synapses and a neuron where the neuron is expressed by the symbol.

In FIG. 22(a), $V_{DD}$, $V_{SS}$ and the interconnects to the neuron at the next stage are omitted to avoid undesirable complexity. In FIG. 22(b), 2235, 2236 denote a field oxide film and e.g. a P-type silicon substrate, respectively. FIG. 22(c) represents a semiconductor device having a synapse and a neuron by using symbol. In these figures, the same parts are indicated by the same numbers. 2237 and 2238a–2238d denote a neuron circuit and its input terminals, corresponding to 2121 and 2122a–2122d in FIG. 21, respectively.

As is clear from the comparison between FIGS. 22(c) and 21(a), a synapse coupling is constructed by connecting NMOS and PMOS in series in this embodiment as well as the embodiment 15 except that NMOS has floating gate 2223. During the regular operation where the potential of electrodes 2231, 2226, is set at 0 V, NMOS transistor 2221 operates in the same manner as described in the embodiment 15; that is, NMOS transistor acts as an enhancement type transistor which turns on when the voltage higher than $V_{TH}^n$ is applied to gate electrode 2227 When the potential of signal line 2230 becomes $V_{DD}$ and 0 V, $V_{DD}-V_{TH}^n$ and 0 V are inputted to 2238, respectively.

Figure 22D:
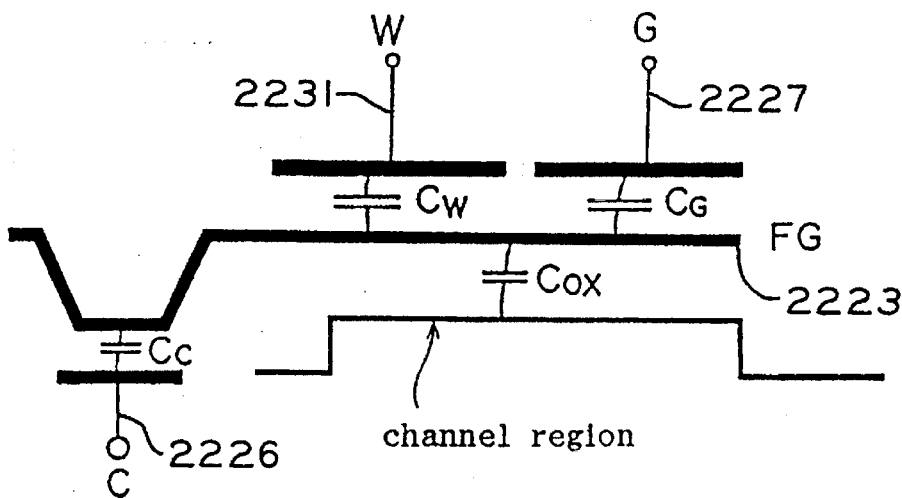
FIG. 22(d) is a circuit diagram showing principal part of the synapse; i.e. NMOS having a floating gate.

In order to explain in detail the performance of NMOS transistor having a floating gate, the corresponding part is taken and shown in FIG. 22(d) using symbol. The same numbers show the same parts in FIGS. 22(a)–22(d). 2227, 2231, 2226 and 2223 are a gate electrode (hereinafter abbreviated as G), a control gate to control the synapse strength (W), a charge injection electrode (C) and a floating gate (FG), respectively.

The potential Z of floating gate FG is given by $$Z=(C_G V_G + C_w V_w + C_c V_c + Q_F)/(C_{ox}+C_c+C_w+C_G) \quad (26)$$

Here, $Q_F$ is the amount of charges in the floating gate. $V_G$, $V_w$ and $V_c$ are the potential of electrodes G, W and C, respectively. $C_{ox}$, $C_c$, $C_w$ and $C_G$ are capacitive coupling coefficients between respective electrode and FG as defined in FIG. 22 (d). The potential of the P-type silicon substrate is set to be 0 V.

As mentioned above, for $V_w=0$ and $V_c=0$, Eq. (26) is reduced to $$Z=(C_G V_G + Q_F)/C_{TOT} \quad (27)$$

$$C_{TOT}=C_{ox}+C_c+C_w+C_G$$

The threshold voltage of NMOS transistor seen from FG, (i.e. the minimum value of FG potential which can cause NMOS to form channel) is defined as $V_{TH^*}$. The NMOS turns on if $$(C_G V_G + Q_F)/C_{TOT} > V_{TH^*}$$

or $$V_G > (C_{TOT}/C_G)V_{TH^*} - Q_F/C_G.$$

In other words, the threshold voltage $V_{TH}^n$ seen from gate electrode 207 is given by:

$$V_{TH}^n = (C_{TOT}/C_G)V_{TH^*} - Q_F/C_G \quad (28)$$

$C_{TOT}$, $C_G$, and $V_{TH^*}$ cannot be changed after the device is constructed because those values are determined by device structure and manufacturing process. However, $V_{TH}^n$ can be changed by modifying the value of $Q_F$ and therefor the weight of synapse coupling is changed according to Eq. 25.

Although both $V_w$ and $V_c$ have been assumed to be 0 V under regular operation, other choice of these values are also possible. In this case, Eq. 28 is revised as $$V_{TH}^n = (C_{TOT}/C_G)V_{TH^*} - Q_F/C_G - (C_w/C_G)V_w - (C_c/C_G)V_c \quad (29)$$

where only the terms proportional to $V_w$ and $W_G$ are added. Thus, $V_{TH}^n$ is determined by only $Q_F$ as far as $V_w$ and $V_c$ are kept constant.

The value of $Q_F$ can be changed in the following manner as an example. $V_{pp}$ is defined as a program voltage which is higher than $V_{DD}$. For example, $V_{DD}$ is set at 5 V, and $V_{pp}$ at 10 V. Here, $C_2=C_G=(C_{ox}/2)>>C_c$ is assumed for simplicity, which is easily achieved by the layout shown in FIG. 22(a). In the case of $V_c=0$ and $V_w=V_G=V_{pp}$, $Z=(V_{pp}/2)=5$ V is obtained from Eq. 26 under the assumption of $Q_F=0$.

When the thickness of oxide film 2225 is designated to be 50 Å, the electric field of 10 MV/cm is applied to the oxide film. Then Fowler-Nordheim tunneling current flows and electrons are injected into the FG from C, resulting in $Q_F<0$.

Z becomes smaller as $Q_F$ becomes negative as is apparent from Eq. 26, and therefore the tunneling current decreases and finally is cut off when a certain number of electrons are injected. In order to correctly control the charge injection, the value of $V_w$ and $V_G$ can be changed by using pulse. The absolute value of $Q_F$, is controlled by, for example, changing the number of pulses of constant width and height.

The electron injection is also made by changing the pulse of Vc. For example, after having set $V_w$, $V_G$ and $V_c$ at $V_{pp}$, only $V_c$ is decreased to 0 V by using pulses. The electron is injected and the amount of electron to be injected is controlled as well. The above-mentioned explanation refers to the case of $Q_F$ becoming negative where $V_{TH}^n$ becomes larger according to Eqs. 28 and 29, namely, corresponding to the operation to weaken the strength of synapse coupling.

Next, the operation to strengthen the synapse coupling is described. For this purpose, $V_w$ and $V_G$ are set at 0 and the $V_c$ is set to $V_{pp}$. Z becomes 0 V according to Eq. 26 and the election field of 10 MV/cm in the opposite direction this time is generated in the oxide film to cause electron emission from FG to C by Fowler-Nordheim tunneling injection. As a result, positive charges remain in FG and $Q_F$ becomes positive ($Q_F>0$).

Eqs. 28 and 29 show that the value of $V_{TH}^n$ becomes larger and Eq. 25 shows that the value of W becomes larger. The conditioncorresponds to the operation to increase the synapse coupling strength. In order to increase the synapse coupling strength, it is also possible to increase only $V_c$ to $V_{pp}$ by using pulses, while $V_w=V_G=V_c=0$ V holds. It is needless to say that the absolute value of $Q_F$, can be freely controlled by the pulse width, pulse height or pulse number.

Another essence of this method is to selectively change the strength of any synapse coupling. Four principal parts of synapses 2272, 2273, 2274, 2275, which are parts of NMOS having a floating gate, are arranged in matrix in FIG. 22(e). $G_1$ and $G_2$, corresponding to signal line 2230, are installed in parallel with each other. $W_1$ and $W_2$, corresponding to a signal line 2231 are also installed in parallel. When one synapse 2272 is to be weakened, the potential of $V_{pp}$ is applied to $G_1$ and $W_1$, and 0 V to $G_2$ and $W_2$. Here, $V_c$ is set at 0 V. As explained in FIG. 22(d), electrons are injected into the floating gate at 2272 and the coupling strength becomes small. At synapse 2274 $V_w=V_G=0$ and therefore Z=0 V, which causes no electron tunneling, and no change in the value of weight W. At synapse 2273, 2274, $V_w=V_{pp}$, $V_2=0$ or $V_G=0$, $V_w=V_{pp}$. Then, $Z=(\frac{1}{4})V_{pp}=2.5$ V, which indicates that the electric field applied to oxide film 2225 is 5 MV/cm, and half of that of synapse 2272. Since the tunneling current changes exponentially with electric field strength, no tunneling current flows and therefore no change of $Q_F$ is observed at these synapses.

In other words, only the synapse located at the intersection of two lines, both of which are in high potential level $V_{pp}$, can have its coupling strength weakened. Thus, the coupling strength of the specific synapse can selectively be changed. In order to selectively increase the coupling strength, first $V_c=V_{pp}$, and then $G_1$, $G_2$, $W_2$ and $W_2$ are all set to be $V_{pp}$. The coupling strength of synapse 2274 at the intersection is increased by reducing $G_2$ and $W_2$ to 0 V. Although the explanation has been done for the case of four synapses, it is apparent that the same selective change of coupling strength can be carried out for the case with more synapses in matrix arrangement.

Figure 22E:
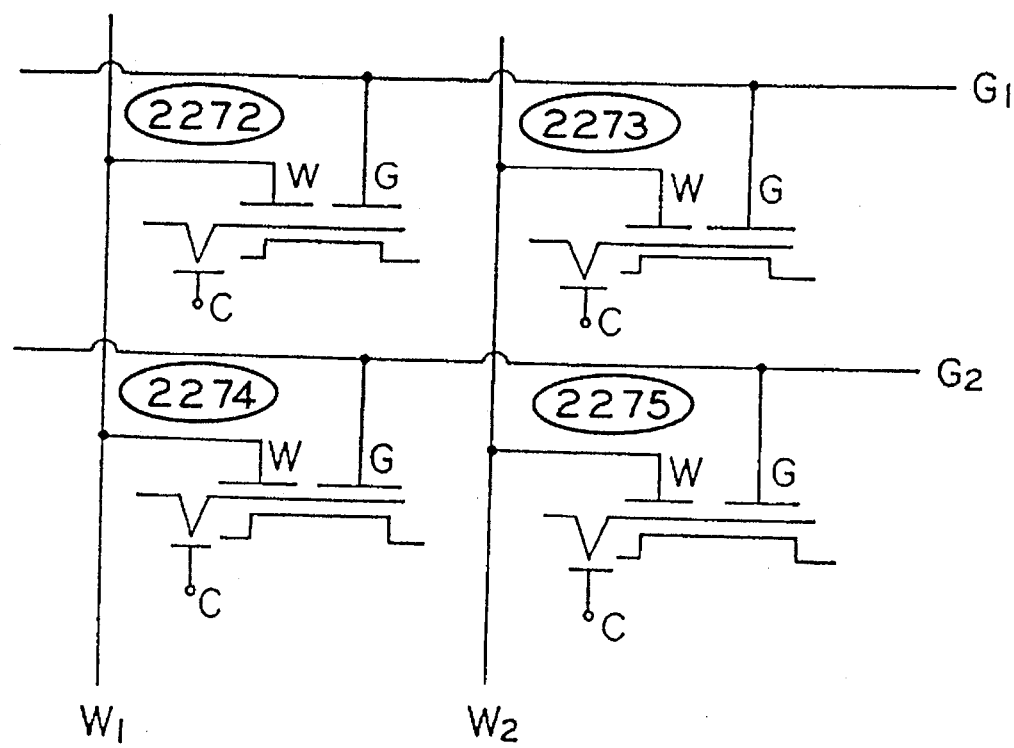
FIG. 22(e) is a circuit diagram where the synapse couplings shown in FIG. 22(d) are arranged in matrix configuration.

In FIG. 22(e), only NMOS transistor are depicted for simple explanation. In practice, PMOS and relating interconnects shown on FIGS. 22(a)–22(c) are attached to each NMOS transistor.

The connection with neuron circuit 2237 is explained in detail in embodiment 18.

In the neural network of this embodiment, single synapse coupling is constructed with one NMOS transistor and one PMOS transistor, and therefore the occupied area of synapse coupling is very small, which makes it possible to integrate synapse couplings in very high density. Furthermore, since the coupling strength can be determined by the charges stored in the floating gate, the coupling strength can be freely changed and also stored. That is, nearly the same function as biological synapse is realized with only two elements. In the case of a large number of synapse couplings arranged in matrix configuration, any synapse can be chosen and modified to have any value of strength. In addition, no direct current needs to flow to keep the output of synapse at constant value and therefore the power dissipation can be restricted to be very little, which is an ideal feature to construct ultra high integration neural network.

In the synapse coupling configuration shown in FIGS. 33 and 34, due to a large amount of power dissipation and the necessity of a large number of elements to memorize the value of coupling strength, it is almost impossible to have high integration density of synapse couplings, while the highly integrated neural network is for the first time realized by the present invention.

In embodiment 16, $N^+$-type polysilicon is used as a material for electrodes 2223, 2227, $WSi_2$ for 2231 and Al for 2230. The other materials can also be used as far as they can attain the similar functions. The materials and thickness of insulating films 2224, 2225, 2228, 2232 are not restricted to those of this embodiment. Furthermore charge injection electrode 2226 which is installed independently in this embodiment can also be formed in the extended part of the source electrode 2233a or drain electrode 2233b. This configuration is preferable since the interconnect to apply the potential to electrode can be omitted. And polysilicon electrode can also be substituted for $N^+$ layer.

The selective modification of coupling strength is carried out by means of combination of voltages applied to two electrodes 2231 (W), 2227(G) in the embodiment 16. 2231(W) is the electrode for exclusive use, while 2227(G) acts also as the gate electrode of NMOS 2223. Therefore, it is possible that another electrode exclusively used to modify the coupling strength is additionally formed in FIG. 22(d) and the amount of charge to be injected to FG is controlled by voltages applied to two electrodes.

As a method for injecting charge, avalanche injection or hot electron injection is also used instead of Fowler-Nordheim tunneling injection.

Figure 22F:
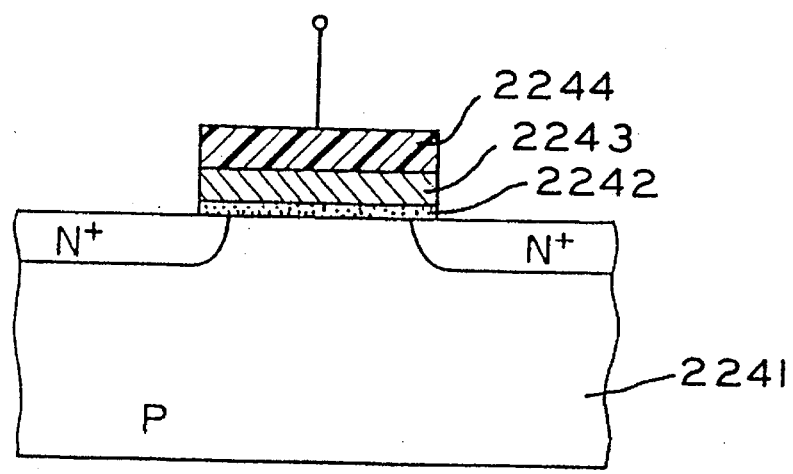
FIG. 22(f) shows a cross-sectional view of a nonvolatile memory element with ferroelectric film.

Although a floating gate type MOS transistor is used to make the threshold of NMOS transistor variable in the embodiment 16, MNOS type device or non-volatile memory element with a ferroelectric film whose cross-sectional view is shown in FIG. 22(f) can be substituted. In FIG. 22(f), 2241 denotes a P-type Si substrate, 2242 a $SiO_2$ film of e.g. 50 Å thick, 2243, a ferroelectric film such as 3000 Å thick PZT (Pb $(Zr_xTi_{1-x})O_2)$, 2244, an electrode made of e.g. Ti, and 2240a, 2240b, $N^+$-type source and drain. Positive or negative pulse is applied to polarize the ferroelectric film and the threshold is controlled by the magnitude of polarization.

As mentioned above, any method is adopted to make the threshold of NMOS transistor variable. In the case of the configuration shown in FIG. 22, it has already been mentioned that the threshold of $V_{TH}^n$ can be controlled by the charge in the floating gate. It is apparent from Eq. 29 that the threshold can also be controlled by setting $V_w$ and $V_c$ at appropriate values; that is, the synapse coupling is modified by controlling the potential of $V_w$ and $V_c$.

In FIG. 21 (a) (embodiment 15) and FIGS. 22(a) and 22(c) (embodiment 16), PMOS transistor 2127, 2222 is inserted between NMOS 2125 and 2221 and the ground ($V_{SS}$) line. The performance of PMOS transistor is explained below by referring to FIG. 21(b).

In the case $V_{in}=V_{DD}$, $V_{out}=V_{DD}-V_{TH}^n$ and the charge of $C(V_{DD}-V_{TH}^n)$ is stored in the capacitor C. Then, if $V_{in}$ changes to 0 V, the PMOS transistor lets the charges in the capacitor escape to the ground. Therefore, the PMOS transistor must be off when $V_{in}=V_{DD}$ and on when $V_{in}=0$ V.

Figure 23A:
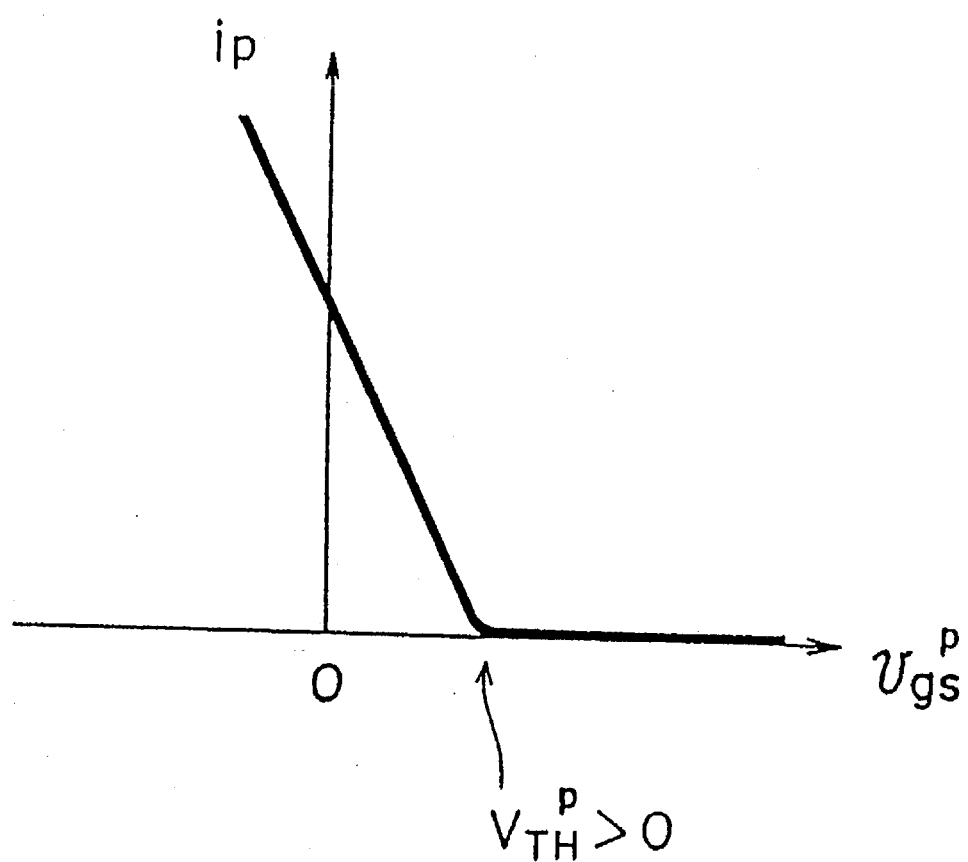
FIG. 23(a) is a graph showing the characteristic of depletion type PMOSFET.

To shorten discharging time, the PMOS transistor should be designed so as to have a large current capacity. For this purpose, a depletion type PMOSFET whose characteristic is shown in e.g. FIG. 23(a) is used. The voltage applied to the gate of PMOS at the moment when $V_{in}$ changes from $V_{DD}$ to 0 V is expressed by:

$$V_{gs}^P = -(V_{DD}-V_{TH}^n)<0.$$

Therefore, it is apparent from the comparison of FIGS. 23(a) and 21(d) that more current flows in the transistor with $V_{TH}^P>0$ than the transistor with $V_{TH}^P$32 0.

Figure 23B:
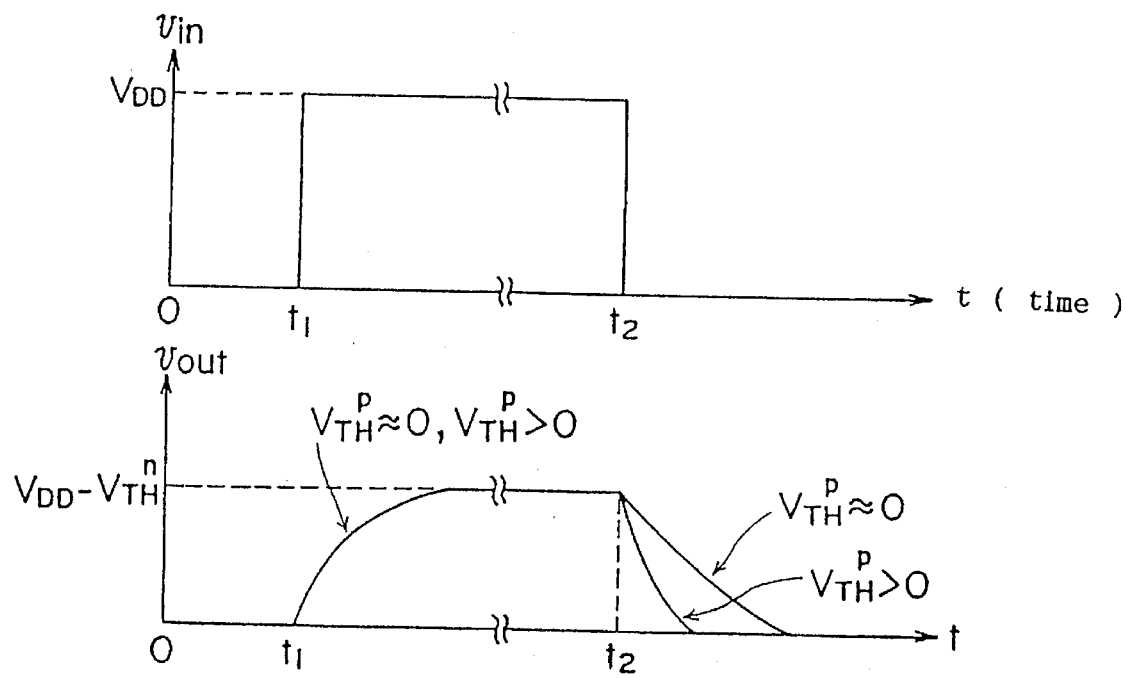
FIGS. 23(b) and 23(c) are graphs showing the time-response characteristics of the circuit shown in FIG. 21(b).

FIG. 23(b) shows time response characteristics of the circuit shown in FIG. 21(b). The fall time is shortened by using a depletion type PMOS transistor although the rising characteristic is not improved because the rise time is determined by the ON characteristic of NMOS transistor 2125. The larger value of $V_{TH}^P$ makes the fall time shorter.

On the other hand, when $V_{in}$ changes from 0 to $V_{DD}$, NMOS transistors 2125, 2221 turn on under the condition of $V_{in} \geq V_{TH}^n$. Unless PMOS transistors 2127, 2222 are off, direct current flows from $V_{DD}$ to $V_{ss}$ (ground) and power dissipation becomes large. In order to prevent the direct current from flowing, the threshold of depletion type PMOS must be designated as:

$$0<V_{TH}^P<V_{TH}^n \quad (30)$$

To make discharging time of capacitor C as short as possible and achieve the high speed operation of the circuit, the following condition should hold besides $V_{TH}^P<V_{TH}^n$, $$V_{TH}^P = V_{TH}^n \quad (31)$$

Figure 23C:
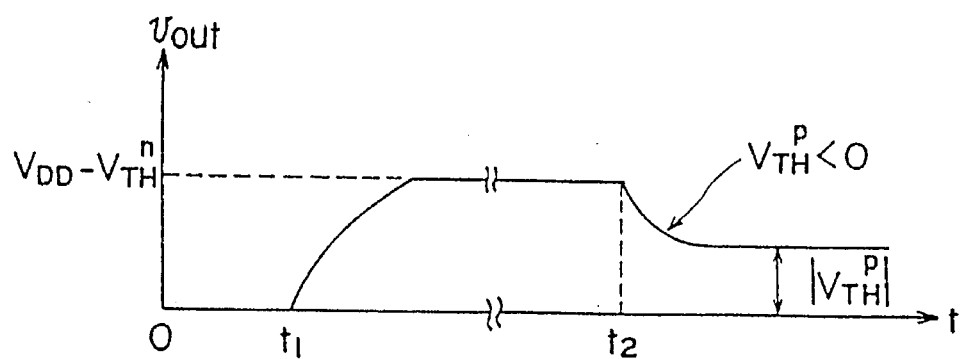

For PMOS transistors 2127, 2222 an enhancement type PMOSFET with $V_{TH}^P<0$ can also be used. In this case, the time response characteristic of the circuit in FIG. 21(b) is shown in FIG. 23(c). The circuit has the same rising characteristic as that in FIG. 23(b), but there is quite a few differences in the falling characteristic. Namely, the output voltage stops changing at the point of $V_{out}=|V_{TH}^P|$ and is maintained because the PMOS transistor turns off at the point. This voltage level actually decreases to 0 V after a long time since the charges in the capacity C escape through the leakage of PN junction or the subthreshold current of P-channel MOS transistor.

Such synapse couplings can memorize the activated state for awhile. Once the signal is inputted from a fired neuron (i.e. $V_{in}=V_{DD}$), the voltage of $V_{out}$, equal to $|V_{TH}^P|$ is held even after the output of the neuron falls in the low level. The holding time is controlled by e.g. connecting resistor R to PMOS transistor 2127, 2222 in parallel and the output voltage gradually approaches to 0 V on the basis of time constant of RC. The level of output voltage is controlled by $V_{TH}^P$.

Figure 23D:
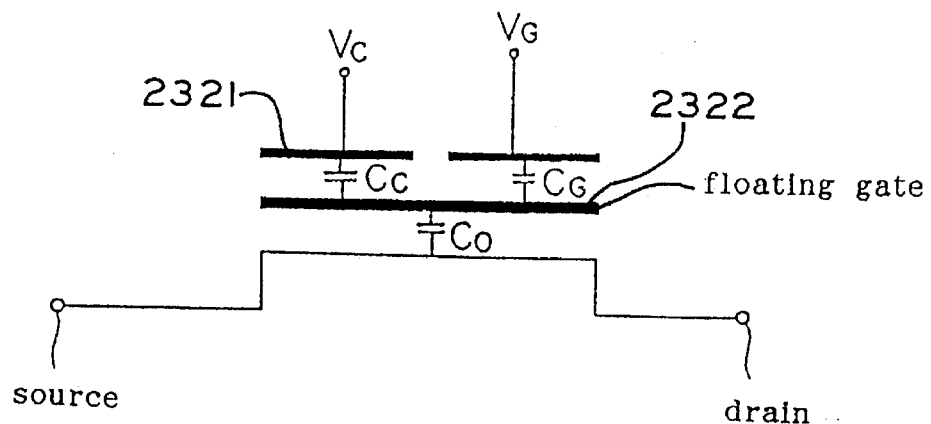
FIG. 23(d) shows another example of this invention.

Synapse coupling having a variety of characteristics can be realized by changing $V_{TH}^P$ of PMOS transistor 2127, 2222. The value of $V_{TH}^P$ can be set at an appropriate value by channel ion implantation during the manufacturing process. The threshold can also be variable by adopting a floating gate type transistor structure and modifying charges in the floating gate, or by adopting the structure shown in FIG. 23(d) and modifying the value of $V_c$ or $C_G$. $V_{TH}^P$ is given by:

$$V_{TH}^P = (C_{TOT}/C_g)V_{th^*} - (Q_F/C_G)V_C \quad (32)$$

The value of $C_c$ can be changed with the overlapping area between electrode 2321 and floating gate 2322. If the overlapping area is appropriately designed at the stage of pattern layout, the manufacturing process becomes simple because ion implantation repeatedly carried out with various ion dose for each channel can be omitted. Furthermore, $V_{TH}^P$ can be changed by the value of $V_c$ and therefore only specific synapse can be maintained at activated state for a limited time.

Figures 23E, 23F, 23G:
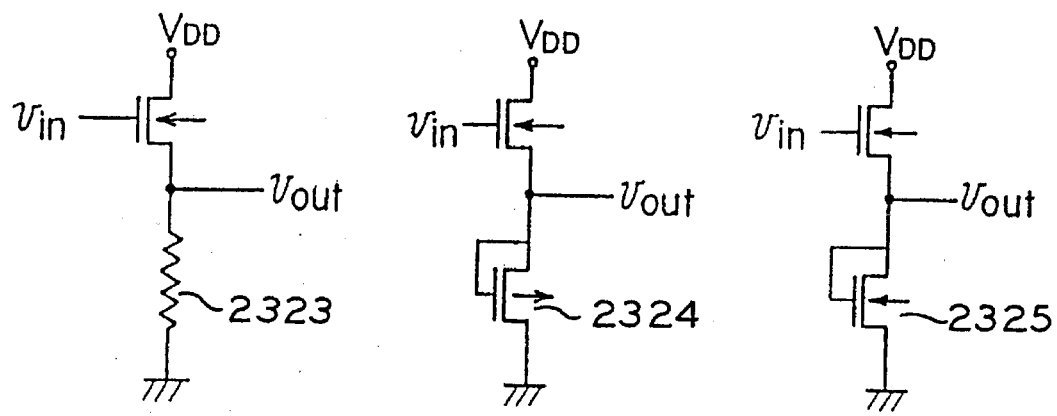
FIGS. 23(e)–23(g) show other examples of circuits.

So far the PMOS transistor which shares the common gate electrode with NMOS transistor has been used as an element to discharge the charges in capacitor C. But the feature of the present invention can be available when other types of load elements shown in FIGS. 23(e), 23(f) and 23(g) are used. In these figures, only the part corresponding to FIG. 21(b) is shown. Namely, a resistor 2323, a depletion type PMOS 2324 with the gate connected to the source, or an enhancement type NMOS 2325 with the gate connected to the drain are used in these figures in place of PMOS transistor. Furthermore, other load elements such as an enhancement type PMOS in which the gate is connected to the drain, a depletion type NMOS in which the gate is connected to source, or an MOS transistor in which a certain voltage is applied to the gate can be used. Although the feature of low power dissipation is lost in these cases since direct current flows to hold the level of $V_{out}$ the power dissipation can be reduced by using a load with large effective resistance. These circuits are combined with e.g. variable threshold NMOS transistor 2221 and used in the same manner as shown in the embodiment 16, which can provide a synapse with variable coupling strength and memory function. This feature can never be realized by the embodiment shown in FIGS. 34(a) and 34(b).

(Embodiment 17)

Embodiment 17 of this invention is described by referring to FIG. 24. The symbols of FIG. 24 have the same meanings as in FIGS. 22(a)–22(d).

2421, 2422 are respectively NMOS and PMOS transistors, and have common floating electrode (FG) 2423. 2424 is a gate electrode capacitively coupled with FG through an insulating film such as $SiO_2$ film, and acts as a common gate electrode (G) of NMOS 2421 and PMOS 2422. 2425 and 2426 are control gates (W) for adjusting synapse coupling and a charge injection electrode (C), similar to 2231 and 2226 in FIG. 22(c), respectively. The other structure is the same as that of the sixteenth embodiment; 2427 denotes a signal line which transfers the output signal of a neuron at the previous stage and 2428 denotes an interconnect to send the output of synapse to one of the input terminals of neuron 2429 at the next stage.

Figure 24A:
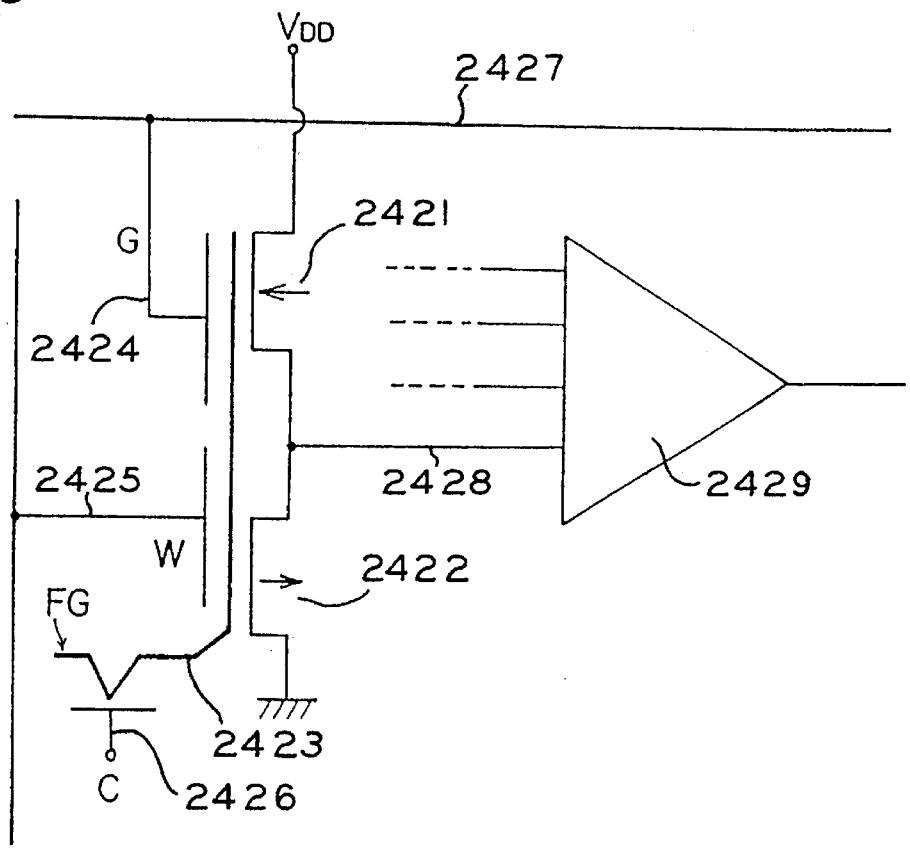
FIG. 24(a) is a circuit diagram explaining embodiment 17.
Figure 24B:
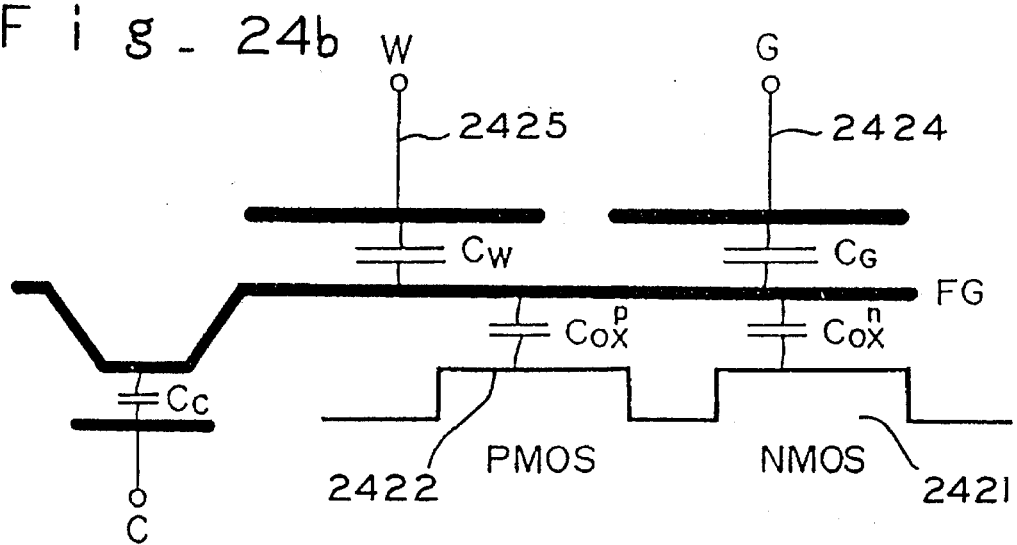
FIG. 24(b) is a schematic diagram of the synapse coupling shown in FIG. 24(a).

In order to explain the operation of this embodiment, the synapse coupling portion is extracted from FIG. 24(a) and shown in FIG. 24(b). The voltage applied to electrodes G, W, and C are $V_G$, $V_W$ and $V_C$, respectively, and the potential of silicon substrate is 0 V, which yields the potential Z of FG as:

$$Z=(C_G V_G + C_W V_W + C_C V_C + Q_F)/C_{TOT} \quad (33)$$

$$C_{TOT} = C_{ox}^n + C_{ox}^p C_G + C_W + C_C$$

The threshold values at which an inversion layer is formed, as seen from NMOS and PMOS are denoted by $V_{TH}^n$ and $V_{TH}^{p*}$, respectively. Then the threshold values $V_{TH}^n$, $V_{TH}^p$ seen from common gate electrode G of NMOS and PMOS are given by:

$$V_{TH}^n = (C_{TOT}/C_G)V_{TH}^{n*} - (Q_F/C_G) - (C_W/C_G)V_W - (C_C/C_G)V_C \quad (34)$$

$$V_{TH}^p = (C_{TOT}/C_G)V_{TH}^{p*} - (Q_F/C_G) - (C_W/C_G)V_W - (C_C/C_G)V_C \quad (35)$$

Certain constant potential is applied to $V_W$ and $V_C$ except while synapse coupling strength is being changed. For example, in the case of $V_W = V_C = 0$, Eqs. 34 and 35 are revised to Eqs. 36 and 37.

$$V_{TH}^n = (C_{TOT}/C_G)V_{TH}^{n*} - (Q_F/C_G) \quad (36)$$

$$V_{TH}^p = (C_{TOT}/C_G)V_{TH}^{p*} - (Q_F/C_G) \quad (37)$$

Both $V_{TH}^n$ and $V_{TH}^p$ can be changed by $Q_F$ and therefore the synapse coupling strength can be changed according to Eq. 25.

From Eqs. 34 and 35, $$V_{TH}^n - V_{TH}^p = ((C_{TOT}/C_G)V_{TH}^{n*} - V_{TH}^{p*}) \quad (38)$$

where $C_{TOT}$, $C_G$, $V_{TH}^{n*}$ and $V_{TH}^{p*}$ are determined by manufacturing process and therefore cannot be changed after the element is fabricated. In other words, $V_{TH}^n - V_{TH}^p$ is always constant and does not change even if the synapse coupling strength is changed.

This fact has a very important meaning as follows. It was described in the embodiment 16 using FIG. 23(a) and 23(b) that both using a depletion type PMOS transistor ($V_{TH}^p > 0$) and increasing $V_{TH}^p$ as large as possible are effective in improving the falling characteristic of synapse.

In order to prevent large power dissipation due to the flow of direct current, the condition expressed by Eq. 30 is required.

$$V_{TH}^p > V_{TH}^n \quad (30)$$

In embodiment 16, only the threshold of NMOS transistor 2221 is variable. Namely, $V_{TH}^n$ changes while $V_{TH}^p$ is kept constant. The condition of Eq. 30 restricts the margin of $V_{TH}^p$. For example, when the value of $V_{TH}^n$ is changed from 0 V to $V_{DD}$ (corresponds to the change of W from 1 to 0 in Eq. 25), $V_{TH}^p$ 0 is inevitable to attain the condition of Eq. 30.

On the other hand, it is apparent from Eqs. 16 and 17 that $V_{TH}^n$ and $V_{TH}^p$ change together with each other and the difference is always kept constant, indicating that Eq. 30 always holds. Namely, by setting $V_{TH}^p$ and $V_{TH}^n$ as $V_{TH}^p = V_{TH}^n$ and $V_{TH}^p < V_{TH}^n$ in the manufacturing process, it becomes possible to realize the optimum condition where lower power dissipation and shorter fall time can be achieved.

Embodiment 17 is similar to the embodiment 16 except that NMOS and PMOS share the floating gate in this embodiment. Therefore, the synapse coupling strength can be changed in the same manner.

(Embodiment 18)

Embodiment 18 is explained using FIG. 25. FIG. 25(a) represents a layout of principal part of neural network which is composed of one synapse coupling and one neuron 2522.

This circuit is constructed by CMOS process using bilayer polysilicon and bilayer Al interconnect technology. The materials used in FIG. 25 (a) are shown in FIG. 25 (b). Al interconnects running in the X direction are the interconnects of the first layer and those in the Y direction are the interconnects of the second layer. As for $V_{DD}$, $V_{ss}$ and $V_c$, Al interconnects are omitted in order to easily understand the layout. The potential is applied through, for example, the Al interconnects of the first layer.

Figure 25A:
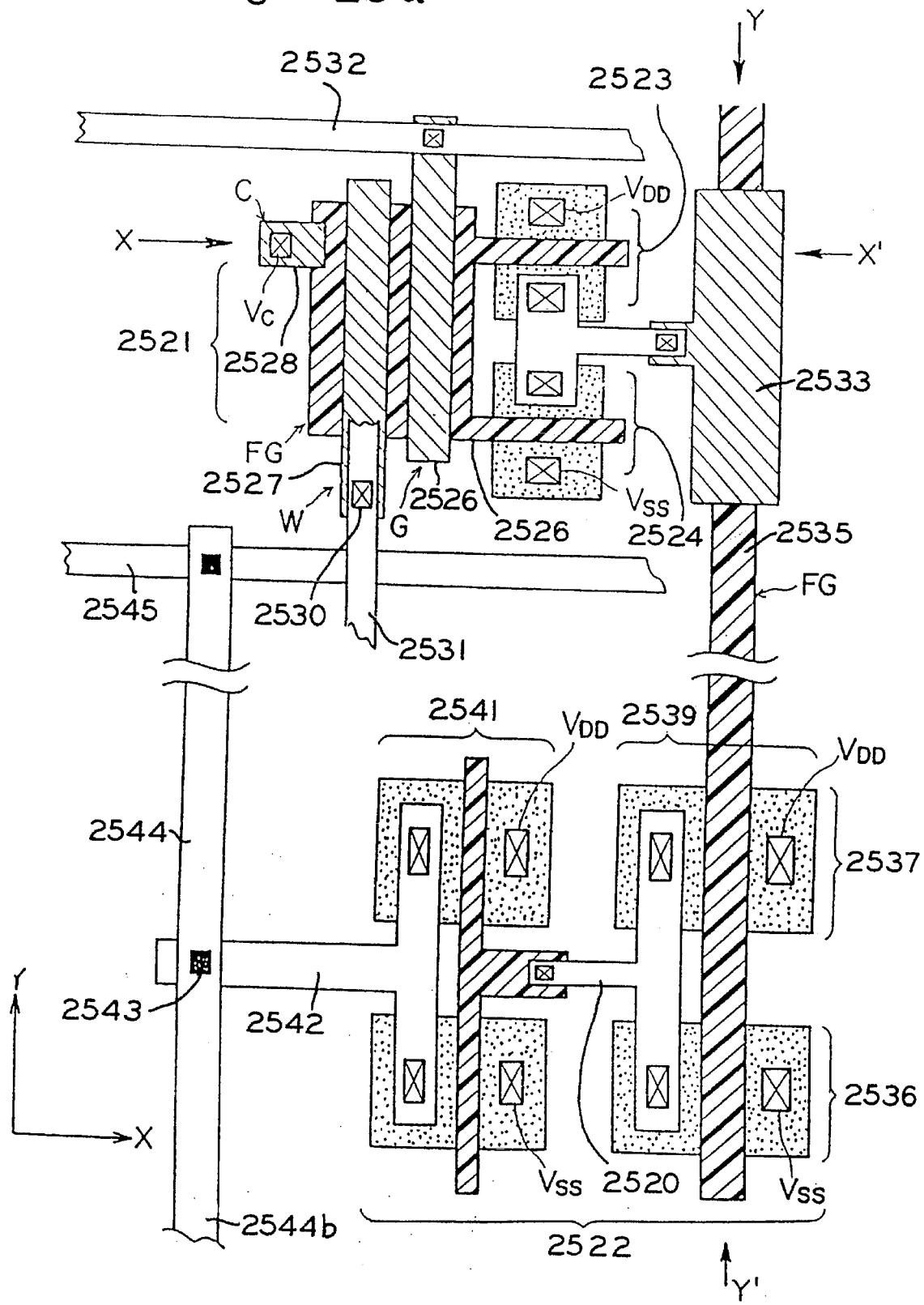
FIG. 25(a) shows an example of layout of neural network which consists of single synapse coupling and single neuron 2522.
Figure 25B:
FIG. 25(b) explains materials used in FIG. 25(a).
Figure 25B:
Figure 25B:
Figure 25B:
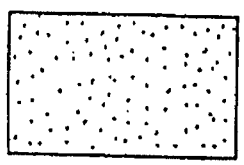
Figure 25B:
Figure 25B:
Figure 25C:
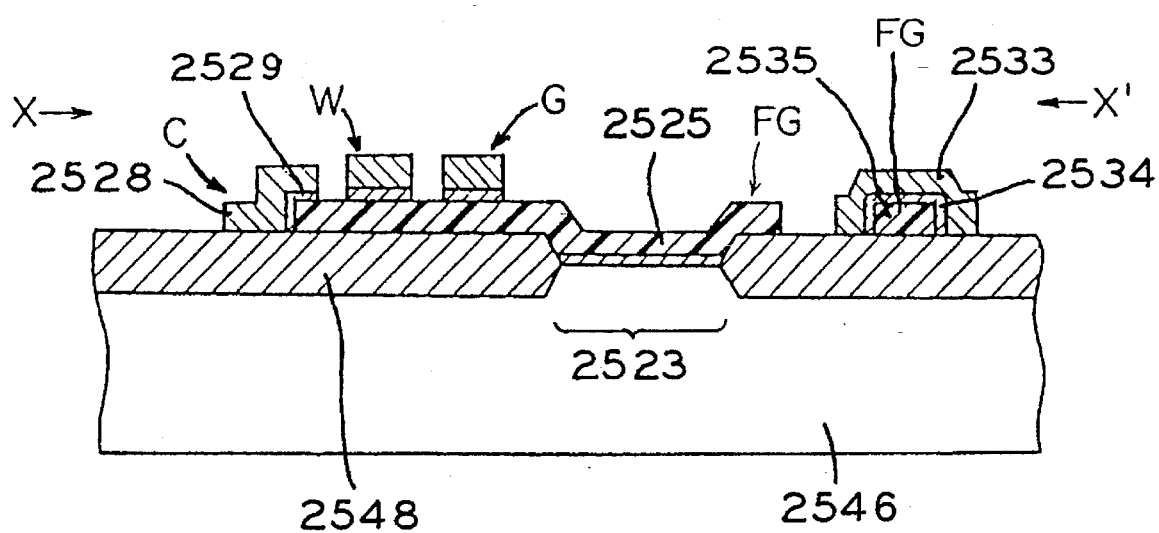
FIGS. 25(c) and 25(d) are cross-sectional views along X–X' and Y–Y' lines of FIG. 25(a), respectively.
Figure 25D:
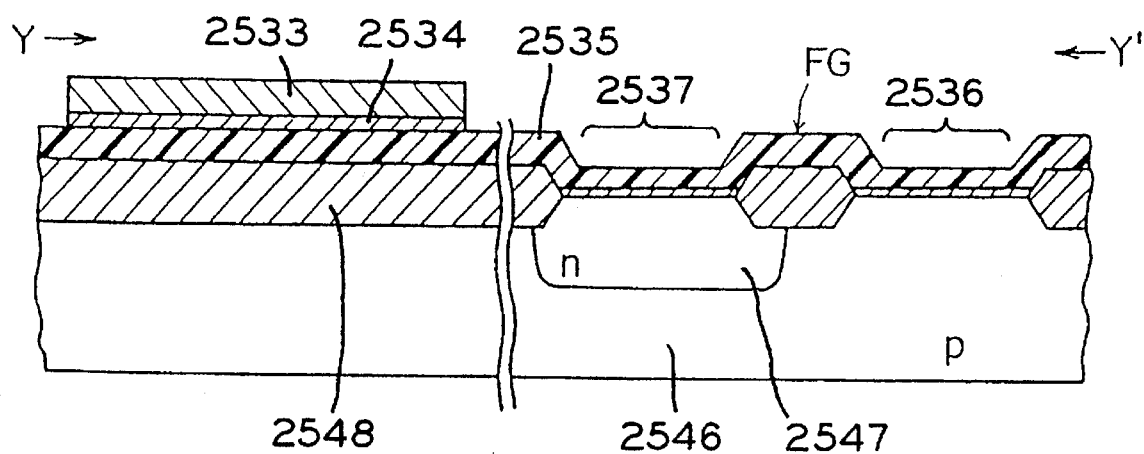

FIGS. 25(c) and 25(d) are cross-sectional views along X-X' and Y-Y' lines of FIG. 25(a), respectively. 2523, 2524 are NMOS and PMOS transistors, respectively, and 2525 is a common floating gate (FG) to both transistors. 2526, 2527 and 2528 are a gate electrode (G) common for both NMOS and PMOS, a control gate for changing synapse coupling (W) and a charge injection electrode (C), respectively. Here, concrete pattern of the circuit which has the same function as that shown in FIG. 24(a) is expressed.

In this embodiment, charge injection electrode 2528 is formed with polysilicon of the second layer over polysilicon electrode 2525 through e.g. about 70 Å thick thermal oxidation film 2529 (see FIG. 25(c)). It is also possible to use $N^+$ diffusion layer as shown in the embodiment 16.

2527 is connected to Al interconnect 2531 of the second layer through contact-hole 2530, G 2526 is connected to signal line 2532 which is connected to the output terminal of neuron in the same manner as 2123 in FIG. 21(a) and 2230 in FIG. 22(a).

Figure 32A:
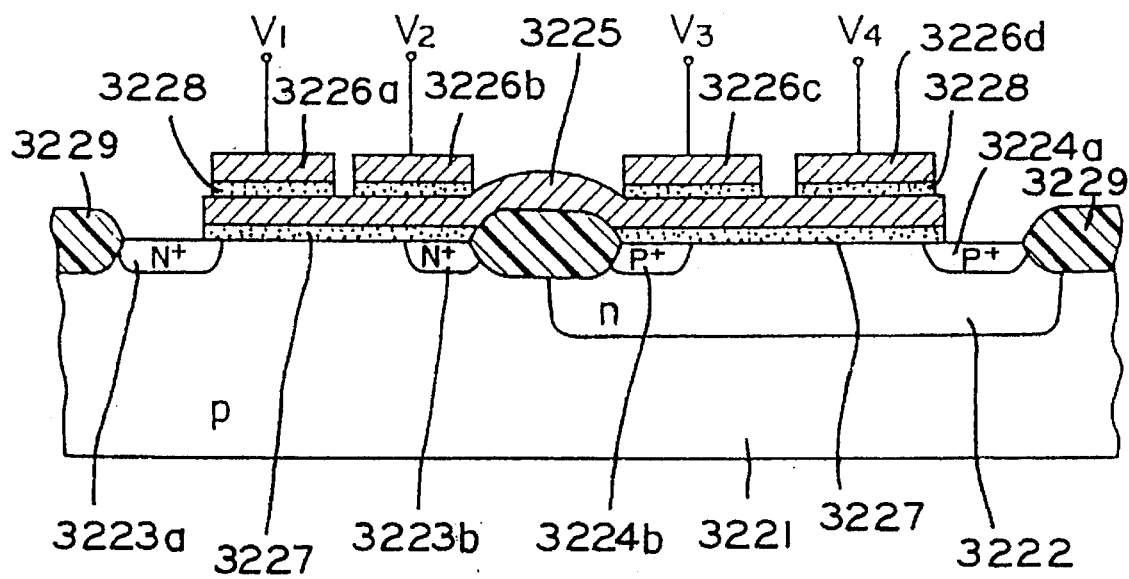
FIG. 32(a) is a cross-sectional diagram of CMOS neuron gate.
Figure 32B:
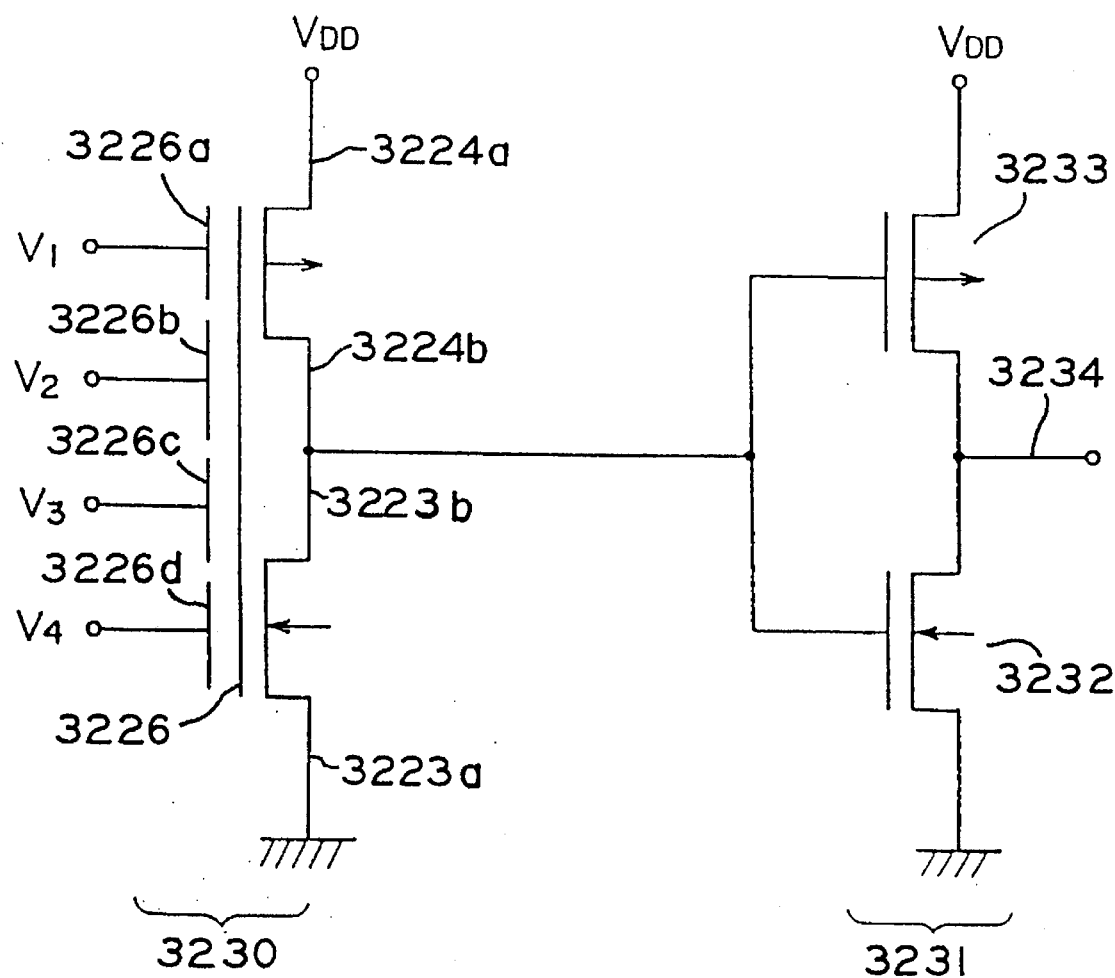
FIG. 32(b) is a diagram showing single neuron circuit.

2533 is capacitively coupled with floating gate (FG) 2535 though insulating film 2534, and 2535 is the floating gate of both NMOS 2536 and PMOS 2537 transistors, constructing CMOS neuron gate 2539, which corresponds to FIG. 32(a) and 3230 in FIG. 32(b). The output is inputted through Al interconnect 2520 to CMOS inverter 2541, the output of which appears in Al interconnect 2542 of the first layer. Here, the output is connected to the Al interconnect 2544 of the second layer through through-hole 2543, and connected to Al interconnect 2545 which is parallel with 2532. The interconnect 2544 expands downwards as shown by 2544b which acts as an output line to the neuron in the next layer. The detail is explained in the embodiment 19.

A signal line 2545 forms a signal line to feed back the output of neuron 2522 to the input terminal of the same neuron and therefore is connected to e.g. the neuron 2522 through a synapse circuit such as 2522. In the figure, 2546, 2547 and 2548 denote P-type Si substrate, N-well and field oxide film, respectively. As mentioned above, the most important function of neural network including feed-back function can be constructed on a very small chip area by this embodiment. This embodiment is easily applied to a neural network composed of a large number of neurons.

(Embodiment 19)

Figure 26A:
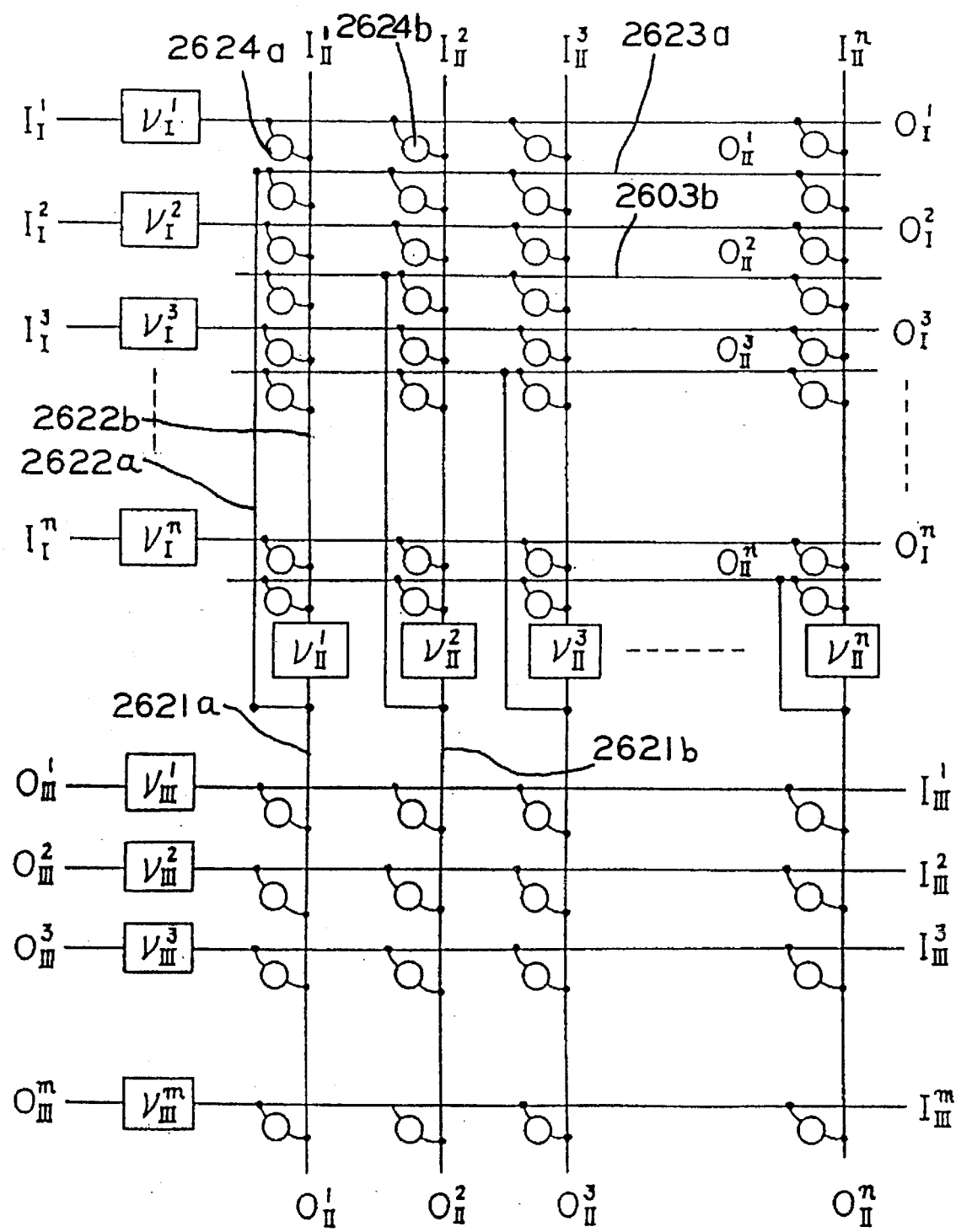
FIG. 26(a) is a circuit diagram of embodiment 19.

FIG. 26(a) is a diagram to explain embodiment 19 of the invention. $v_I^1, v_I^2, \ldots, v_I^n$ denote a group of n neurons in the first layer, each of which has a circuit similar to 2522 in FIG. 25(a). $v_{II}^1, v_{II}^2, \ldots, v_{II}^n$ and $v_{III}^1, v_{III}^2, \ldots, vIII^n$ are a group of n neurons in the second layer and a group of m neurons in the third layer, respectively. Each neuron has structure similar to 2522. $O_I^1, O_I^2, \ldots O_I^n$ are output lines from neurons in the first layer and corresponds to signal line 2532 in FIG. 25(a).

$I_{II}^1, I_{II}^2, \ldots, I_{II}^n$ are input lines of neuron group in the second layer, and correspond to floating gate 2535 in FIG. 25(a). $O_{II}^1, O_{II}^2, \ldots O_{II}^n$ are output lines of neuron group in the second layer, and some of them are connected to input lines of neuron group in the third layer through interconnects such as 2621a, 2621b, or connected through interconnects 2622a, 2622b to interconnects such as 2623a, 2623b which are parallel with the output lines of the first layer neuron group to form feed-back loop.

2621a, 2622a and 2623a corresponds to interconnects 2544b, 2544 and 2545. The synapse coupling circuits such as 2624a, 2624b correspond to e.g. 2521 in FIG. 25(a).

This embodiment shows a layout of neural network consisting of neuron groups of three layers. It is apparent that the present invention makes possible to construct neural network by regularly arranging the circuit in two dimension, which is very suitable for LSI.

Figure 26B:
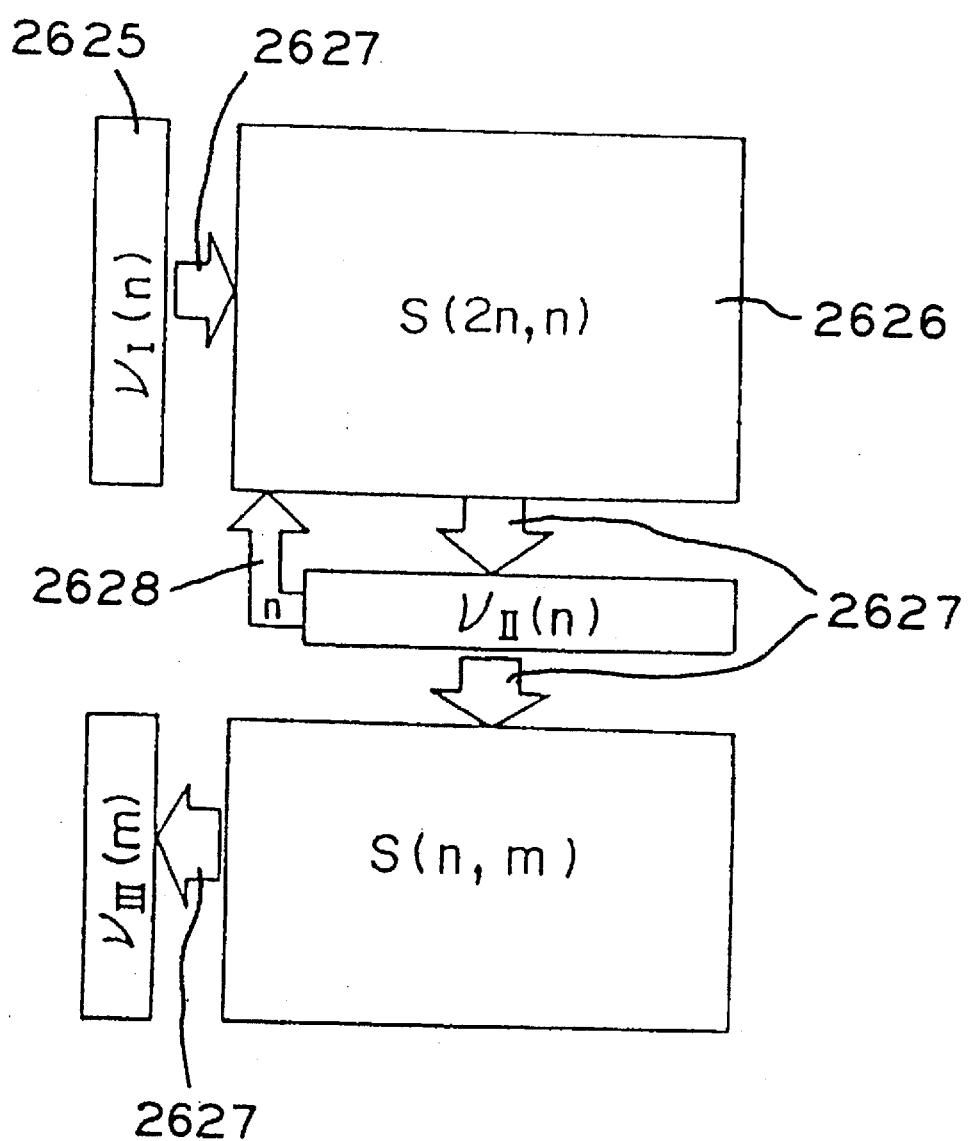
FIG. 26(b) is a simplified diagram of FIG. 26(a).

FIG. 26(a) is simplified and then shown in FIG. 26(b). $v_I^{(n)}$ in 2625 denotes a group of neurons in the first layer where n means that the neuron group is composed of n neurons. S(2n,n) in 2526 is called synapse matrix and denotes a group of synapses arranged in matrix which combines 2n outputs (the sum of n outputs of the first layer and n outputs feed backed from the second layer) and n inputs to the second layer. The arrow 2627 means the flow of signals and the arrow 2628 means that n outputs are feed-backed. By using such notation, more complicated neural network can be expressed simply.

(Embodiment 20)

Figure 27A:
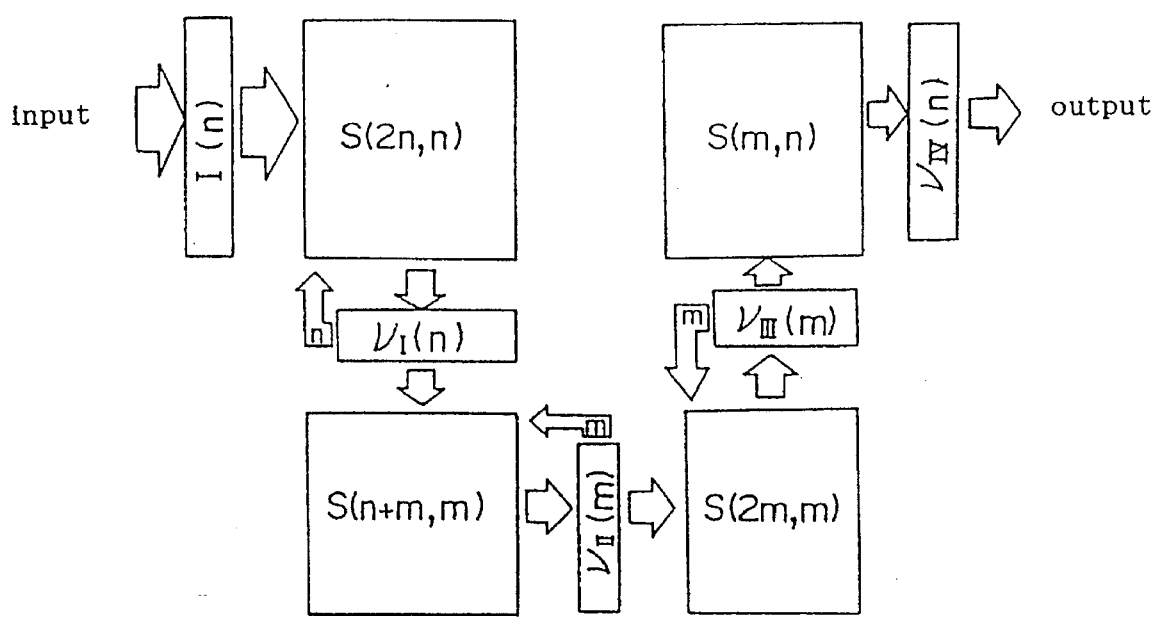
FIG. 27(a) is a diagram of 4-layer neural network represented by using the notations of FIG. 26(b), which explains embodiment 20.
Figure 27B:
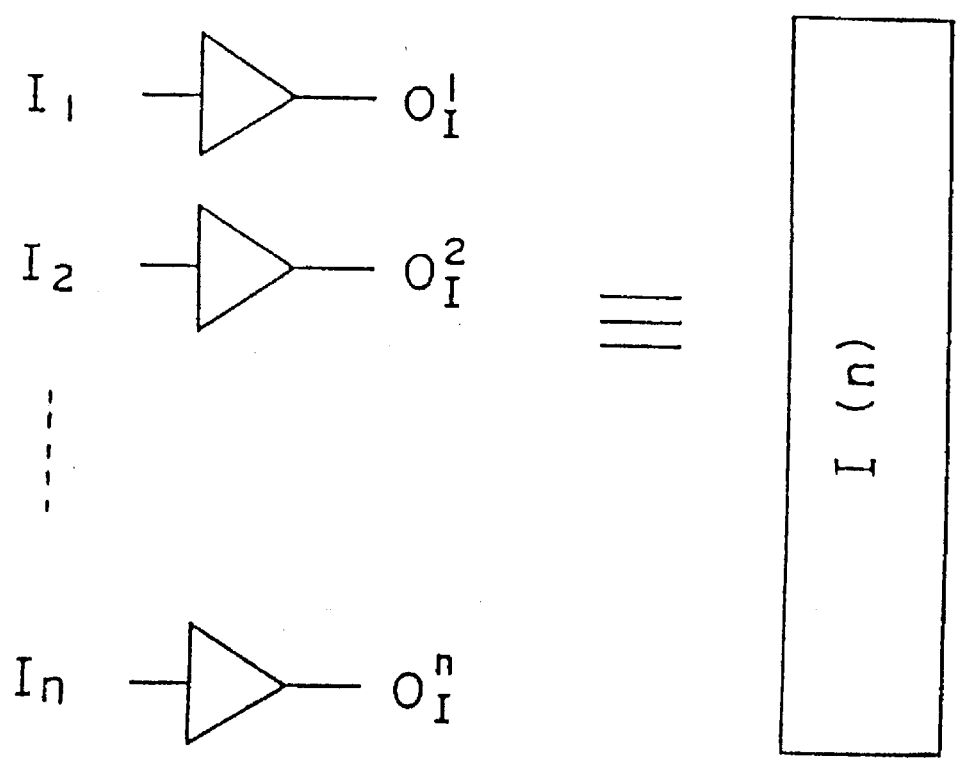
FIG. 27(b) shows I(n) part of FIG. 27(a).

FIG. 27 shows embodiment 20 of the invention where a four-layer neural network is expressed by using the notation of FIG. 26(b). Here, I(n) denotes an input buffer layer composed of n amplifiers as shown in FIG. 27(b) which output the potential level of 0 V or $V_{DD}$ for each of binary input signals $I_1, I_2, \ldots I_n$ of 0 or 1.

As is apparent from FIG. 27(a), four layer neural network having feed-back function is realized by two-dimensional, regular arrangement.

The human brain is said to be composed of six layers of neuron groups. The neural network with more layers can easily be constructed by the repetitions of the same plane arrangement. That is, the semiconductor device of the present invention have very advantageous feature for realizing a neuron computer.

(Embodiment 21)

Figure 28A:
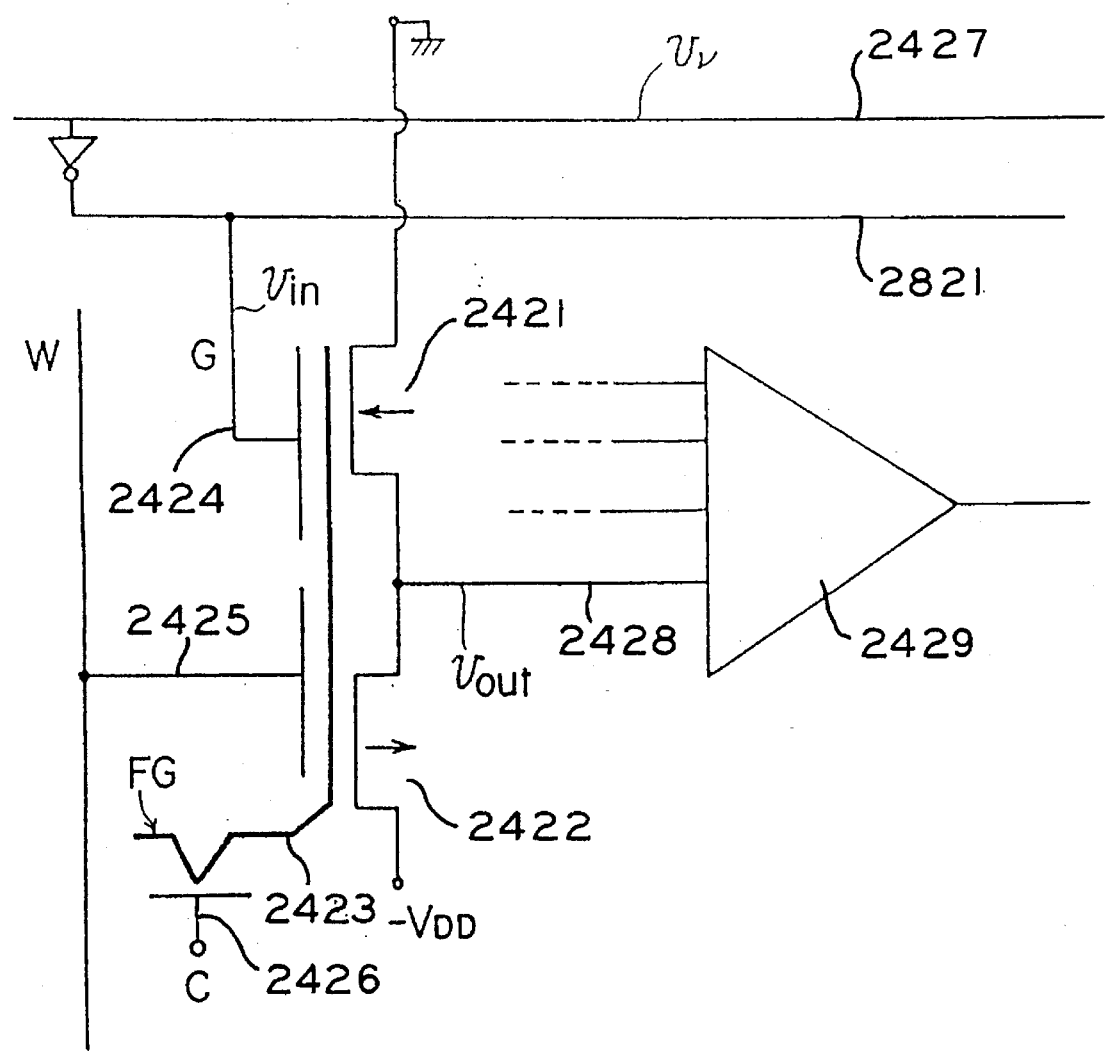
FIG. 28(a) is a circuit diagram explaining embodiment 21.

FIG. 28 is a diagram showing the 21st embodiment which is similar to FIG. 24(a) except that the drain of NMOS 2421 is connected to 0 V (potential of second power supply line) the drain of PMOS 2422 to $-V_{DD}$ (potential of third power supply line) and G to signal line 2821.

Figure 28B:
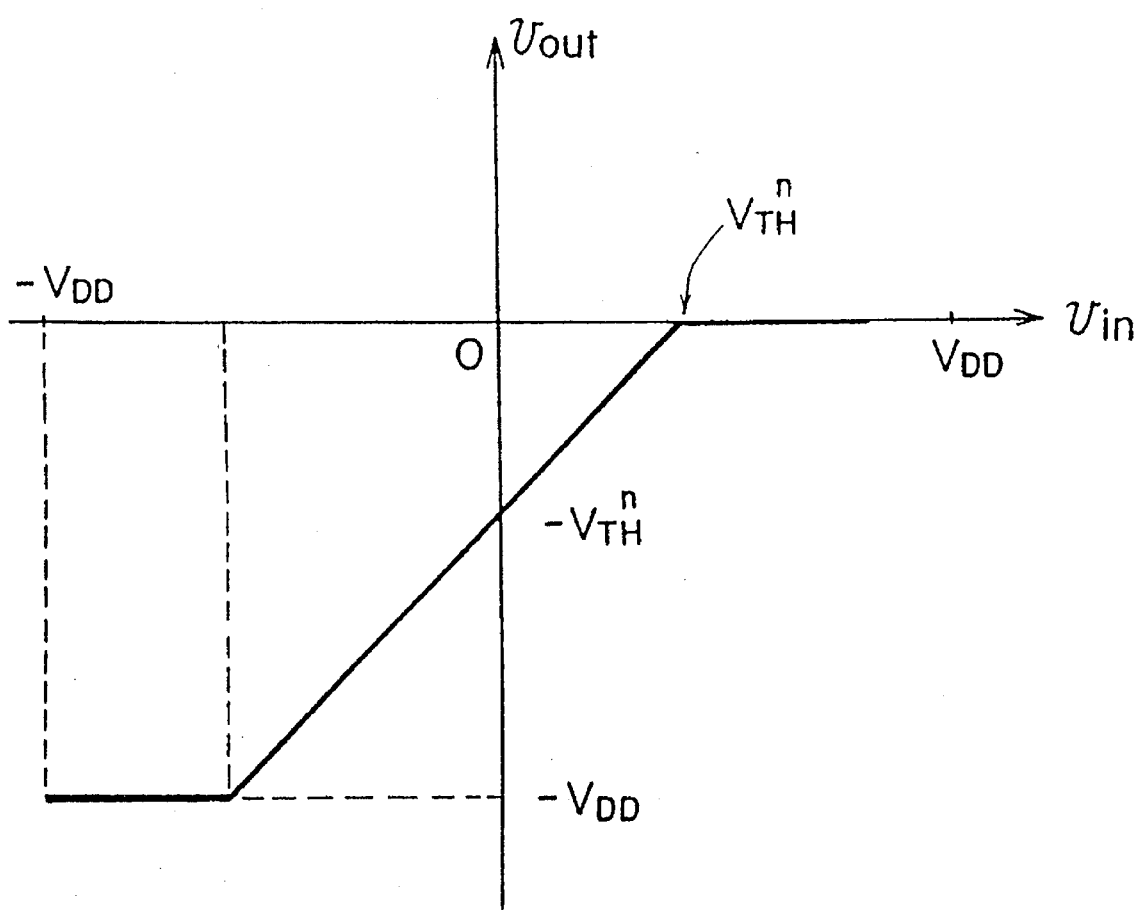
FIG. 28(b) is a graph showing the relationship between $V_{in}$ and $V_{out}$ in FIG. 28(a).
Figure 29:
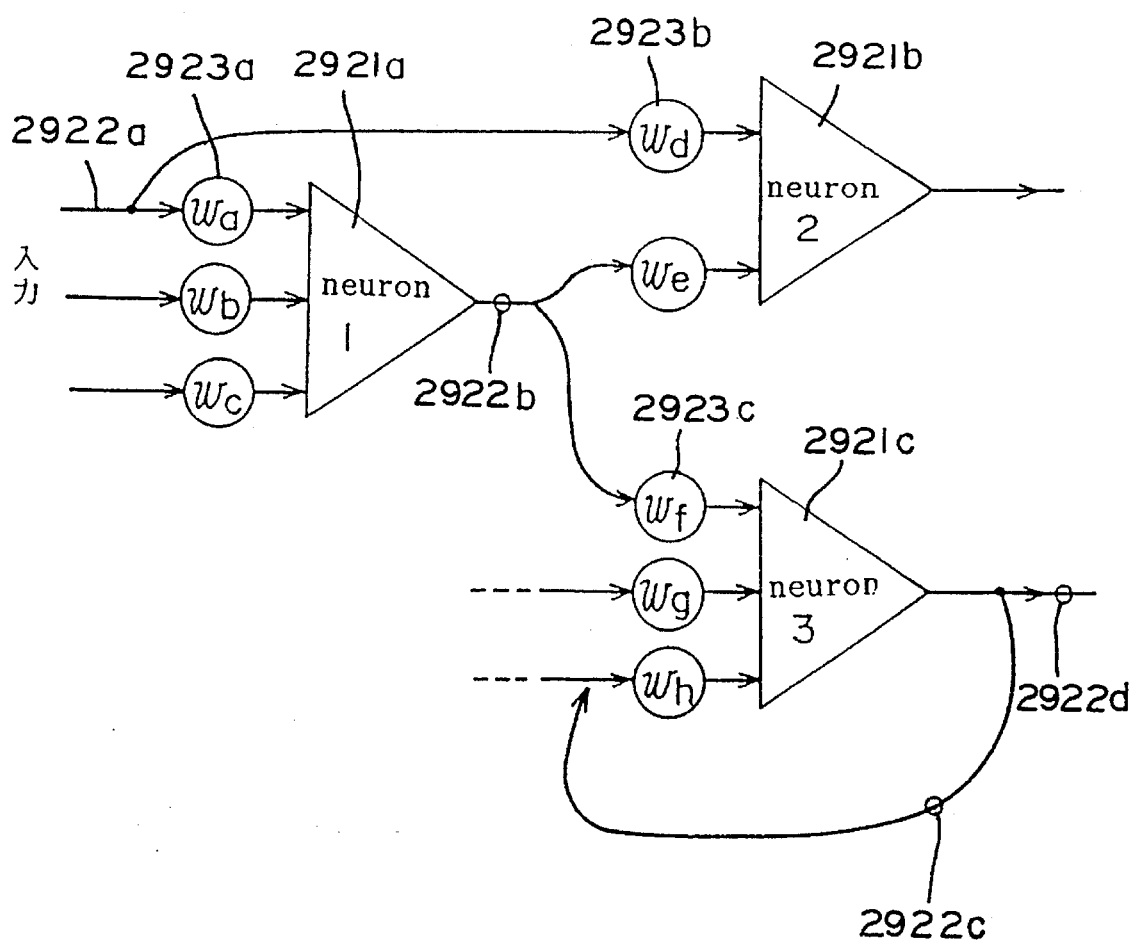
FIG. 29 is a schematic diagram explaining the fundamental unit structure of a cerebral nerve cell.
Figure 30A:
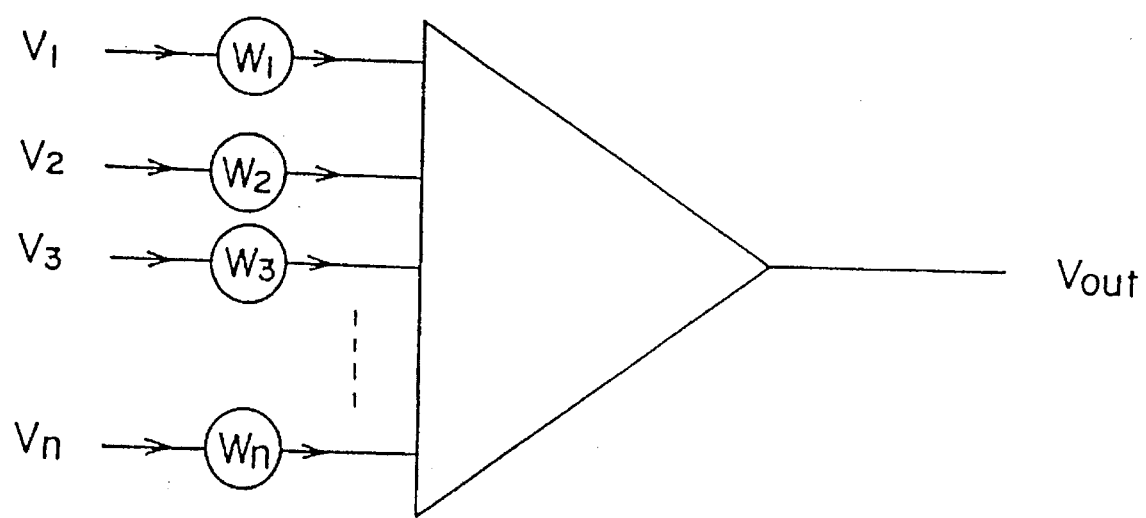
FIG. 30(a) is a schematic diagram explaining the function of single neuron.
Figure 30B:
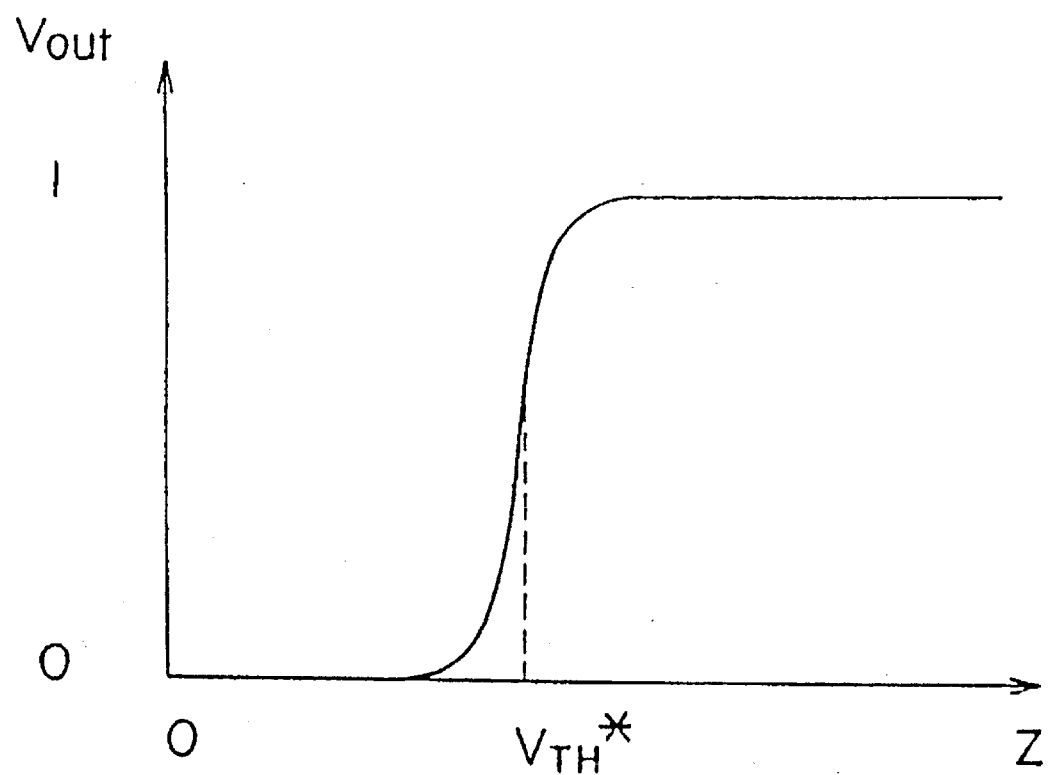
FIG. 30(b) is a graph showing the relationship between Z and $V_{out}$.
Figure 31A:
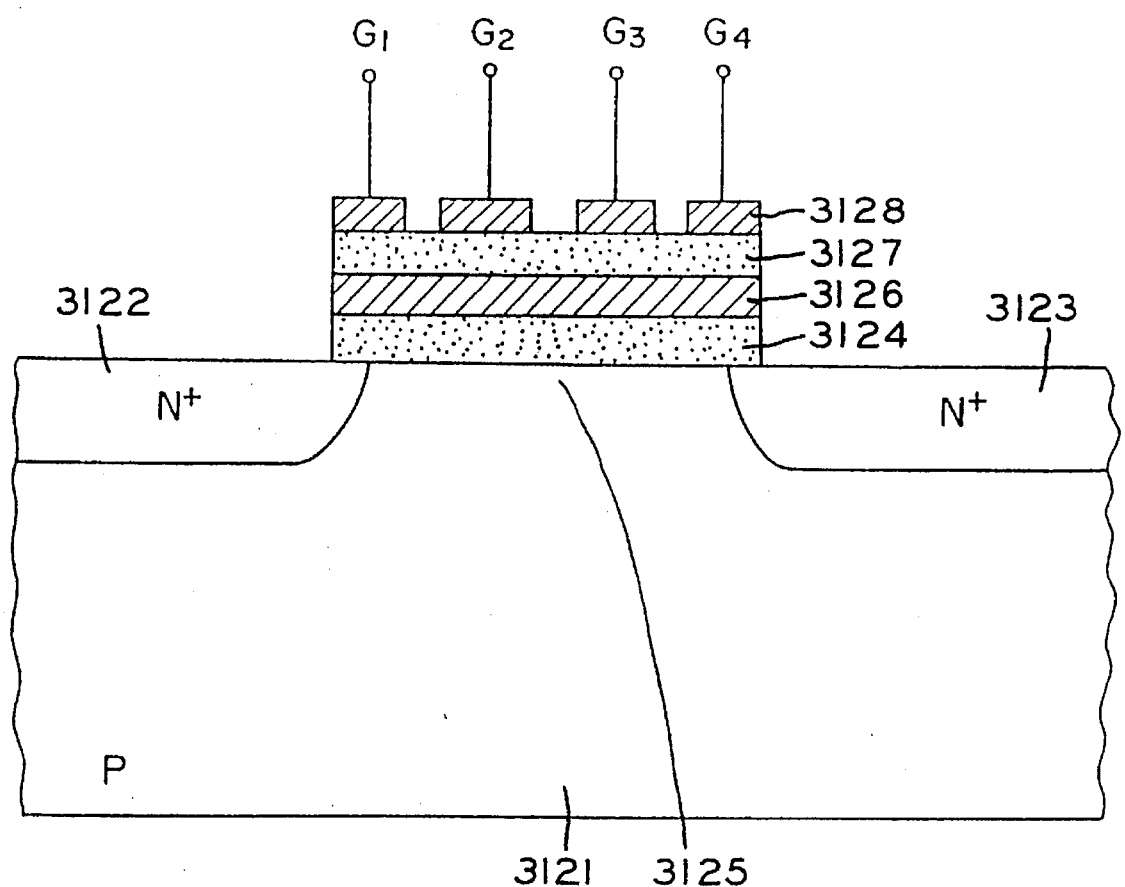
FIG. 31(a) is a cross-sectional view of vMOS.
Figure 31B:
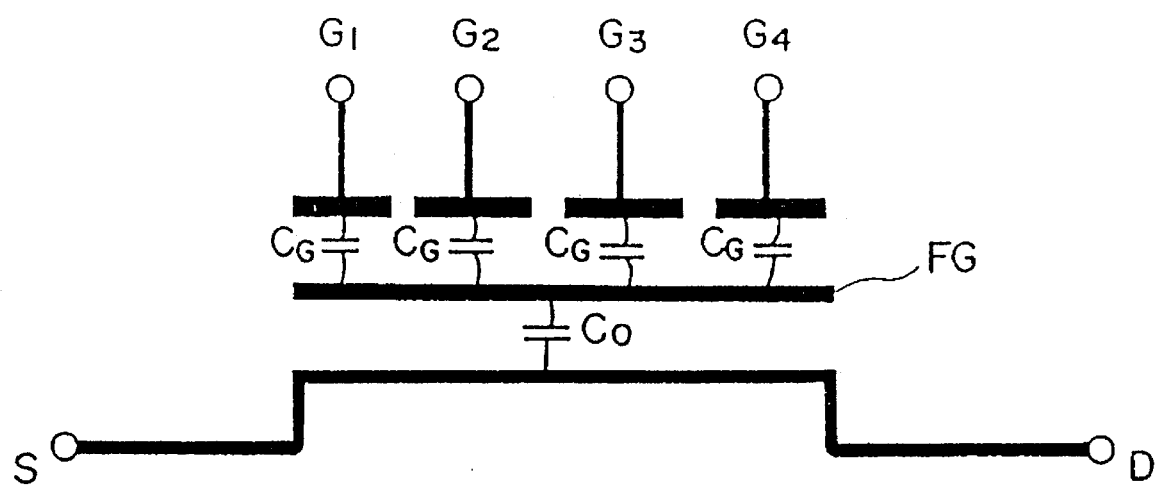
FIG. 31(b) is a schematic diagram explaining the operation of vMOS in FIG. 31(a).
Figure 31C:
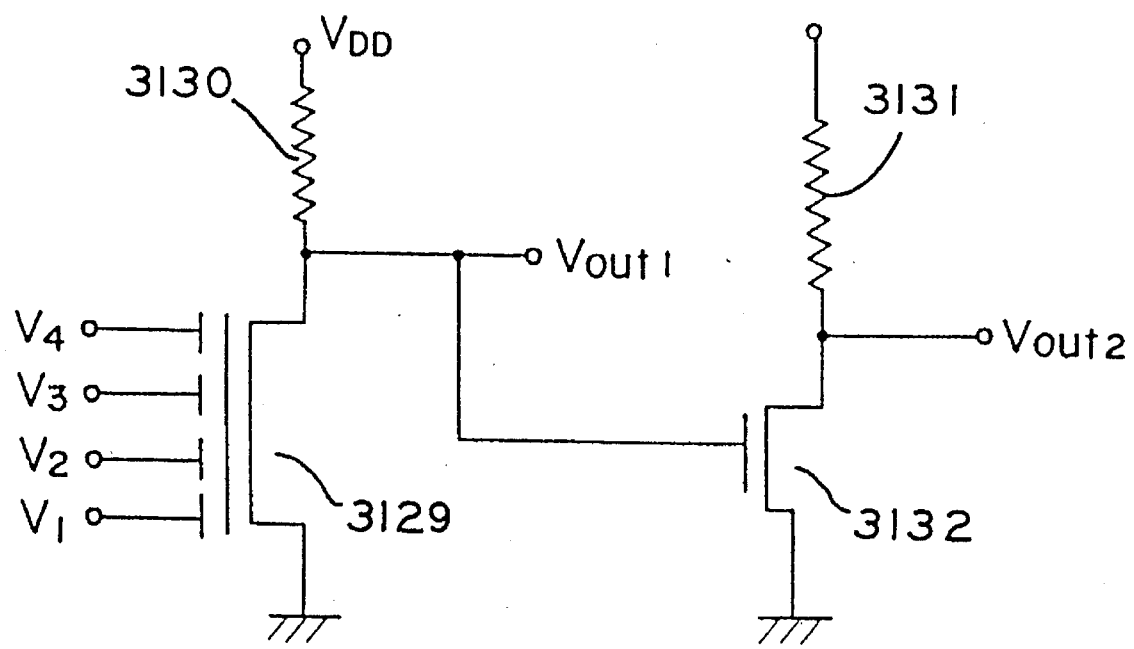
FIG. 31(c) is a circuit diagram of inverter using MOS shown in FIG. 31(a).
Figure 31D:
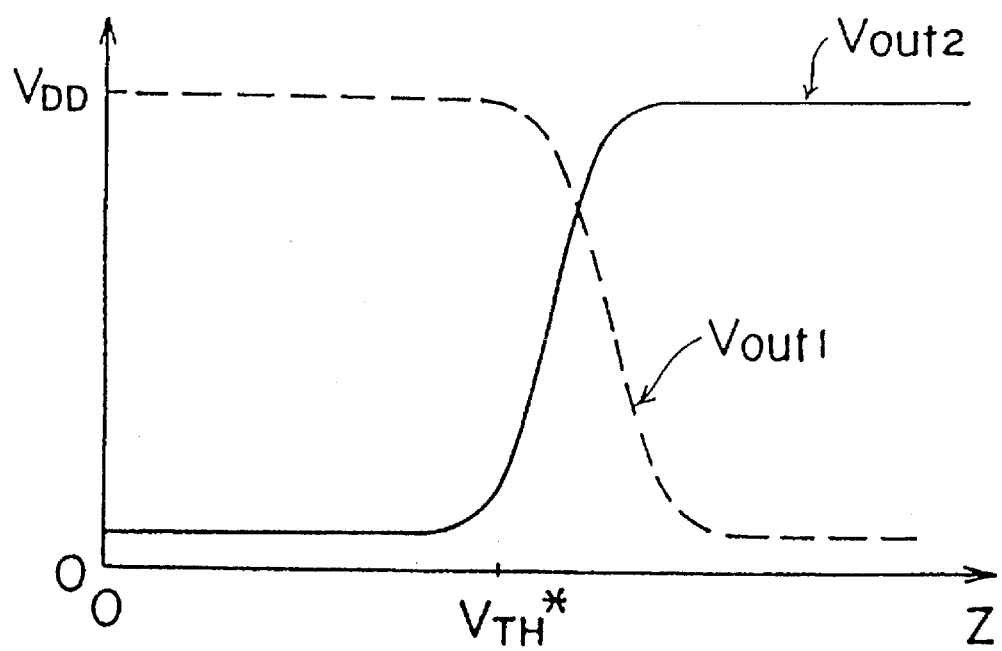
FIG. 31(d) is a graph showing $V_{out1}$ and $V_{out2}$ in FIG. 31(c) as a function of Z.

FIG. 28(b) shows the relationship between $V_{in}$ (potential of 2424) and $V_{out}$ (potential of 2428) where $V_{TH}^n$ is a threshold seen from the gate electrode 2424 of NMOS transistor 2421. Therefore, $V_{out}=0$ when $V_{in}=V_{DD}$ (potential of first power supply line) and $V_{out}=-V_{TH}^n$ when $V_{in}=0$. From the figure, $V_{in}$ is equal to the potential of signal line 2821, which is equal to the inverted potential of that of signal line 2427. Therefore, $V_{in}=0$ when the neuron in the previous stage is fired, and $V_{in}=V_{DD}$ when the neuron is not fired, indicating that the synapse transmits negative output of $-V_{TH}^n$ to the neuron at the next stage when the neuron at the previous stage gets fired. That is, the synapse, an inhibitory synapse, performs so as to restrain the neuron at the next stage from firing.

As mentioned above, an inhibitory synapse of an organism can easily be constructed according to the present invention. Being expressed by $-V_{Th}^n$, an inhibitory level is controlled by changing the amount of charge in the floating gate.

In all embodiment of this invention, the explanation has been made for the case where interconnects such as 2123, 2230, 2427, etc. are connected to the output of neuron; however, this invention is not restricted to such cases. For example, this invention is also available for the case of the interconnects being connected to the output of input buffer. It is also possible that output data of neuron are supplied to these interconnects through a pass transistor after being latched in e.g. flip-flop or supplied through an appropriate amplifier.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A semiconductor-device comprising: a neuron element comprising a first semiconductor region on a substrate, a first source region and a first drain region of opposite conductivity type to that of said first semiconductor region formed in said first semiconductor region, a first floating gate electrode formed over the region separating said first source region and said first drain region over a first insulating film, a plurality of first input gate electrodes capacitively coupled with said first floating gate electrode through a second insulating film; and a first MOS type transistor, wherein the source electrode of said first MOS type transistor is connected to one of said first input gate electrodes and one of the gate electrode and the drain electrode of said first MOS type transistor is connected to a first interconnect which transfers a two-level voltage signal.

2. The semiconductor device according to claim 1, wherein said first MOS type transistor has a gate structure to change its threshold to a prescribed value.

3. The semiconductor device according to claim 2, wherein said first MOS type transistor has a floating gate formed over a third insulating film which is over the region separating the source and drain regions.

4. The semiconductor device according to claim 2, wherein said first MOS type transistor is an MNOS (Metal-Nitride-Oxide-Semiconductor) type transistor.

5. The semiconductor device according to claim 1, wherein said first MOS type transistor is of the N-channel type, the source electrode of said first MOS type transistor is connected to a low potential level power supply line through a second MOS type transistor of the P-channel type and the gate electrodes of said first and second MOS type transistors are connected to said first interconnect.

6. The semiconductor device according to claim 5, wherein said second MOS type transistor is an enhancement type.

7. The semiconductor device according to claim 5, wherein the threshold of said second MOS type transistor is nearly 0 V.

8. The semiconductor device according to claim 5, wherein said second MOS type transistor is a depletion type.

9. The semiconductor device according to claim 3, wherein said first MOS type transistor further comprises a synapse strength electrode capacitively coupled with said floating gate of said first MOS transistor through a fourth insulating film, and a charge injection electrode capacitively coupled with and opposed to said floating gate of said first MOS transistor through a fifth insulating film, wherein charge transfer occurs through said fifth insulating film between said floating gate and said charge injection electrode when a prescribed potential is applied to said synapse strength electrode and said charge injection electrode.

10. The semiconductor device according to claim 3, further comprising a second MOS type transistor having a floating gate electrically connected to said floating gate of said first MOS type transistor, at least one synapse strength electrode capacitively coupled with said floating gates of said first and second MOS transistors through a fourth insulating film, and a charge injection electrode capacitively coupled with and opposed to said floating gates of said first and second MOS transistors through a fifth insulating film, wherein charge transfer occurs through said fifth insulating film between said floating gates and said charge injection electrode when a prescribed potential is applied to said synapse strength electrode and said charge injection electrode.

11. The semiconductor device according to claim 10, wherein said neuron element comprises a plurality of said neuron elements, said first MOS type transistor comprises a plurality of said first MOS type transistors, said second MOS type transistor comprises a plurality of said second MOS type transistors, said first interconnect comprises a plurality of said first interconnects arranged parallel with each other, and said first floating gate electrodes of said neuron elements are arranged parallel with each other and perpendicular to said first interconnects.

12. The semiconductor device according to claim 3, further comprising a first, a second, and a third power supply line for supplying high level, medium level, and low level voltages, respectively, wherein said first MOS type transistor is of the N-channel type, said first interconnect is connected to said first and second power supply lines to provide a first signal corresponding to one of said high and medium level voltages, the drain of said first MOS type transistor is connected to said second power supply line, and an inversion of said first signal is, to the gate electrode of said first MOS type transistor.

13. The semiconductor device according to claim 12, wherein the source of said first MOS type transistor is connected to said third power supply line through a second MOS transistor, said second MOS transistor of the P-channel type, said second MOS transistor having a floating gate electrically connected to said floating gate of said first MOS transistor, the gate electrode of said first MOS type transistors connected to said first interconnect.

14. The semiconductor device according to claim 13, wherein said second MOS type transistor is an enhancement type.

15. The semiconductor device according to claim 13, wherein the threshold of said second MOS type transistor is nearly 0 V.

16. The semiconductor device according to claims 13, wherein said second MOS type transistor is a depletion type.

17. The semiconductor device according to claim 13, further comprising at least one synapse strength electrode capacitively coupled with said floating gates of said first and second MOS through a fourth insulating film, and a charge injection electrode capacitively coupled with and opposed to said floating gates through a fifth insulating film, wherein charge transfer occurs through said fifth insulating film between said floating gates and said charge injection electrode when a prescribed potential is applied to said synapse strength electrode and said charge injection electrode.

\* \* \* \* \*

UNITED STATES PATENT AND TRADEMARK OFFICE
CERTIFICATE OF CORRECTION

PATENT NO. : 5,621,336
DATED : April 15, 1997
INVENTOR(S) : Tadashi Shibata, et al.

It is certified that error appears in the above-indentified patent and that said Letters Patent is hereby corrected as shown below:

Claim 12, column 32, line 8 after "is" insert --connected--.

Claim 17, column 32, line 29 after "MOS" insert --transistors--.

Signed and Sealed this

Fifteenth Day of July, 1997

Attest:

BRUCE LEHMAN

Attesting Officer

Commissioner of Patents and Trademarks